(12) United States Patent
Kakehata et al.

(10) Patent No.: US 11,705,524 B2
(45) Date of Patent: Jul. 18, 2023

(54) SEMICONDUCTOR DEVICE AND METHOD FOR MANUFACTURING SEMICONDUCTOR DEVICE

(71) Applicant: Semiconductor Energy Laboratory Co., Ltd., Kanagawa-ken (JP)

(72) Inventors: Tetsuya Kakehata, Kanagawa (JP); Yuta Endo, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 100 days.

(21) Appl. No.: 17/048,255

(22) PCT Filed: Apr. 16, 2019

(86) PCT No.: PCT/IB2019/053112
§ 371 (c)(1),
(2) Date: Oct. 16, 2020

(87) PCT Pub. No.: WO2019/207411
PCT Pub. Date: Oct. 31, 2019

(65) Prior Publication Data
US 2021/0234046 A1    Jul. 29, 2021

(30) Foreign Application Priority Data
Apr. 27, 2018    (JP) .................. 2018-086200

(51) Int. Cl.
*H01L 29/786*    (2006.01)
*H01L 29/24*    (2006.01)
*H01L 29/66*    (2006.01)

(52) U.S. Cl.
CPC .......... *H01L 29/7869* (2013.01); *H01L 29/24* (2013.01); *H01L 29/66969* (2013.01); *H01L 29/78648* (2013.01)

(58) Field of Classification Search
None
See application file for complete search history.

(56) References Cited

U.S. PATENT DOCUMENTS

| 7,211,825 B2 * | 5/2007 | Shih .................... H01L 29/7869 257/66 |
| 9,923,001 B2 | 3/2018 | Yamazaki |

(Continued)

FOREIGN PATENT DOCUMENTS

| JP | 2012-257187 A | 12/2012 |
| JP | 2017-050530 A | 3/2017 |

(Continued)

OTHER PUBLICATIONS

International Search Report (Application No. PCT/IB2019/053112) dated Jul. 16, 2019.

(Continued)

*Primary Examiner* — Vincent Wall
(74) *Attorney, Agent, or Firm* — Husch Blackwell LLP

(57) ABSTRACT

A semiconductor device with high on-state current and high reliability is provided. The semiconductor device includes first to fifth insulators, first to third oxides, and first to fourth conductors; the fifth insulator includes an opening in which the second oxide is exposed; the third oxide is placed in contact with a bottom portion of the opening and a side portion of the opening; the second insulator is placed in contact with the third oxide; the third conductor is provided in contact with the second insulator; the third insulator is placed in contact with a top surface of the third conductor and the second insulator; and the fourth conductor is in contact with the third insulator and the top surface of the third conductor and placed in the opening.

11 Claims, 27 Drawing Sheets

(56) References Cited

U.S. PATENT DOCUMENTS

| | | | |
|---|---|---|---|
| 9,954,003 B2 | 4/2018 | Matsuda et al. | |
| 10,181,531 B2* | 1/2019 | Sasagawa | H01L 29/78696 |
| 10,424,676 B2 | 9/2019 | Sasagawa et al. | |
| 10,923,477 B2* | 2/2021 | Yamazaki | H01L 29/24 |
| 11,133,420 B2* | 9/2021 | Iida | H01L 21/02181 |
| 11,183,600 B2* | 11/2021 | Yamazaki | H01L 27/1207 |
| 2007/0187760 A1* | 8/2007 | Furuta | H01L 29/66969 438/149 |
| 2012/0032730 A1 | 2/2012 | Koyama | |
| 2013/0092924 A1 | 4/2013 | Sasagawa et al. | |
| 2016/0218219 A1* | 7/2016 | Asami | C23C 16/45531 |
| 2017/0012139 A1 | 1/2017 | Sasagawa et al. | |
| 2017/0207242 A1 | 7/2017 | Yamazaki | |
| 2017/0236842 A1* | 8/2017 | Matsuda | H01L 27/1225 257/43 |
| 2020/0211425 A1 | 7/2020 | Yamazaki et al. | |
| 2020/0381556 A1 | 12/2020 | Yamazaki et al. | |
| 2020/0402910 A1 | 12/2020 | Kakehata et al. | |

FOREIGN PATENT DOCUMENTS

| | | |
|---|---|---|
| JP | 2017-130654 A | 7/2017 |
| JP | 2017-147445 A | 8/2017 |
| KR | 2017-0096956 A | 8/2017 |
| KR | 2018-0025942 A | 3/2018 |
| TW | 201709348 | 3/2017 |
| WO | WO 2017/006207 A1 | 1/2017 |

OTHER PUBLICATIONS

Written Opinion (Application No. PCT/IB2019/053112) dated Jul. 16, 2019.

Matsubayashi, D. et al., "20-nm-node trench-gate-self-aligned crystalline In—Ga—Zn-Oxide FET with high frequency and low off-state current," IEDM 15: Technical Digest of International Electron Devices Meeting, Dec. 7, 2015, pp. 141-144.

* cited by examiner

FIG. 8A
FIG. 8C
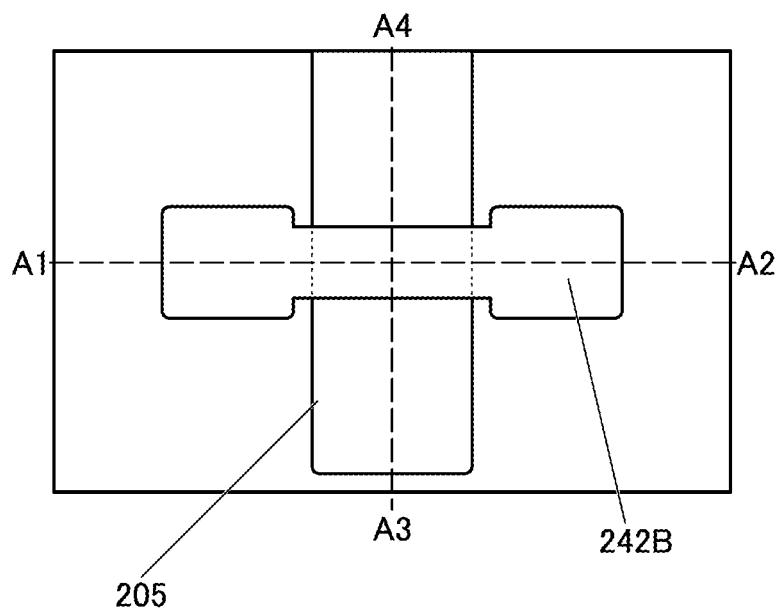
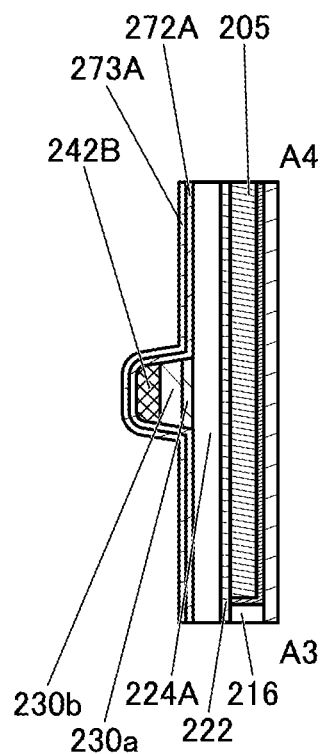
FIG. 8B
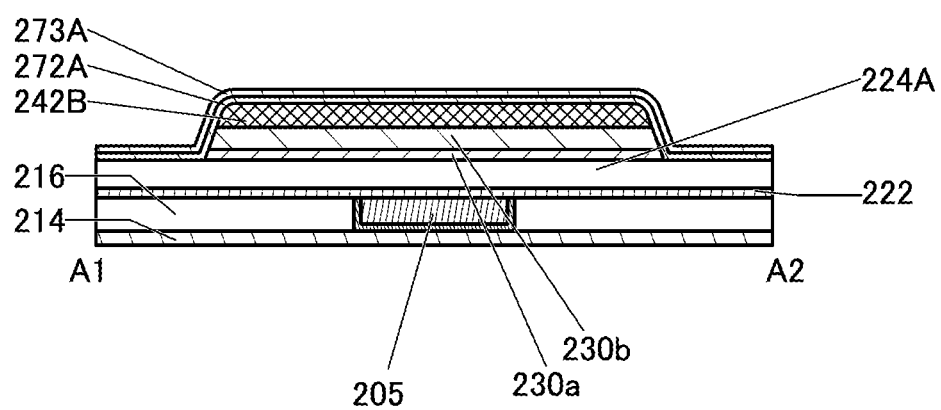

FIG. 9A
FIG. 9C
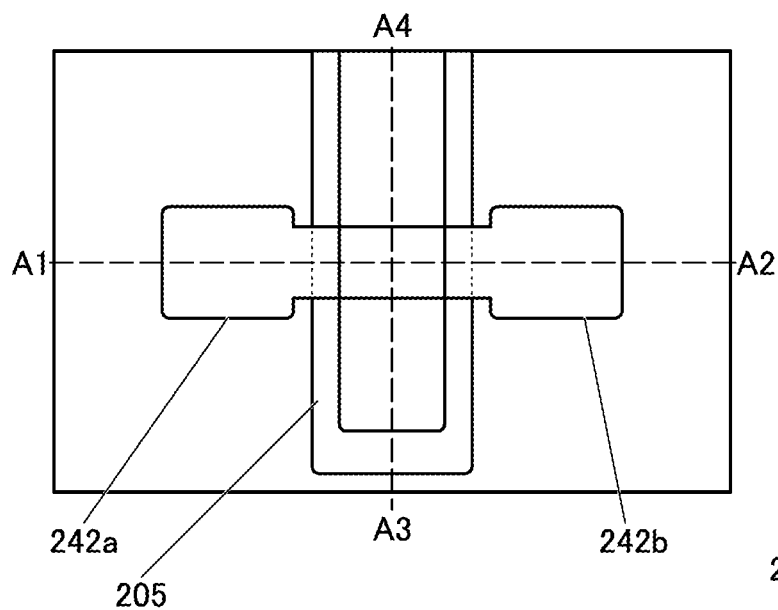
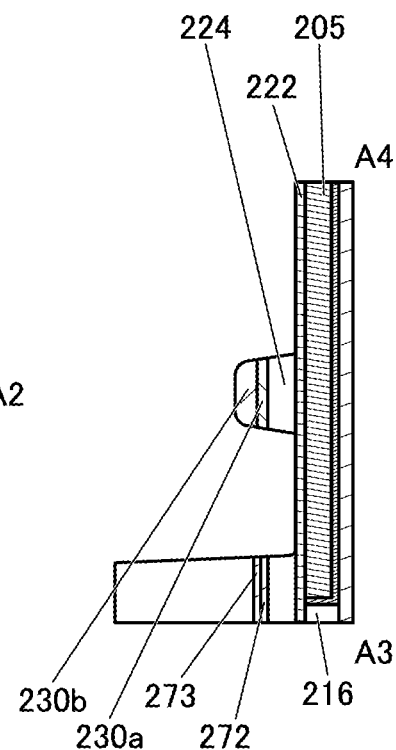
FIG. 9B
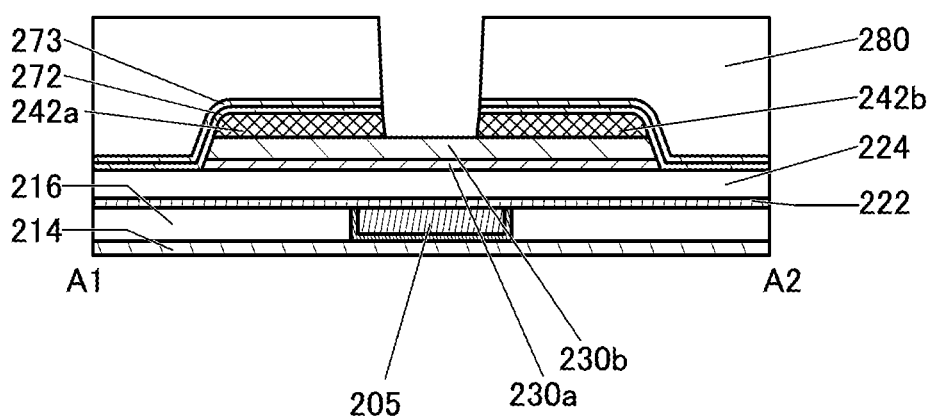

FIG. 26A
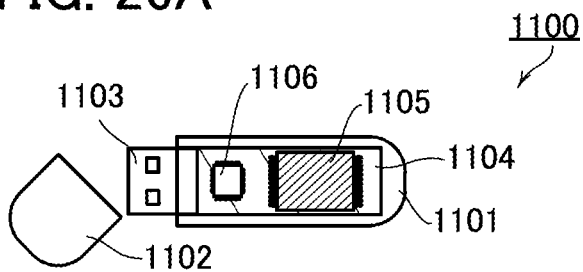
FIG. 26B  FIG. 26C
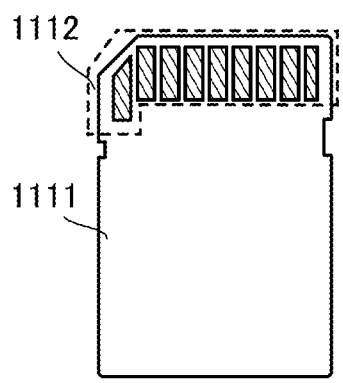 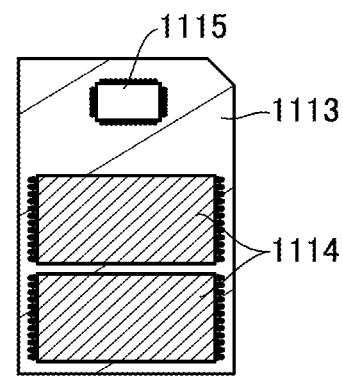
FIG. 26D  FIG. 26E
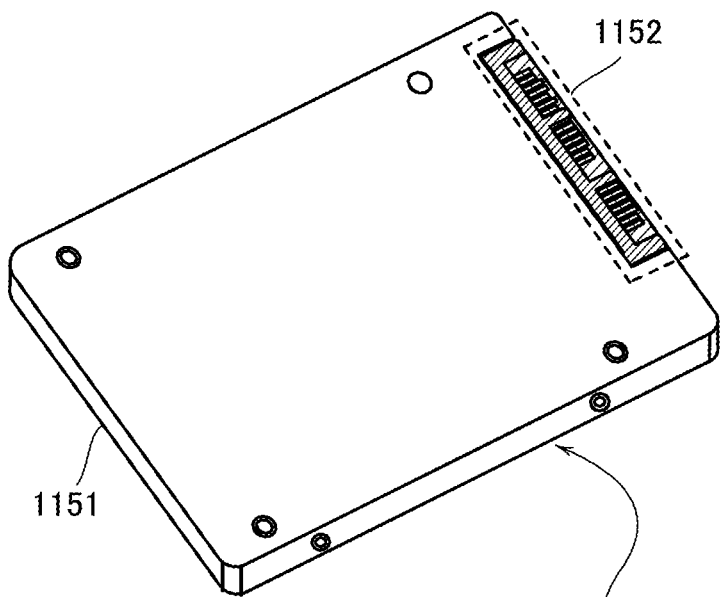 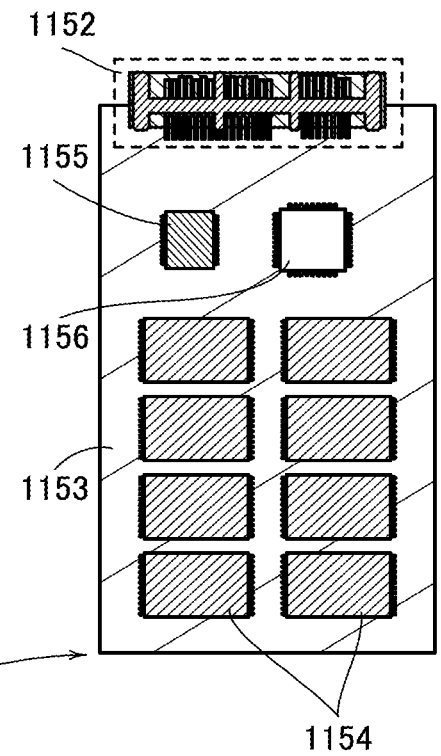

SEMICONDUCTOR DEVICE AND METHOD FOR MANUFACTURING SEMICONDUCTOR DEVICE

This application is a 371 of international application PCT/IB2019/053112 filed on Apr. 16, 2019 which is incorporated herein by reference.

TECHNICAL FIELD

One embodiment of the present invention relates to a semiconductor device and a method for manufacturing the semiconductor device. Another embodiment of the present invention relates to a semiconductor wafer, a module, and an electronic device.

Note that in this specification and the like, a semiconductor device refers to a device that can function by utilizing semiconductor characteristics in general. A semiconductor element such as a transistor, a semiconductor circuit, an arithmetic device, and a memory device are each one embodiment of a semiconductor device. A display device (e.g., a liquid crystal display device and a light-emitting display device), a projection device, a lighting device, an electro-optical device, a power storage device, a memory device, a semiconductor circuit, an imaging device, an electronic device, and the like may include a semiconductor device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter.

BACKGROUND ART

A silicon-based semiconductor material is widely known as a material of a semiconductor thin film that can be used in a transistor, and as another material, an oxide semiconductor has attracted attention. Examples of oxide semiconductors include not only single-component metal oxides, such as indium oxide and zinc oxide, but also multi-component metal oxides. Among the multi-component metal oxides, in particular, an In—Ga—Zn oxide (hereinafter also referred to as IGZO) has been actively studied.

It is known that a transistor using IGZO as an active layer has an extremely low leakage current in a non-conduction state. For example, a low-power-consumption CPU or the like utilizing the low leakage current property of the transistor using IGZO as the active layer has been disclosed (see Patent Document 1).

Moreover, a technique in which a minute transistor is fabricated using an oxide semiconductor having a CAAC (c-axis aligned crystalline) structure is also disclosed (see Non-Patent Document 1).

REFERENCE

Patent Document

[Patent Document 1] Japanese Published Patent Application No. 2012-257187

Non-Patent Document

[Non-Patent Document 1] D. Matsubayashi et al., "2015 IEEE International Electron Devices Meeting (IEDM) Technical Digests", 2015, pp. 60.5.1-6.50.4

SUMMARY OF THE INVENTION

Problems to be Solved by the Invention

Another object of one embodiment of the present invention is to provide a semiconductor device with high heat resistance. Another object of one embodiment of the present invention is to provide a semiconductor device with high thermal stability. Another object of one embodiment of the present invention is to provide a semiconductor device with high on-state current. Another object of one embodiment of the present invention is to provide a semiconductor device with excellent frequency characteristics. Another object of one embodiment of the present invention is to provide a highly reliable semiconductor device. Another object of one embodiment of the present invention is to provide a semiconductor device that can be miniaturized or highly integrated. Another object of one embodiment of the present invention is to provide a semiconductor device with excellent electrical characteristics. Another object of one embodiment of the present invention is to provide a semiconductor device that is manufactured easily. Another object of one embodiment of the present invention is to provide a semiconductor device with high processing stability. Another object of one embodiment of the present invention is to provide a semiconductor device with a uniform quality. Another object of one embodiment of the present invention is to provide a semiconductor device with a high yield. Another object of one embodiment of the present invention is to provide a semiconductor device with high productivity.

An object of one embodiment of the present invention is to provide a semiconductor device capable of retaining data for a long time. An object of one embodiment of the present invention is to provide a semiconductor device with high-speed data writing. An object of one embodiment of the present invention is to provide a semiconductor device with high design flexibility. An object of one embodiment of the present invention is to provide a semiconductor device capable of reducing power consumption. An object of one embodiment of the present invention is to provide a novel semiconductor device.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems

One embodiment of the present invention is a semiconductor device including a first insulator; a first oxide over the first insulator; a second oxide over the first oxide; a first conductor and a second conductor over the second oxide; a third oxide over the second oxide; a second insulator over the third oxide; a third conductor over the second insulator; a fourth conductor and a third insulator over the third conductor; a fourth insulator over the first insulator, the first conductor, and the second conductor; and a fifth insulator over the fourth insulator. The fifth insulator includes an opening in which the second oxide is exposed. The third oxide is placed in contact with a bottom portion of the opening and a side portion of the opening. The second insulator is placed in contact with the third oxide. The third conductor is provided in contact with the second insulator. The third insulator is placed in contact with a top surface of the third conductor and the second insulator. The fourth conductor is in contact with the third insulator and the top surface of the third conductor and placed in the opening with the third oxide, the second insulator, and the third insulator therebetween. The fourth insulator is in contact with a top surface of the first insulator, a side surface of the first oxide, a side surface of the second oxide, a side surface of the first conductor, a top surface of the first conductor, a side surface of the second conductor, and a top surface of the second conductor. The third insulator is less likely to pass oxygen and/or hydrogen than the second insulator.

The third insulator preferably contains aluminum and oxygen.

The third insulator may contain silicon and nitrogen.

The first to third oxides preferably each contain In, an element M (M is Al, Ga, Y, or Sn), and Zn.

Another embodiment of the present invention is a method of manufacturing a semiconductor device, including the following steps: forming a first insulator over a substrate; forming a first oxide film and a first conductive film sequentially over the first insulator; processing the first oxide film and the first conductive film to form a first oxide and a first conductor layer; depositing a first insulating film and a second insulating film sequentially to cover the first oxide and the first conductor layer; performing planarization treatment to planarize a surface of the second insulating film; forming an opening in which the first oxide is exposed, in the first conductor layer, the first insulating film, and the second insulating film, so that a first conductor, a second conductor, and a second insulator are formed; depositing a second oxide film and a third insulating film; depositing a second conductive film so that a bottom portion of the second conductive film in the opening has a larger thickness than a side portion of the second conductive film in the opening; etching the second conductive film positioned at the side surface of the opening so that the second conductive film positioned on the bottom portion of the opening is left; depositing a third insulating film; etching the third insulating film anisotropically; depositing a third conductive film; and performing planarization treatment to remove the second oxide film, the third insulating film, the second conductive film, and the third conductive film until part of the second insulating film is exposed, so that a second oxide, a third insulator, a third conductor, and a fourth conductor are formed.

Tantalum nitride or titanium nitride is preferably formed for the second conductive film by a sputtering method.

A metal nitride containing titanium and aluminum is preferably formed for the second conductive film by a sputtering method.

A metal oxide containing aluminum is preferably formed for the third insulating film by an ALD method.

An insulating film containing silicon and nitrogen is preferably formed for the third insulating film by an ALD method.

Effect of the Invention

According to one embodiment of the present invention, a semiconductor device with high heat resistance can be provided. According to another embodiment of the present invention, a semiconductor device with high thermal stability can be provided. According to another embodiment of the present invention, a semiconductor device with high on-state current can be provided. According to another embodiment of the present invention, a semiconductor device with excellent frequency characteristics can be provided. According to another embodiment of the present invention, a highly reliable semiconductor device can be provided. According to another embodiment of the present invention, a semiconductor device that can be miniaturized or highly integrated can be provided. According to another embodiment of the present invention, a semiconductor device with excellent electrical characteristics can be provided. According to another embodiment of the present invention, a semiconductor device that is manufactured easily can be provided. According to another embodiment of the present invention, a semiconductor device with high processing stability can be provided. According to another embodiment of the present invention, a semiconductor device with a uniform quality can be provided. According to another embodiment of the present invention, a semiconductor device with a high yield can be provided. According to another embodiment of the present invention, a semiconductor device with high productivity can be provided.

A semiconductor device capable of retaining data for a long time can be provided. A semiconductor device with high-speed data writing can be provided. A semiconductor device with high design flexibility can be provided. A semiconductor device capable of reducing power consumption can be provided. A novel semiconductor device can be provided.

Note that the descriptions of the effects do not disturb the existence of other effects. Note that one embodiment of the present invention does not necessarily have all of these effects. Effects other than these are apparent from the descriptions of the specification, the drawings, the claims, and the like and effects other than these can be derived from the descriptions of the specification, the drawings, the claims, and the like.

BRIEF DESCRIPTION OF THE DRAWINGS

FIG. 8 (A) A top view illustrating a method for manufacturing a semiconductor device. (B) and (C) Cross-sectional views illustrating the method for manufacturing the semiconductor device.

FIG. 9 (A) A top view illustrating a method for manufacturing a semiconductor device. (B) and (C) Cross-sectional views illustrating the method for manufacturing the semiconductor device.

FIG. 26 (A) to (E) Schematic diagrams of memory devices.

MODE FOR CARRYING OUT THE INVENTION

Figure 1A:
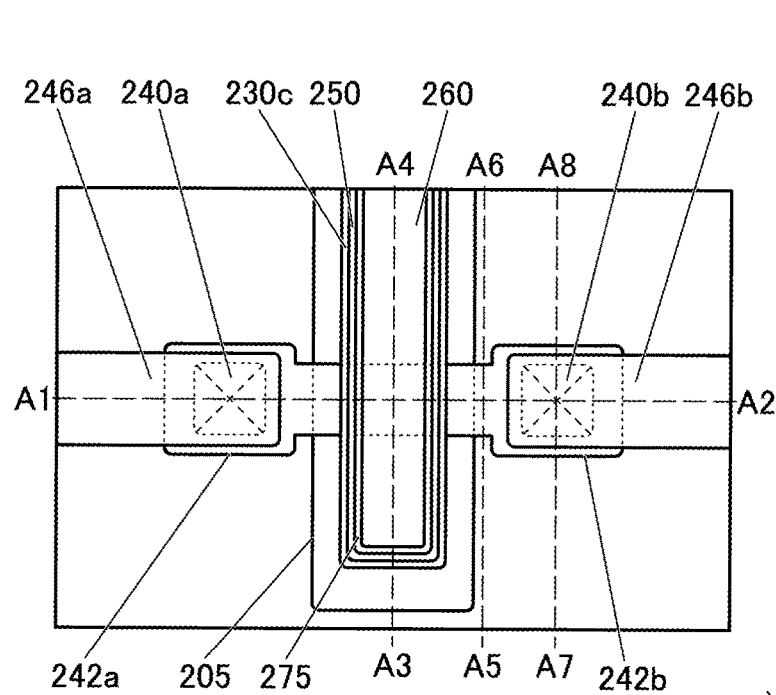
FIG. 1 (A) A top view illustrating a structure of a semiconductor device. (B) and (C) Cross-sectional views illustrating the structure of the semiconductor device.

Embodiments are described below with reference to the drawings. Note that the embodiments can be implemented with many different modes, and it is readily understood by those skilled in the art that modes and details thereof can be changed in various ways without departing from the spirit and scope thereof. Therefore, the present invention should not be interpreted as being limited to the description of the embodiments below.

In the drawings, the size, the layer thickness, or the region is exaggerated for clarity in some cases. Therefore, they are not limited to the illustrated scale. Note that the drawings schematically illustrate ideal examples, and embodiments of the present invention are not limited to shapes, values, and the like shown in the drawings. For example, in an actual manufacturing process, a layer, a resist mask, or the like might be unintentionally reduced in size by treatment such as etching, which is not reflected in the drawings for easy understanding. Furthermore, in the drawings, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. Furthermore, some hidden lines and the like might be omitted.

In addition, in this specification and the like, ordinal numbers such as "first" and "second" are used for convenience and do not denote the order of steps or the stacking order of layers. Therefore, for example, description can be made by replacing "first" with "second," "third," or the like as appropriate. In addition, the ordinal numbers in this specification and the like do not correspond to the ordinal numbers which are used to specify one embodiment of the present invention in some cases.

In addition, in this specification and the like, terms for describing arrangement, such as "over" and "below," are used for convenience to describe the positional relationship between components with reference to drawings. The positional relation between components is changed as appropriate in accordance with a direction in which the components are described. Thus, without limitation to terms described in this specification, the description can be changed appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relationship, for example, a connection relationship shown in drawings or text, a connection relationship other than a connection relationship shown in drawings or text is regarded as being disclosed in the drawings or the text.

Here, X and Y each denote an object (e.g., a device, an element, a circuit, a wiring, an electrode, a terminal, a conductive film, or a layer).

Furthermore, functions of a source and a drain might be switched when a transistor of opposite polarity is employed or a direction of current flow is changed in circuit operation, for example. Therefore, the terms "source" and "drain" can sometimes be interchanged with each other in this specification and the like.

Note that in this specification and the like, depending on transistor structures, channel width in a region where a channel is actually formed (hereinafter also referred to as effective channel width) is different from channel width shown in a top view of a transistor (hereinafter also referred to as apparent channel width) in some cases. For example, when a gate electrode covers a side surface of a semiconductor, effective channel width is greater than apparent channel width, and its influence cannot be ignored in some cases. For example, in a miniaturized transistor having a gate electrode covering a side surface of a semiconductor, the proportion of a channel formation region formed in the side surface of the semiconductor is increased in some cases. In that case, effective channel width is greater than apparent channel width.

In such a case, effective channel width is sometimes difficult to estimate by actual measurement. For example, estimation of effective channel width from a design value requires assumption that the shape of a semiconductor is known. Accordingly, in the case where the shape of a semiconductor is not known accurately, it is difficult to measure effective channel width accurately.

In this specification, the simple term "channel width" refers to an apparent channel width in some cases. Alternatively, in this specification, the simple term "channel width" refers to an effective channel width in some cases. Note that values of channel length, channel width, effective channel width, apparent channel width, and the like can be determined, for example, by analyzing a cross-sectional TEM image and the like.

Note that impurities in a semiconductor refer to, for example, elements other than the main components of a semiconductor. For example, an element with a concentration of lower than 0.1 atomic % can be regarded as an impurity. When an impurity is contained, for example, DOS (Density of States) in a semiconductor might be increased or crystallinity might be decreased. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. In the case of an oxide semiconductor, water also serves as an impurity in some cases. In addition, in the case of an oxide semiconductor, oxygen vacancies (also referred to as $V_O$) are formed by entry of impurities in some cases, for example. Furthermore, in the case where the semiconductor is silicon, examples of the impurity that changes characteristics of the semiconductor include oxygen, Group 1 elements except for hydrogen, Group 2 elements, Group 13 elements, and Group 15 elements.

Note that in this specification and the like, silicon oxynitride is a material that contains more oxygen than nitrogen in its composition. Moreover, silicon nitride oxide is a material that contains more nitrogen than oxygen in its composition.

In addition, in this specification and the like, the term "insulator" can be replaced with an insulating film or an insulating layer. Furthermore, the term "conductor" can be replaced with a conductive film or a conductive layer. Moreover, the term "semiconductor" can be replaced with a semiconductor film or a semiconductor layer.

In addition, in this specification and the like, "parallel" indicates a state where two straight lines are placed at an angle of greater than or equal to −10° and less than or equal to 10°. Accordingly, the case where the angle is greater than or equal to −5° and less than or equal to 5° is also included. Moreover, "substantially parallel" indicates a state where two straight lines are placed at an angle of greater than or equal to −30° and less than or equal to 30°. Moreover, "perpendicular" indicates a state where two straight lines are placed at an angle of greater than or equal to 80° and less than or equal to 100°. Accordingly, the case where the angle is greater than or equal to 85° and less than or equal to 95° is also included. Moreover, "substantially perpendicular" indicates a state where two straight lines are placed at an angle of greater than or equal to 60° and less than or equal to 120°.

Note that in this specification, a barrier film means a film having a function of inhibiting the passage of oxygen and impurities such as water and hydrogen, and the barrier film having conductivity is referred to as a conductive barrier film in some cases.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, in the case where an OS FET or an OS transistor is stated, the OS FET or the OS transistor can also be referred to as a transistor including an oxide or an oxide semiconductor.

In addition, in this specification and the like, "normally off" means that current per micrometer of channel width flowing through a transistor when a potential is not applied to a gate or a ground potential is applied to the gate is lower than or equal to $1\times10^{-20}$ A at room temperature, lower than or equal to $1\times10^{-18}$ A at 85° C., or lower than or equal to $1\times10^{-16}$ A at 125° C.

Embodiment 1

An example of a semiconductor device including a transistor 200 of one embodiment of the present invention is described below.

<Structure Example 1 of Semiconductor Device>

Figure 1C:
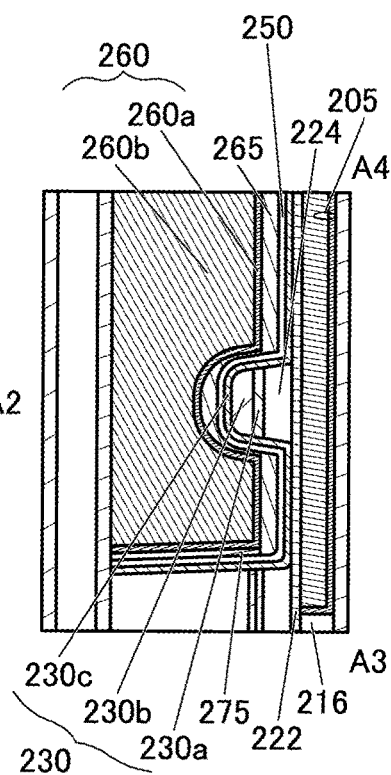
Figure 1B:
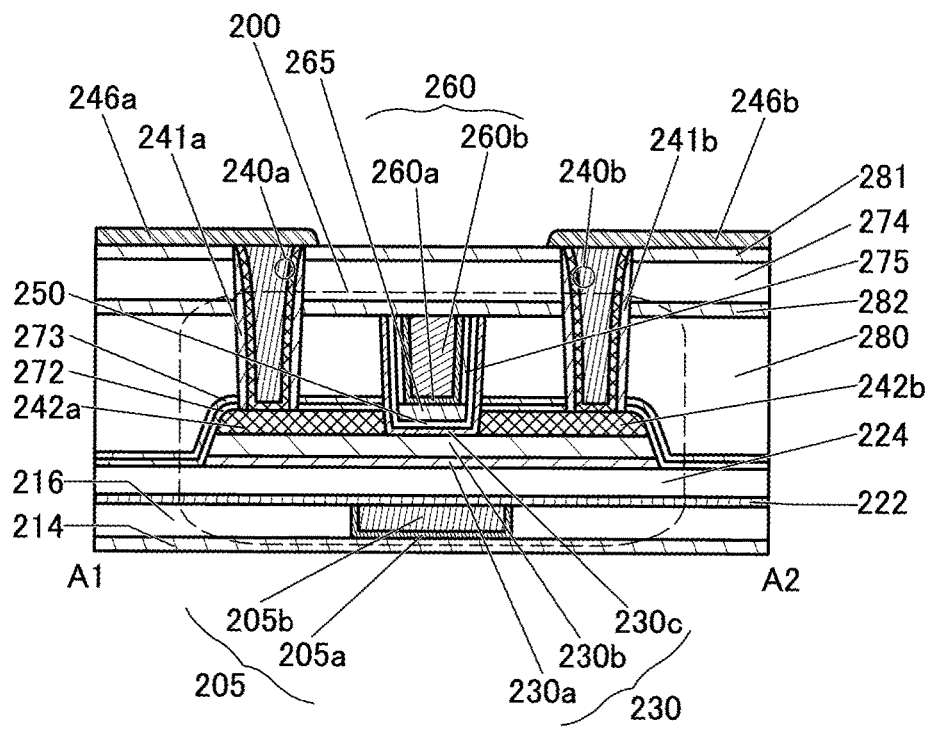

FIG. 1(A), FIG. 1(B), and FIG. 1(C) are a top view and cross-sectional views of the transistor 200 according to one embodiment of the present invention and the periphery of the transistor 200.

FIG. 1(A) is a top view of a semiconductor device including the transistor 200. FIG. 1(B) and FIG. 1(C) are cross-sectional views of the semiconductor device. Here, FIG. 1(B) is a cross-sectional view of a portion indicated by a dashed-dotted line A1-A2 in FIG. 1(A), and is also a cross-sectional view in the channel length direction of the transistor 200. FIG. 1(C) is a cross-sectional view of a portion indicated by a dashed-dotted line A3-A4 in FIG. 1(A), and is also a cross-sectional view in the channel width direction of the transistor 200. Note that for clarity of the drawing, some components are not illustrated in the top view of FIG. 1(A).

The semiconductor device of one embodiment of the present invention includes an insulator 214 over a substrate (not illustrated), the transistor 200 over the insulator 214, an insulator 280 over the transistor 200, an insulator 282 over the insulator 280, an insulator 274 over the insulator 282, and an insulator 281 over the insulator 274. The insulator 214, insulator 280, insulator 282, the insulator 274, and the insulator 281 function as interlayer films. A conductor 240 (a conductor 240a and the conductor 240b) functioning as a plug and being electrically connected to the transistor 200 is also included. Note that an insulator 241 (an insulator 241a and an insulator 241b) is provided in contact with a side surface of the conductor 240 functioning as a plug. A conductor 246 (a conductor 246a and a conductor 246b) electrically connected to the conductor 240 and functioning as a wiring is provided over the insulator 281 and the conductor 240.

The insulator 241a is provided in contact with a side portion of an opening in an insulator 272, an insulator 273, the insulator 280, insulator 282, the insulator 274, and the insulator 281, a first conductor of the conductor 240a is provided in contact with the side surface of the insulator 241a, and a second conductor of the conductor 240a is provided on the inner side thereof. The insulator 241b is provided in contact with the side portion of an opening in the insulator 272, the insulator 273, the insulator 280, the insulator 282, the insulator 274, and the insulator 281, a first conductor of the conductor 240b is provided in contact with the side surface of the insulator 241b, and a second conductor of the conductor 240b is provided on the inner side thereof. Here, the level of a top surface of the conductor 240 and the level of a top surface of the insulator 281 can be substantially the same. Note that although the transistor 200 having a structure in which the first conductor of the conductor 240 and the second conductor of the conductor 240 are stacked is illustrated, the present invention is not limited thereto. For example, the conductor 240 may be provided as a single layer or to have a stacked-layer structure of three or more layers. In the case where a structure body has a stacked-layer structure, layers may be distinguished by ordinal numbers corresponding to the formation order.

[Transistor 200]

As illustrated in FIG. 1(B), the transistor 200 includes an insulator 216 over the insulator 214; a conductor 205 (a conductor 205a and a conductor 205b) positioned so as to be embedded in the insulator 216; an insulator 222 over the insulator 216 and the conductor 205; an insulator 224 over the insulator 222; an oxide 230a over the insulator 224; an oxide 230b over the oxide 230a; a conductor 242 (a conductor 242a and a conductor 242b) over the oxide 230b; an oxide 230c over the oxide 230b; an insulator 250 over the oxide 230c; a conductor 265 over the insulator 250; a conductor 260 (a conductor 260a and a conductor 260b) and an insulator 275 over the conductor 265; the insulator 272 over the insulator 224, the conductor 242a, and the conductor 242b; and the insulator 273 over the insulator 272.

As illustrated in FIG. 1(B), the insulator 280 over the insulator 273 has an opening in which the oxide 230b is exposed, the oxide 230c is placed in contact with a bottom portion and a side portion of the opening, and the insulator 250 is placed in contact with the oxide 230c. The conductor 265 is placed in contact with the insulator 250, the insulator 275 is placed in contact with a top surface of the conductor 265 and the insulator 250. The conductor 260 is placed in contact with the insulator 275 and the top surface of the conductor 265 and is placed in the opening with the oxide 230c, the insulator 250, and the insulator 275 therebetween.

The insulator 272 is in contact with a top surface of the insulator 224, a side surface of the oxide 230a, a side surface of the oxide 230b, a side surface of the conductor 242a, a top surface of the conductor 242a, a side surface of the conductor 242b, and a top surface of the conductor 242b. The conductor 260 includes the conductor 260a and the conductor 260b, and the conductor 260a is positioned around a bottom surface and a side surface of the conductor 260b. A top surface of the conductor 260 is placed to be substantially aligned with a top surface of the insulator 275, a top surface of the insulator 250, and a top surface of the oxide 230c, and a top surface of the insulator 280. The insulator 282 is in contact with the top surfaces of the conductor 260, the insulator 275, the insulator 250, the oxide 230c, and the insulator 280.

It is preferable that the insulator 222, the insulator 272, the insulator 273, the insulator 275, and the insulator 282 have a function of inhibiting diffusion of hydrogen (e.g., at least one of a hydrogen atom, a molecule including a hydrogen atom, and an ion including a hydrogen molecule and a hydrogen atom). In addition, the insulator 222, the insulator 272, the insulator 273, the insulator 275, and the insulator 282 preferably have a function of inhibiting diffusion of oxygen (e.g., at least one of an oxygen atom, a molecule including an oxygen atom, and an ion including an oxygen molecule and oxygen). For example, preferably, the insulator 222, the insulator 272, the insulator 273, the insulator 275, and the insulator 282 each have lower permeability of one or both of oxygen and hydrogen than the insulator 224. Preferably, the insulator 222, the insulator 272, the insulator 273, the insulator 275, and the insulator 282 each have lower permeability of one or both of oxygen and hydrogen than the insulator 250. Preferably, the insulator 222, the insulator 272, the insulator 273, the insulator 275, and the insulator 282 each have lower permeability of one or both of oxygen and hydrogen than the insulator 280.

As illustrated in FIGS. 1(B) and 1(C), the insulator 272 is preferably in contact with the top and side surfaces of the conductor 242a, the top and side surfaces of the conductor 242b, the side surfaces of the oxide 230a and the oxide 230b, and the top surface of the insulator 224. The insulator 273 is preferably provided over and in contact with the insulator 272. Thus, the insulator 280 is isolated from the insulator 224, the oxide 230a, and the oxide 230b by the insulator 272 and the insulator 273.

The oxide 230 preferably includes the oxide 230a placed over the insulator 224, the oxide 230b placed over the oxide 230a, and the oxide 230c that is placed over the oxide 230b and at least partly in contact with a top surface of the oxide 230b.

The transistor 200 has, in the region where a channel is formed (hereinafter also referred to as a channel formation region) and its vicinity, a structure in which three layers of the oxide 230a, the oxide 230b, and the oxide 230c are stacked; however, the present invention is not limited thereto. For example, a single layer of the oxide 230b, a two-layer structure of the oxide 230b and the oxide 230a, a two-layer structure of the oxide 230b and the oxide 230c, or a stacked-layer structure of four or more layers may be provided. Although the transistor 200 with a structure in which the conductor 260 has a stacked-layer structure of two layers is described, the present invention is not limited thereto. For example, the conductor 260 may have a single-layer structure or a stacked-layer structure of three or more layers.

Here, the conductor 265 and the conductor 260 over the conductor 265 function as a gate electrode of the transistor, and the conductor 242a and the conductor 242b function as a source electrode and a drain electrode. In the transistor 200, the conductor 260 and the conductor 265 that function as a gate electrode is formed in a self-aligned manner to fill an opening formed in the insulator 280 and the like. The formation of the conductor 260 and the conductor 265 in this manner allows the conductor 260 and the conductor 265 to be positioned certainly in the region between the conductor 242a and the conductor 242b without alignment.

As illustrated in FIGS. 1(B) and 1(C), the conductor 265 functioning as a gate electrode is longer than the conductor 260 in the channel length direction and the channel width direction of the transistor 200. In other words, in FIG. 1(A) that is a top view, the conductor 265 has a larger projected area than the conductor 260. Thus, the transistor 200 can have large gate capacitance as compared with the case where the conductor 265 is not provided. Furthermore, the width of the offset region between the channel formation region and the source region or the drain region can be small. Thus, the electrical characteristics of the transistor 200 can be improved.

As illustrated in FIGS. 1(B) and 1(C), the insulator 275 is placed in contact with the side surface of the conductor 260. The insulator 275 is also in contact with the insulator 250. That is, the insulator 275 is placed between the conductor 260 and the insulator 250 so that the conductor 260 is not in contact with the insulator 250. With the insulator 275 that has a function of inhibiting diffusion of oxygen and impurities such as hydrogen or water and is placed in such a manner, oxygen included in the insulator 250 can be inhibited from being diffused to the conductor 260 or absorbed by the conductor 260; thus, oxidization of the conductor 260 can be inhibited. Moreover, impurities such as chlorine, fluorine, hydrogen, or water included in the conductor 260 can be inhibited from being diffused to the insulator 250.

Furthermore, while oxygen included in the insulator 280 moves to the oxide 230a and the oxide 230b through the oxide 230c and the insulator 250, the insulator 275 can inhibit absorption of oxygen included in the insulator 280 by the conductor 260. For example, loss of oxygen can be reduced in the case where oxygen included in the insulator 280 is diffused by heat treatment. In this specification, oxygen that is released by heating is referred to as excess oxygen in some cases. As the insulator 275, for example, aluminum oxide, aluminum nitride, silicon nitride, silicon nitride oxide, or hafnium oxide can be used.

In the transistor 200, as the oxide 230 (the oxide 230a, the oxide 230b, and the oxide 230c), which includes a channel formation region, a metal oxide functioning as an oxide semiconductor (hereinafter also referred to as an oxide semiconductor) is preferably used.

The transistor 200 using an oxide semiconductor in the channel formation region exhibits extremely low leakage current (off-state current) in a non-conduction state; thus, a semiconductor device with low power consumption can be provided. An oxide semiconductor can be deposited by a sputtering method or the like, and can be used for the transistor 200 constituting a highly integrated semiconductor device.

For example, as the oxide 230, a metal oxide such as an In-M-Zn oxide (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. Furthermore, as the oxide 230, an In—Ga oxide or an In—Zn oxide may be used.

The electrical characteristics of a transistor using an oxide semiconductor tend to have variations when impurities and oxygen vacancies exist in the channel formation region of the oxide semiconductor, and the reliability decreases in some cases. Moreover, if the channel formation region of the oxide semiconductor includes oxygen vacancies, the transistor tends to have normally on characteristics. Therefore, oxygen vacancies in the region where a channel is formed are preferably reduced as much as possible. For example, oxygen may be supplied to the oxide 230 through the insulator 250 or the like to supplement the oxygen vacancies. Accordingly, a transistor with reduced variation in electrical characteristics, stable electrical characteristics, and improved reliability can be provided.

A low-resistance region might be formed in part of a region between the oxide 230 and the conductor 242 or the vicinity of a surface of the oxide 230 when an element included in the conductor 242 that is provided over and in contact with the oxide 230 and functions as a source electrode or a drain electrode of the transistor 200 has a function of absorbing oxygen in the oxide 230. In that case, in the low-resistance region, an impurity (such as hydrogen, nitrogen, metal elements, or the like) entering oxygen vacancies serves as a donor, which causes an increase in carrier density in some cases. Note that in the following, hydrogen that enters oxygen vacancies is sometimes referred to as $V_oH$. The oxide 230 includes a region functioning as a channel formation region of the transistor 200 in a region not overlapping with the conductor 242a or the conductor 242b. The region preferably has a smaller carrier density and less $V_oH$ than the low-resistance regions.

As shown in FIGS. 1(B) and 1(C), the transistor 200 of one embodiment of the present invention has a structure in which the insulator 282 is directly in contact with the insulator 250 and the insulator 275. With such a structure, oxygen contained in the insulator 280 is less likely to be absorbed into the conductor 260. Furthermore, oxygen included in the insulator 280 can be inhibited from being diffused to the outside of the transistor by heat or the like. Therefore, oxygen contained in the insulator 280 can be injected into the oxide 230a and the oxide 230b efficiently through the oxide 230c without loss; hence, oxygen vacancies in the oxide 230a and the oxide 230b can be reduced and the electrical characteristics and the reliability of the transistor 200 can be improved. For the insulator 282, silicon nitride, silicon nitride oxide, aluminum oxide, aluminum nitride, or hafnium oxide can be used.

Figure 5A:
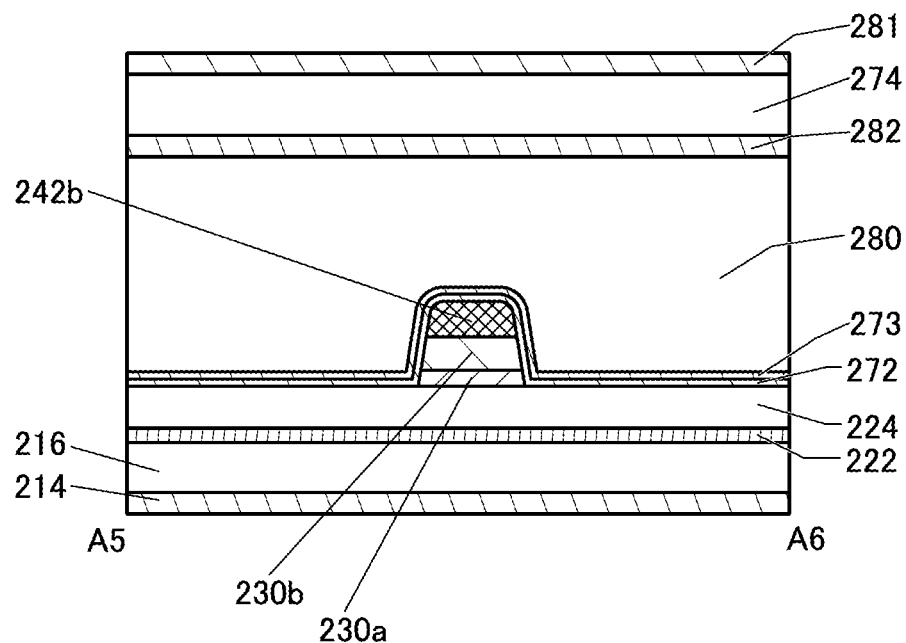
FIGS. 5 (A) and (B) Cross-sectional views illustrating a structure of a semiconductor device.

FIG. 5(A) is a cross-sectional view of a portion indicated by a dashed-dotted line A5-A6 in FIG. 1(A), and is also a cross-sectional view in the channel width direction of one of a source region and a drain region of the transistor 200. As illustrated in FIG. 5(A), the top surface of the conductor 242b, the side surface of the conductor 242b, the side surface of the oxide 230a, and the side surface of the oxide 230b are covered with the insulator 272 and the insulator 273; thus, oxygen and impurities such as hydrogen and water can be inhibited from being diffused into the conductor 242b from the side surface direction of the conductor 242b and the top surface direction of the conductor 242b and oxidation of the conductor 242b can be inhibited. Note that the same effect can be obtained in the conductor 242a. Oxygen and impurities such as hydrogen and water can be inhibited from being diffused into the oxide 230a and the oxide 230b from the side surface direction of the oxide 230a and the side surface direction of the oxide 230b. For the insulator 272, a silicon nitride film or a silicon nitride oxide film can be used. For the insulator 273, aluminum oxide or hafnium oxide can be used, for example.

Figure 5B:
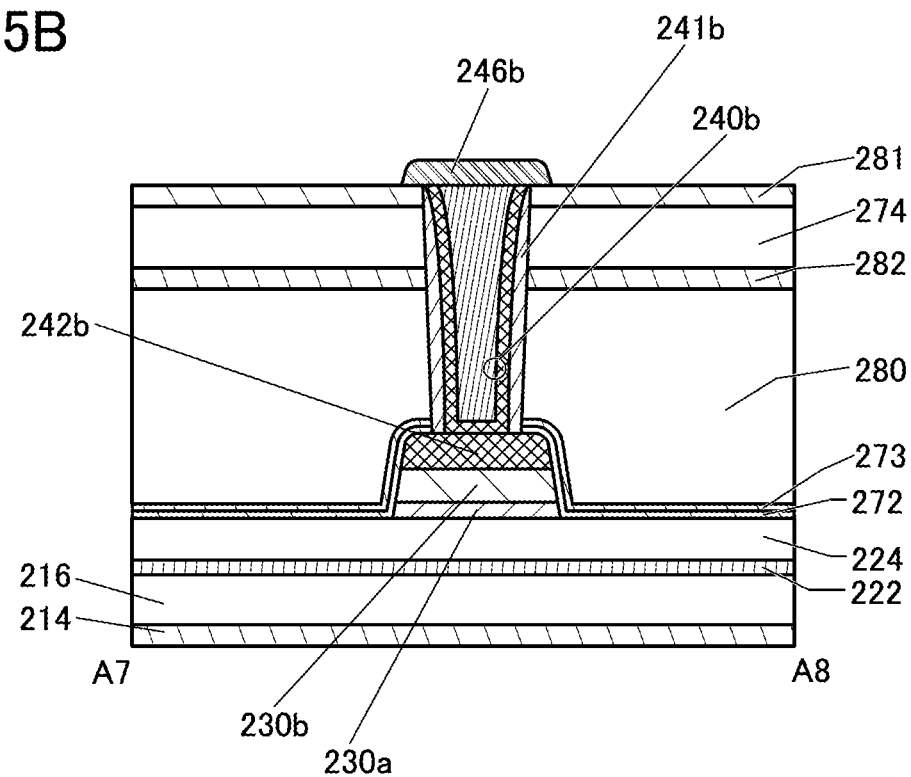

FIG. 5(B) is a cross-sectional view of a portion indicated by a dashed-dotted line A7-A8 in FIG. 1(A), which corresponds to a cross-sectional view in the channel width direction of the conductor 240b electrically connected to the transistor 200 and functioning as a plug. Since the insulator 241b is provided on a side surface of the conductor 240b as illustrated in FIG. 5(B), oxygen and impurities such as hydrogen and water from the insulator 280 can be inhibited from being diffused into the conductor 240b. Note that the same effect can be obtained in the conductor 240a.

As shown in FIG. 1(C), with the bottom surface of the insulator 224 as a reference, the level of the bottom surface of the conductor 265 in a region where the conductor 265 does not overlap with the oxide 230a or the oxide 230b is preferably lower than the level of the bottom surface of the oxide 230b. A difference between the level of the bottom surface of the conductor 265 in a region where the oxide 230b does not overlap with the conductor 265 and the level of the bottom surface of the oxide 230b is set to greater than or equal to 0 nm and less than or equal to 100 nm, preferably greater than or equal to 3 nm and less than or equal to 50 nm, and further preferably greater than or equal to 5 nm and less than or equal to 20 nm.

As described above, the conductor 260 and the conductor 265 that function as the gate electrode cover the side surface and the top surface of the oxide 230b of the channel formation region with the oxide 230c and the insulator 250 therebetween; this enables the electrical fields of the conductor 260 and the conductor 265 to easily affect the entire oxide 230b of the channel formation region. As a result, switching characteristics of the transistor can be favorable. Specifically, the subthreshold swing value can be reduced. Moreover, the off-state current can be reduced and the on-state current can be increased. Furthermore, the saturation characteristics can be favorable.

As described above, a semiconductor device including a transistor with favorable switching characteristics can be provided. A semiconductor device including a transistor with a small subthreshold swing value can be provided. A semiconductor device including a transistor with a high on-state current can be provided. Alternatively, a semiconductor device including a transistor with excellent frequency characteristics can be provided. Alternatively, a semiconductor device that has stable electrical characteristics with reduced variations in electrical characteristics and higher reliability can be provided. Alternatively, a semiconductor device including a transistor with low off-state current can be provided. Alternatively, a semiconductor device including a transistor with favorable saturation characteristics can be provided.

The detailed structure of the semiconductor device including the transistor 200 of one embodiment of the present invention is described below.

The conductor 205 is placed to overlap with the oxide 230, the conductor 260, and the conductor 265. Furthermore, the conductor 205 is preferably provided to be embedded in the insulator 216.

Here, the conductor 260 and the conductor 265 function as a first gate (also referred to as a top gate) electrode in some cases. The conductor 205 functions as a second gate (also referred to as a bottom gate) electrode in some cases. In such cases, Vth of the transistor 200 can be controlled by changing a potential applied to the conductor 205 independently of a potential applied to the conductor 260 and the conductor 265. In particular, Vth of the transistor 200 can be higher than 0 V and the off-state current can be reduced by application of a negative potential to the conductor 205. Thus, drain current when a potential applied to the conductor 260 and the conductor 265 is 0 V can be lower in the case where a negative potential is applied to the conductor 205 than in the case where the negative potential is not applied to the conductor 205.

As illustrated in FIG. 1(A), the conductor 205 is preferably provided to extend in the channel width direction beyond a region of the oxide 230a and the oxide 230b that does not overlap with the conductor 242a or the conductor 242b. In particular, as illustrated in FIG. 1(C), the conductor 205 preferably extends to a region that is on the outside of the end portions of the oxide 230a and the oxide 230b that intersect with the channel width direction. That is, the conductor 205 preferably overlaps with the conductor 260 and the conductor 265 with the insulators therebetween on the outside of the side surface of the oxide 230a and the oxide 230b in the channel width direction. When the conductor 205 is large, local charging (referred to as charge up) can be reduced in some cases in treatment using plasma of a fabrication step after the formation of the conductor 205. Note that one embodiment of the present invention is not limited thereto. The conductor 205 is at least overlapped with the oxide 230a and the oxide 230b positioned between the conductor 242a and the conductor 242b.

Since the above-described structure is included, the channel formation region of the oxide 230 can be electrically surrounded by the electric field of the conductor 260 and the conductor 265 that function as the first gate electrode and the electric field of the conductor 205 that functions as the second gate electrode. In this specification, a transistor structure in which a channel formation region is electrically surrounded by electric fields of a first gate electrode and a second gate electrode is referred to as a surrounded channel (S-channel) structure.

A conductive material that inhibits the passage of oxygen and impurities such as water and hydrogen is preferably used for the conductor 205a. For example, titanium, titanium nitride, tantalum, or tantalum nitride can be used. Moreover, a conductive material containing tungsten, copper, or aluminum as its main component is preferably used for the conductor 205b. Although the conductor 205 is illustrated as having two layers, the conductor 205 can have a multilayer structure with three or more layers.

Here, it is preferable that as an oxide semiconductor, an insulator or a conductor positioned below the oxide semiconductor, and an insulator or a conductor positioned over the oxide semiconductor, different kinds of films are successively deposited without being exposed to the air, whereby a substantially highly purified intrinsic oxide semiconductor film whose impurity (hydrogen and water, in particular) concentration is reduced can be deposited.

For example, the insulator 222, an insulating film to be the insulator 224, an oxide film to be the oxide 230a, an oxide film to be the oxide 230b, and a conductive film to be the conductor 242 that are to be positioned over the insulator 216 and the conductor 205 may be successively deposited in this order using a deposition apparatus including five treatment chambers.

The insulator 214, the insulator 272, and the insulator 281 preferably function as a barrier insulating film that inhibits impurities such as water or hydrogen from entering the transistor 200 from the substrate side or from above. Thus, the insulator 214, the insulator 272, and the insulator 281 are preferably formed using an insulating material having a function of inhibiting diffusion of impurities (through which the impurities are less likely to pass) such as a hydrogen atom, a hydrogen molecule, a water molecule, a nitrogen atom, a nitrogen molecule, a nitrogen oxide molecule (e.g., $N_2O$, NO, or $NO_2$), or a copper atom. Alternatively, it is preferable to use an insulating material that has a function of inhibiting diffusion of oxygen (e.g., at least one of oxygen atoms, oxygen molecules, and the like) (through which the above oxygen is less likely to pass).

For example, it is preferable that silicon nitride or the like be used for the insulator 214, the insulator 272, and the insulator 281. Accordingly, impurities such as water or hydrogen can be inhibited from being diffused into the transistor 200 side from the substrate side through the insulator 214. Alternatively, oxygen contained in the insulator 224 and the like can be inhibited from being diffused into the substrate side through the insulator 214. Impurities such as water or hydrogen can be inhibited from being diffused into the transistor 200 side from the insulator 280, the conductor 246, and the like, which are provided above the insulator 272.

The insulator 214 may have a stacked-layer structure. For example, a stacked-layer structure of an aluminum oxide film and a silicon nitride film can be favorably used for the insulator 214. With the aluminum oxide film, oxygen can be supplied to a lower part of the insulator 214. Furthermore, diffusion of impurities such as hydrogen and water that enter the transistor 200 side from the substrate side can be inhibited by the silicon nitride film.

The insulator 216, the insulator 280, and the insulator 274 preferably have a lower permittivity than the insulator 214. When a material with a low permittivity is used for an interlayer film, the parasitic capacitance generated between wirings can be reduced. For each of the insulator 216, the insulator 280, and the insulator 274, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate, for example.

The insulator 222 and the insulator 224 each have a function of a gate insulator.

Here, it is preferable that the insulator 224 in contact with the oxide 230 release oxygen by heating. For example, for the insulator 224, silicon oxide, silicon oxynitride, or the like is used as appropriate. When an insulator containing oxygen is provided in contact with the oxide 230, oxygen vacancies in the oxide 230 can be reduced and the reliability of the transistor 200 can be improved.

As the insulator 224, specifically, an oxide from which part of oxygen is released by heating is preferably used. An oxide that releases oxygen by heating is an oxide in which the amount of released oxygen converted into oxygen molecules is greater than or equal to $1.0 \times 10^{18}$ molecules/cm$^3$, preferably greater than or equal to $1.0 \times 10^{19}$ molecules/cm$^3$, further preferably greater than or equal to $2.0 \times 10^{19}$ molecules/cm$^3$ or greater than or equal to $3.0 \times 10^{20}$ molecules/cm$^3$ in TDS (Thermal Desorption Spectroscopy) analysis. Alternatively, the oxide that releases oxygen by heating is an oxide in which the amount of released oxygen per area is greater than or equal to $3.0 \times 10^{14}$ molecules/cm$^3$, preferably greater than or equal to $1.0 \times 10^{15}$ molecules/cm$^3$, further preferably greater than or equal to $2.0 \times 10^{15}$ molecules/cm$^3$. Note that the temperature of the surface of the oxide in the TDS analysis is preferably higher than or equal to 100° C. and lower than or equal to 700° C., or higher than or equal to 100° C. and lower than or equal to 400° C.

The insulator 222 preferably functions as a barrier insulating film that inhibits impurities such as water and hydrogen from entering the transistor 200 from the substrate side. For example, the insulator 222 preferably has lower hydrogen permeability than the insulator 224. Surrounding the insulator 224, the oxide 230, and the like by the insulator 222 and the insulator 272 can inhibit entry of impurities such as water or hydrogen into the transistor 200 from the outside.

It is preferable that the insulator 222 have a function of inhibiting diffusion of oxygen (e.g., at least one of oxygen atoms, oxygen molecules, and the like) (or be less likely to pass the above oxygen). For example, the insulator 222 preferably has lower oxygen permeability than the insulator 224. When the insulator 222 has a function of inhibiting diffusion of oxygen or impurities, diffusion of oxygen included in the oxide 230 into an area below the insulator 222 can be reduced, which is preferable. Furthermore, the conductor 205 can be inhibited from reacting with oxygen contained in the insulator 224 or the oxide 230.

As the insulator 222, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. In the case where the insulator 222 is formed using such a material, the insulator 222 functions as a layer that inhibits release of oxygen from the oxide 230 and entry of impurities such as hydrogen from the periphery of the transistor 200 into the oxide 230.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

Alternatively, for example, a single layer or stacked layers of an insulator containing what is called a high-k material such as aluminum oxide, hafnium oxide, tantalum oxide, zirconium oxide, lead zirconate titanate (PZT), strontium titanate (SrTiO$_3$), or (Ba,Sr)TiO$_3$ (BST) may be used for the insulator 222. With miniaturization and high integration of transistors, a problem such as leakage current may arise because of a thinner gate insulator. When a high-k material is used for an insulator functioning as the gate insulator, a gate potential during operation of the transistor can be reduced while the physical thickness of the gate insulator is kept.

Note that the insulator 222 and the insulator 224 may each have a stacked-layer structure of two or more layers. In that case, without limitation to a stacked-layer structure formed of the same material, a stacked-layer structure formed of different materials may be employed.

The oxide 230 includes the oxide 230a, the oxide 230b over the oxide 230a, and the oxide 230c over the oxide 230b. Including the oxide 230a below the oxide 230b makes it possible to inhibit diffusion of impurities into the oxide 230b from the components formed below the oxide 230a. Moreover, including the oxide 230c over the oxide 230b makes it possible to inhibit diffusion of impurities into the oxide 230b from the components formed above the oxide 230c.

Note that the oxide 230 preferably has a stacked-layer structure using oxides which differ in the atomic ratio of metal elements. Specifically, the atomic ratio of the element M to the constituent elements in the metal oxide used for the oxide 230a is preferably greater than the atomic ratio of the element M to the constituent elements in the metal oxide used for the oxide 230b. Moreover, the atomic ratio of the element M to In in the metal oxide used for the oxide 230a is preferably greater than the atomic ratio of the element M to In in the metal oxide used for the oxide 230b. Furthermore, the atomic ratio of In to the element M in the metal oxide used for the oxide 230b is preferably greater than the atomic ratio of In to the element M in the metal oxide used for the oxide 230a. A metal oxide that can be used for the oxide 230a or the oxide 230b can be used for the oxide 230c.

The oxide 230b preferably has crystallinity. For example, a CAAC-OS (c-axis aligned crystalline oxide semiconductor) described later is preferably used. An oxide having crystallinity, such as a CAAC-OS, has a dense structure with small amounts of impurities and defects (oxygen vacancies or the like) and high crystallinity. This can inhibit oxygen extraction from the oxide 230b by the source electrode or the drain electrode. This can reduce oxygen extraction from the oxide 230b even when heat treatment is performed; thus, the transistor 200 is stable with respect to high temperatures in a manufacturing process (what is called thermal budget).

The energy of the conduction band minimum of each of the oxide 230a and the oxide 230c is preferably higher than the energy of the conduction band minimum of the oxide 230b. In other words, the electron affinity of each of the oxide 230a and the oxide 230c is preferably smaller than the electron affinity of the oxide 230b.

Here, the energy level of the conduction band minimum gradually changes at junction portions of the oxide 230a, the oxide 230b, and the oxide 230c. In other words, the energy level of the conduction band minimum at the junction portions of the oxide 230a, the oxide 230b, and the oxide 230c continuously changes or is continuously connected. To obtain this, the density of defect states in a mixed layer formed at an interface between the oxide 230a and the oxide 230b and an interface between the oxide 230b and the oxide 230c is preferably made low.

Specifically, as the oxide 230a, a metal oxide with In:Ga:Zn=1:3:4 [atomic ratio] or In:Ga:Zn=1:1:0.5 [atomic ratio] is used. As the oxide 230b, a metal oxide with In:Ga:Zn=4:2:3 [atomic ratio] or In:Ga:Zn=3:1:2 [atomic ratio] is used. As the oxide 230c, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] is used. Specific examples of the oxide 230c having a stacked-layer structure include a stacked-layer structure of a metal oxide with In:Ga:Zn=4:2:3 [atomic ratio] and a metal oxide with Ga:Zn=2:1 [atomic ratio], a stacked-layer structure of a metal oxide with In:Ga:Zn=4:2:3 [atomic ratio] and a metal oxide with Ga:Zn=2:5 [atomic ratio], and a stacked-layer structure of a metal oxide with In:Ga:Zn=4:2:3 [atomic ratio] and gallium oxide.

At this time, the oxide 230b serves as a main carrier path. When the oxide 230a and the oxide 230c have the above structure, the density of defect states at the interface between the oxide 230a and the oxide 230b and the interface between the oxide 230b and the oxide 230c can be made low. Thus, the influence of interface scattering on carrier conduction is small, and the transistor 200 can have high on-state current and high frequency characteristics. Note that in the case where the oxide 230c has a stacked-layer structure, in addition to the reduction of density of defect states at the interface between the oxide 230b and the oxide 230c, the inhibition of diffusion of the constituent element of the oxide 230c to the insulator 250 side is expected. More specifically, since the oxide 230c has a stacked-layer structure in which an oxide that does not contain In is positioned in the upper layer, the diffusion of In to the insulator 250 side can be inhibited. Since the insulator 250 functions as a gate insulator, the transistor exhibits poor characteristics when In diffuses. Thus, when the oxide 230c has a stacked-layer structure, a highly reliable semiconductor device can be provided.

A metal oxide functioning as an oxide semiconductor is preferably used as the oxide 230. For example, a metal oxide whose energy gap is greater than or equal to 2 eV, preferably greater than or equal to 2.5 eV, is preferably used. With use of a metal oxide having such a wide energy gap, the off-state current of the transistor can be reduced. With the use of such a transistor, a semiconductor device with low power consumption can be provided.

Figure 18:
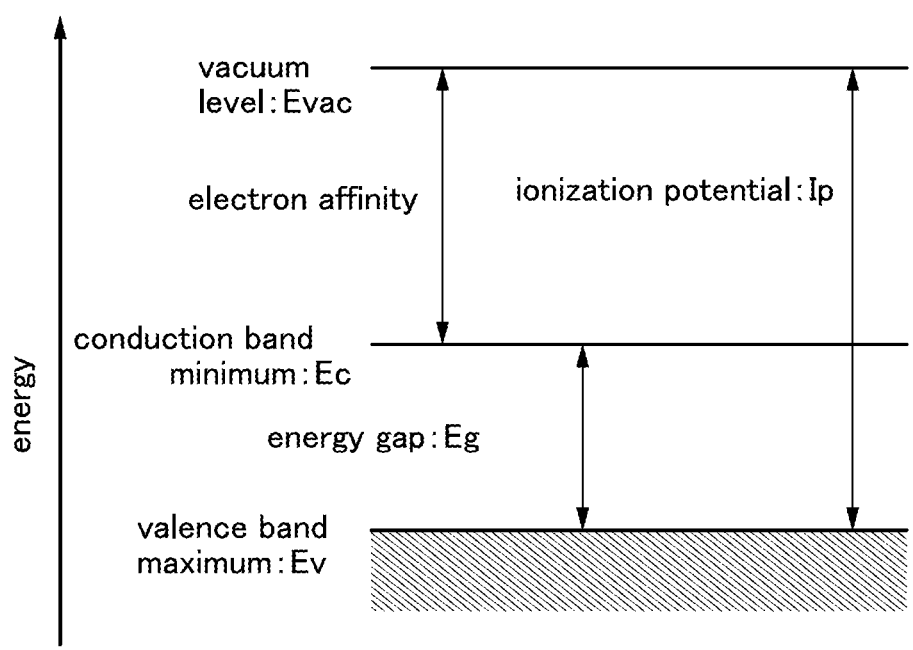
FIG. 18 A diagram illustrating an energy band structure of an oxide semiconductor.

Electron affinity or conduction band minimum Ec can be obtained from an energy gap Eg and an ionization potential Ip, which is a difference between a vacuum level Evac and valence band maximum Ev, as shown in FIG. 18. The ionization potential Ip can be measured using, for example, an ultraviolet photoelectron spectroscopy (UPS) apparatus. The energy gap Eg can be measured using, for example, a spectroscopic ellipsometer.

The conductor 242 (the conductor 242a and the conductor 242b) functioning as the source electrode and the drain electrode is provided over the oxide 230b. The thickness of the conductor 242 is greater than or equal to 1 nm and less than or equal to 50 nm, preferably greater than or equal to 2 nm and less than or equal to 25 nm, for example.

For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal elements; or the like. For example, it is preferable to use tantalum nitride, titanium nitride, or a nitride containing tungsten, titanium, and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, or a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

The insulator 250 functions as a gate insulator. The insulator 250 is preferably provided in contact with the top surface of the oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

Like the insulator 224, the insulator 250 is preferably formed using an insulator from which oxygen is released by heating. When an insulator from which oxygen is released by heating is provided as the insulator 250 in contact with the top surface of the oxide 230c, oxygen can be efficiently supplied to the channel formation region of the oxide 230b through the oxide 230c. Furthermore, as in the insulator 224, the concentration of impurities such as water or hydrogen in the insulator 250 is preferably reduced. The thickness of the insulator 250 is preferably greater than or equal to 1 nm and less than or equal to 20 nm.

Furthermore, a metal oxide (not shown) may be provided between the insulator 250 and the conductor 260. The metal oxide preferably inhibits oxygen diffusion from the insulator 250 to the conductor 260. Provision of the metal oxide that inhibits diffusion of oxygen inhibits diffusion of oxygen from the insulator 250 to the conductor 260. That is, a reduction in the amount of oxygen supplied to the oxide 230 can be inhibited. Furthermore, oxidation of the conductor 260 due to oxygen from the insulator 250 can be inhibited.

In addition, the metal oxide has a function of part of the gate insulator in some cases. Therefore, when silicon oxide, silicon oxynitride, or the like is used for the insulator 250, a metal oxide that is a high-k material with a high relative permittivity is preferably used as the metal oxide. When the gate insulator has a stacked-layer structure of the insulator 250 and the metal oxide, the stacked-layer structure can be thermally stable and have a high relative permittivity. Thus, a gate potential that is applied during operation of the transistor can be reduced while the physical thickness of the gate insulator is maintained. Furthermore, the equivalent oxide thickness (EOT) of the insulator functioning as the gate insulator can be reduced.

Specifically, a metal oxide containing one kind or two or more kinds selected from hafnium, aluminum, gallium, yttrium, zirconium, tungsten, titanium, tantalum, nickel, germanium, magnesium, and the like can be used. It is particularly preferable to use an insulator containing an oxide of one or both of aluminum and hafnium, such as aluminum oxide, hafnium oxide, or an oxide containing aluminum and hafnium (hafnium aluminate).

The metal oxide has a function of part of the gate electrode in some cases. In that case, the conductive material containing oxygen is preferably provided on the channel formation region side. When the conductive material containing oxygen is provided on the channel formation region side, oxygen left from the conductive material is easily supplied to the channel formation region.

It is particularly preferable to use, for the conductor functioning as the gate electrode, a conductive material containing oxygen and a metal element contained in a metal oxide where the channel is formed. Alternatively, a conductive material containing the above metal element and nitrogen may be used. For example, titanium nitride, tantalum nitride, or the like can be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide where the channel is formed can be trapped in some cases. Alternatively, hydrogen entering from an external insulator or the like can be trapped in some cases.

Note that the conductor 265 desirably includes a hardly oxidizable material. When a hardly oxidizable material is used for the conductor 265, the conductor 265 itself can be inhibited from being oxidized and having high resistance. As the hardly oxidizable material, tantalum nitride, tungsten nitride, titanium nitride, platinum, iridium, silver, gold, a titanium-aluminum alloy, or a nitride of a titanium-aluminum alloy can be used, for example. Alternatively, a stacked-layer film of tantalum nitride, tungsten nitride, titanium nitride, platinum, iridium, silver, gold, a titanium-aluminum alloy, or a nitride of a titanium-aluminum alloy and tantalum, tungsten, titanium, molybdenum, aluminum, copper, or a molybdenum-tungsten alloy can be used.

Alternatively, a conductive metal oxide may be used for the conductor 265. When a conductive metal oxide is used for the conductor 265 including oxygen, the conductor 265 can be inhibited from having high resistance due to oxygen absorption. As a result, the on-state characteristics of the transistor can be increased. As the conductive metal oxide, indium tin oxide (ITO), indium tin oxide containing silicon (ITSO), zinc oxide (ZnO), indium tin oxide containing zinc, zinc oxide containing gallium (GZO), zinc oxide containing aluminum (AZO), tin oxide ($SnO_2$), tin oxide containing fluorine (FTO), tin oxide containing aluminum (ATO), ruthenium oxide, and the like can be given for example. Moreover, for example, an In—Ga—Zn-based oxide having high conductivity may be used. Furthermore, a conductive film having a high work function is used for the conductor 265, the threshold voltage of the transistor can be shifted in the positive direction in some cases.

For the conductor 265, a semiconductor having high electrical conductivity, polycrystalline silicon containing an impurity element such as phosphorus, or silicide such as nickel silicide may be used.

Although FIG. 1(B) and FIG. 1(C) illustrate the conductor 260 having a two-layer structure, the conductor 260 may have a single-layer structure or a stacked-layer structure of three or more layers.

For the conductor 260a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like).

In addition, when the conductor 260a has a function of inhibiting diffusion of oxygen, the conductivity of the conductor 260b can be inhibited from being lowered because of oxidation due to oxygen contained in the insulator 250. As a conductive material having a function of inhibiting oxygen diffusion, for example, tantalum, tantalum nitride, ruthenium, ruthenium oxide, or the like is preferably used.

A conductive material containing tungsten, copper, or aluminum as its main component is preferably used for the conductor 260b. The conductor 260 also functions as a wiring and thus is preferably formed using a conductor having high conductivity. For example, a conductive material containing tungsten, copper, or aluminum as its main component can be used. The conductor 260b may have a stacked-layer structure, for example, a stacked-layer structure of any of the above conductive materials and titanium or titanium nitride.

For example, the insulator 280 preferably includes silicon oxide, silicon oxynitride, silicon nitride oxide, silicon oxide to which fluorine is added, silicon oxide to which carbon is added, silicon oxide to which carbon and nitrogen are added, porous silicon oxide, or the like. In particular, silicon oxide and silicon oxynitride, which have thermal stability, are preferable. Materials such as silicon oxide, silicon oxynitride, and porous silicon oxide, in each of which a region containing oxygen released by heating can be easily formed, are particularly preferable.

The concentration of impurities such as water and hydrogen in the insulator 280 is preferably lowered. In addition, the top surface of the insulator 280 may be planarized.

The insulator 282 preferably functions as a barrier insulating film that inhibits impurities such as water and hydrogen from entering the insulator 280 from the above. As the insulator 282, an insulator such as aluminum oxide, silicon nitride, or silicon nitride oxide may be used.

The insulator 274 functioning as an interlayer film is preferably provided over the insulator 282. As in the insulator 224 or the like, the concentration of impurities such as water or hydrogen in the insulator 274 is preferably lowered.

For the conductor 240a and the conductor 240b, a conductive material containing tungsten, copper, or aluminum as its main component is preferably used. In addition, the conductor 240*a* and the conductor 240*b* may each have a stacked-layer structure.

In the case where the conductor 240 has a stacked-layer structure, a conductive material having a function of inhibiting the passage of an impurity such as water or hydrogen is preferably used for the first conductor of the conductor 240 in contact with the insulator 281, the insulator 274, the insulator 282, the insulator 280, the insulator 273, and the insulator 272. For example, tantalum, tantalum nitride, titanium, titanium nitride, ruthenium, ruthenium oxide, or the like is preferably used. A single layer or a stacked layer of the conductive material having a function of inhibiting the passage of impurities such as water or hydrogen may be used. With the use of the conductive material, impurities such as water or hydrogen can be inhibited from entering the oxide 230 through the conductor 240*a*, the conductor 240*b*, the conductor 242*a*, and the conductor 242*b* from a layer above the insulator 281.

As the insulator 241*a* and the insulator 241*b*, an insulator such as aluminum oxide, aluminum nitride, silicon nitride, or silicon nitride oxide may be used. Since the insulator 241*a* and the insulator 241*b* are provided in contact with the insulator 272 and the insulator 273, impurities such as water or hydrogen can be inhibited from entering the oxide 230 through the insulator 272, the insulator 273, the conductor 240*a*, and the conductor 240*b* from the insulator 280 or the like. In addition, oxygen contained in the insulator 280 can be prevented from being absorbed by the conductor 240*a* and the conductor 240*b*.

The conductor 246 (the conductor 246*a* and the conductor 246*b*) functioning as a wiring may be provided in contact with a top surface of the conductor 240*a* and a top surface of the conductor 240*b*. The conductor 246 is preferably formed using a conductive material containing tungsten, copper, or aluminum as its main component. Furthermore, the conductor may have a stacked-layer structure; for example, stacked layers of the above conductive material, and titanium or titanium nitride. Note that the conductor may be formed to be embedded in an opening provided in an insulator.

<Structure Example 2 of Semiconductor Device>

Figure 3A:
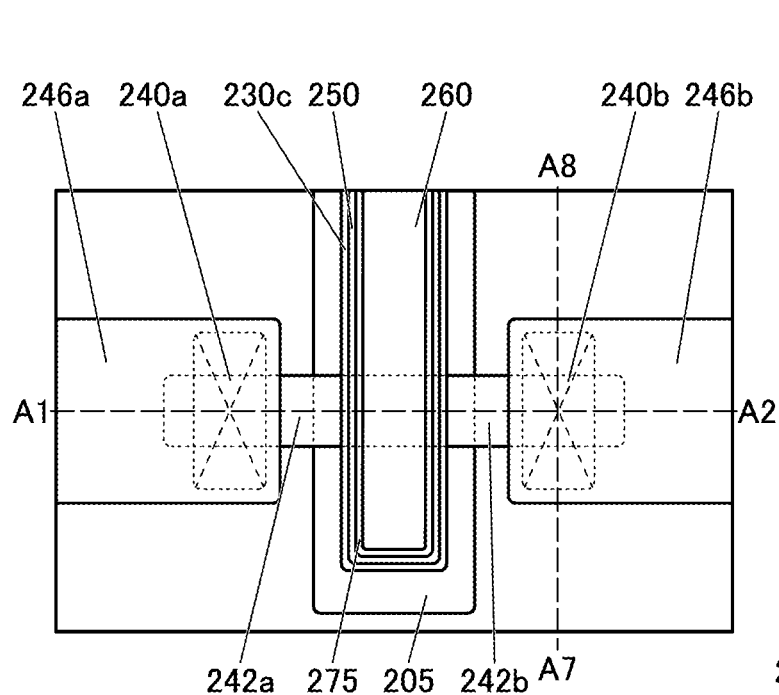
FIG. 3 (A) A top view illustrating a structure of a semiconductor device. (B) and (C) Cross-sectional views illustrating the structure of the semiconductor device.
Figure 3C:
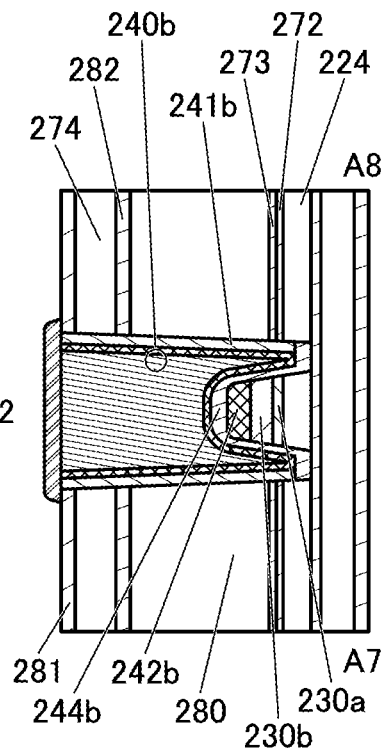
Figure 3B:
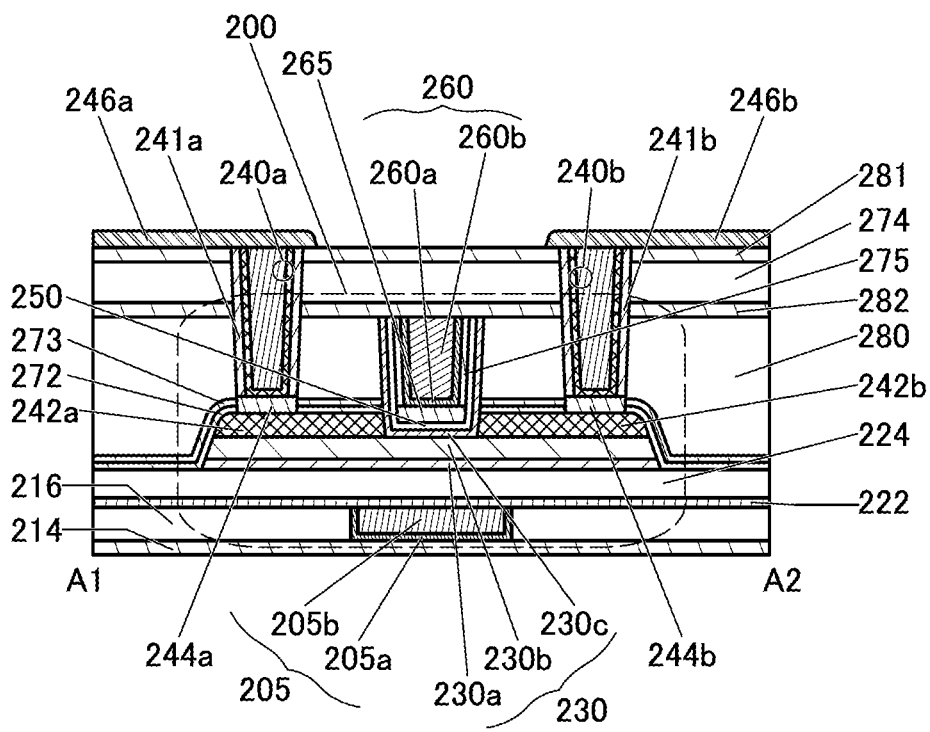

A semiconductor device with a structure different from that of the semiconductor device illustrated in FIG. 1 is described. FIG. 3(A), FIG. 3(B), and FIG. 3(C) are a top view and cross-sectional views of the transistor 200 of one embodiment of the present invention and a periphery of the transistor 200.

FIG. 3(A) is a top view of a semiconductor device including the transistor 200. FIG. 3(B) and FIG. 3(C) are cross-sectional views of the semiconductor device. Here, FIG. 3(B) is a cross-sectional view of a portion indicated by a dashed-dotted line A1-A2 in FIG. 3(A), and is a cross-sectional view in the channel length direction of the transistor 200. FIG. 3(C) is a cross-sectional view of a portion indicated by a dashed-dotted line A7-A8 in FIG. 3(A), which corresponds to a cross-sectional view in the channel width direction of the conductor 240*b* electrically connected to the transistor 200 and functioning as a plug. For clarity of the drawing, some components are not illustrated in the top view of FIG. 3(A).

The semiconductor device illustrated in FIG. 3 differs from the semiconductor device illustrated in FIG. 1 in including a conductor 244 (a conductor 244*a* and a conductor 244*b*) that is electrically connected to the transistor 200 and is in contact with a bottom portion of the conductor 240 (the conductor 240*a* and the conductor 240*b*) functioning as a plug.

As illustrated in FIG. 3(B) and FIG. 3(C), the conductor 244 is placed at bottom portions of openings of the insulator 224, the insulator 272, the insulator 273, the insulator 280, the insulator 282, the insulator 274, and the insulator 281.

The insulator 241 (the insulator 241*a* and the insulator 241*b*) is provided over the conductor 244 to be in contact with side portions of the openings, the first conductor of the conductor 240 is provided in contact with the side surfaces, and the second conductor of the conductor 240 is provided on the inner side.

As illustrated in FIG. 3(C), the size of the opening provided in the insulator 224, the insulator 272, the insulator 273, the insulator 280, the insulator 282, the insulator 274, and the insulator 281 is preferably larger than the width of each of the oxide 230*a* and the oxide 230*b* in the channel width direction. That is, the top surface of the oxide 230*b*, the side surface of the oxide 230*b*, and the side surface of the oxide 230*a* are exposed in the bottom portion of the opening. Thus, the conductor 244 is in contact with the top surface of the conductor 242, the side surface of the conductor 242, the side surface of the oxide 230*b*, and the side surface of the oxide 230*a*, and thus the contact resistance can be reduced. The conductor 244 can be formed using a material similar to that for the conductor 265. Structure example 1 of semiconductor device, which is described above, can be referred to for the other structures and the effects.

<Constituent Materials of Semiconductor Device>

Constituent materials that can be used for the semiconductor device are described below.

<Substrate>

As a substrate over which the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (an yttria-stabilized zirconia substrate or the like), and a resin substrate. In addition, examples of the semiconductor substrate include a semiconductor substrate of silicon, germanium, or the like and a compound semiconductor substrate containing silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element.

<Insulator>

Examples of an insulator include an oxide, a nitride, an oxynitride, a nitride oxide, a metal oxide, a metal oxynitride, and a metal nitride oxide, each of which has an insulating property.

As miniaturization and high integration of the transistor progress, for example, a problem such as leakage current may arise because of a thinner gate insulator. When a high-k material is used for the insulator functioning as a gate insulator, the voltage when the transistor operates can be reduced while the physical thickness of the gate insulator is kept. In contrast, when a material with a low relative permittivity is used for the insulator functioning as an interlayer film, parasitic capacitance generated between wirings can be reduced. Thus, a material is preferably selected depending on the function of an insulator.

In addition, examples of the insulator with a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

In addition, examples of the insulator with a low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When the transistor using an oxide semiconductor is surrounded by an insulator that has a function of inhibiting the passage of oxygen and impurities such as hydrogen, the electrical characteristics of the transistor can be stable. For the insulator having a function of inhibiting the passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; a metal nitride such as aluminum nitride, aluminum titanium nitride, titanium nitride, silicon nitride oxide, silicon nitride; or the like can be used.

In addition, the insulator functioning as the gate insulator is preferably an insulator including a region containing oxygen released by heating. For example, when a structure is employed in which silicon oxide or silicon oxynitride including a region containing oxygen released by heating is in contact with the oxide 230, oxygen vacancies included in the oxide 230 can be compensated for.

<Conductor>

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal elements; or the like. For example, it is preferable to use tantalum nitride, titanium nitride, or a nitride containing tungsten, titanium, and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, or a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. A semiconductor having high electrical conductivity, typified by polycrystalline silicon containing an impurity element such as phosphorus, or silicide such as nickel silicide may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

Note that when an oxide is used for the channel formation region of the transistor, a stacked-layer structure in which a material containing the above metal element and a conductive material containing oxygen are combined is preferably used for the conductor functioning as the gate electrode. In that case, the conductive material containing oxygen is preferably provided on the channel formation region side. When the conductive material containing oxygen is provided on the channel formation region side, oxygen left from the conductive material is easily supplied to the channel formation region.

It is particularly preferable to use, for the conductor functioning as the gate electrode, a conductive material containing oxygen and a metal element contained in a metal oxide where the channel is formed. Alternatively, a conductive material containing the above metal element and nitrogen may be used. For example, a conductive material containing nitrogen, such as titanium nitride or tantalum nitride, may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide where the channel is formed can be trapped in some cases. Alternatively, hydrogen entering from an external insulator or the like can be trapped in some cases.

<Metal Oxide>

As the oxide 230, a metal oxide functioning as an oxide semiconductor is preferably used. A metal oxide that can be applied to the oxide 230 of the present invention is described below.

The metal oxide preferably includes at least indium or zinc. In particular, indium and zinc are preferably included. Furthermore, aluminum, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, an element M, and zinc is considered. Note that the element M is aluminum, gallium, yttrium, tin, or the like. Examples of other elements that can be used as the element M include boron, titanium, iron, nickel, germanium, zirconium, molybdenum, lanthanum, cerium, neodymium, hafnium, tantalum, tungsten, and magnesium. Note that it is sometimes acceptable to use a plurality of the above-described elements in combination as the element M.

Note that in this specification and the like, a metal oxide containing nitrogen is also collectively referred to as a metal oxide in some cases. A metal oxide containing nitrogen may be referred to as a metal oxynitride.

[Structure of Metal Oxide]

Oxide semiconductors (metal oxides) can be classified into a single crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) is difficult to observe even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter referred to as an In layer) and a layer containing the element M, zinc, and oxygen (hereinafter referred to as an (M, Zn) layer) are stacked. Note that indium and the element M can be replaced with each other, and when the element M in the (M, Zn) layer is replaced with indium, the layer can also be referred to as an (In, M, Zn) layer. Furthermore, when indium in the In layer is replaced with the element M, the layer can be referred to as an (In, M) layer.

The CAAC-OS is a metal oxide with high crystallinity. By contrast, in the CAAC-OS, a reduction in electron mobility due to the crystal grain boundary is less likely to occur because it is difficult to observe a clear crystal grain boundary. Furthermore, entry of impurities, formation of defects, or the like might decrease the crystallinity of a metal oxide, which means that the CAAC-OS is a metal oxide including few impurities and defects (e.g., oxygen vacancies). Thus, a metal oxide including a CAAC-OS is physically stable. Therefore, the metal oxide including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

Note that indium-gallium-zinc oxide (hereinafter referred to as IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity compared with the nc-OS and the CAAC-OS.

An oxide semiconductor (metal oxide) can have various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Impurities]

Here, the influence of each impurity in the metal oxide is described.

When the metal oxide contains an alkali metal or an alkaline earth metal, defect states are formed and carriers are generated in some cases. Thus, a transistor using a metal oxide that contains an alkali metal or an alkaline earth metal for its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide (the concentration obtained by secondary ion mass spectrometry (SIMS) is set lower than or equal to $1 \times 10^{18}$ atoms/cm$^3$, preferably lower than or equal to $2 \times 10^{16}$ atoms/cm$^3$.

Hydrogen contained in a metal oxide reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using a metal oxide that contains hydrogen is likely to have normally on characteristics.

Accordingly, hydrogen in the metal oxide is preferably reduced as much as possible. Specifically, the hydrogen concentration of the metal oxide obtained by SIMS is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$. When a metal oxide in which impurities are sufficiently reduced is used in a channel formation region of a transistor, stable electrical characteristics can be imparted.

<Method for Manufacturing Semiconductor Device>

Next, a method for manufacturing a semiconductor device including the transistor 200 of the present invention, which is illustrated in FIG. 1, is described with reference to FIG. 6 to FIG. 17. In FIG. 6 to FIG. 17, (A) of each drawing is a top view. Moreover, (B) of each drawing is a cross-sectional view corresponding to a portion indicated by the dashed-dotted line A1-A2 in (A), and is also a cross-sectional view in the channel length direction of the transistor 200. Moreover, (C) in each drawing is a cross-sectional view corresponding to a portion indicated by a dashed-dotted line A3-A4 in (A), and is also a cross-sectional view of the transistor 200 in the channel width direction. Note that for simplification of the drawing, some components are not illustrated in the top view of (A) in each drawing.

First, a substrate (not illustrated) is prepared, and the insulator 214 is deposited over the substrate. The insulator 214 can be deposited by a sputtering method, a chemical vapor deposition (CVD) method, a molecular beam epitaxy (MBE) method, a pulsed laser deposition (PLD) method, an ALD (Atomic Layer Deposition) method, or the like.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas to be used.

By a plasma CVD method, a high-quality film can be obtained at a relatively low temperature. Furthermore, a thermal CVD method is a deposition method that does not use plasma and thus enables less plasma damage to an object to be processed. For example, a wiring, an electrode, an element (a transistor, a capacitor, or the like), or the like included in a semiconductor device might be charged up by receiving electric charge from plasma. In that case, accumulated electric charge might break the wiring, the electrode, the element, or the like included in the semiconductor device. In contrast, such plasma damage does not occur in the case of a thermal CVD method that does not use plasma, and thus the yield of the semiconductor device can be increased. In addition, the thermal CVD method does not cause plasma damage during deposition, so that a film with few defects can be obtained.

In an ALD method, one atomic layer can be deposited at a time using self-regulating characteristics of atoms. Thus, the ALD method has advantages such as deposition of an extremely thin film, deposition on a component with a high aspect ratio, deposition of a film with a small number of defects such as pinholes, deposition with good coverage, and low-temperature deposition. Furthermore, the ALD method includes a PEALD (Plasma Enhanced ALD) method that is a deposition method using plasma. The use of plasma is sometimes preferable because deposition at lower temperature is possible. Note that a precursor used in the ALD method sometimes contains impurities such as carbon. Thus, in some cases, a film provided by the ALD method contains impurities such as carbon in a larger amount than a film provided by another deposition method. Note that impurities can be quantified by X-ray photoelectron spectroscopy (XPS).

Unlike a deposition method in which particles ejected from a target or the like are deposited, a CVD method and an ALD method are deposition methods in which a film is formed by reaction at a surface of an object. Thus, a CVD method and an ALD method are deposition methods that enable favorable step coverage almost regardless of the shape of an object. In particular, an ALD method enables excellent step coverage and excellent thickness uniformity and thus is suitable for covering a surface of an opening with a high aspect ratio, for example. On the other hand, an ALD method has a relatively low deposition rate, and thus is preferably used in combination with another deposition method with a high deposition rate, such as a CVD method, in some cases.

When a CVD method or an ALD method is used, the composition of a film to be obtained can be controlled with a flow rate ratio of source gases. For example, by a CVD method or an ALD method, a film with a certain composition can be formed depending on the flow rate ratio of the source gases. Moreover, with a CVD method or an ALD method, by changing the flow rate ratio of the source gases during deposition, a film whose composition is continuously changed can be formed. In the case of deposition while changing the flow rate ratio of source gases, as compared with the case of deposition with the use of a plurality of deposition chambers, time taken for the deposition can be shortened because time taken for transfer and pressure adjustment is not required. Thus, the productivity of the semiconductor device can be increased in some cases.

In this embodiment, for the insulator 214, silicon nitride is deposited by a CVD method. As described here, an insulator through which copper is less likely to pass, such as silicon nitride, is used for the insulator 214; accordingly, even when a metal that is likely to diffuse, such as copper, is used for a conductor in a layer (not illustrated) below the insulator 214, diffusion of the metal to a layer above the insulator 214 can be inhibited.

Next, the insulator 216 is deposited over the insulator 214. The insulator 216 can be deposited by a sputtering method, a CVD method, an MBE method, a PLD method, an ALD method, or the like.

Then, an opening reaching the insulator 214 is formed in the insulator 216. Examples of the opening include a groove and a slit. A region where the opening is formed may be referred to as an opening portion. Wet etching can be used for the formation of the opening; however, dry etching is preferably used for microfabrication. As the insulator 214, it is preferable to select an insulator that functions as an etching stopper film used in forming the groove by etching the insulator 216. For example, in the case where silicon oxide is used as the insulator 216 in which the groove is to be formed, silicon nitride, aluminum oxide, or hafnium oxide is preferably used as the insulator 214.

After the formation of the opening, a conductive film to be the conductor 205 is deposited. The conductive film desirably includes a conductor that has a function of inhibiting oxygen passage. For example, tantalum nitride, tungsten nitride, or titanium nitride can be used. Alternatively, a stacked film of tantalum nitride, tungsten nitride, or titanium nitride and tantalum, tungsten, titanium, molybdenum, aluminum, copper, or a molybdenum-tungsten alloy can be used. The conductive film to be the conductor 205 can be deposited by a sputtering method, a CVD method, an MBE method, a PLD method, an ALD method, or the like.

In this embodiment, the conductive film to be the conductor 205 has a multilayer structure. First, tantalum nitride is deposited by a sputtering method, and titanium nitride is stacked over the tantalum nitride. With the use of such a metal nitride for a lower layer of the conductive film to be the conductor 205, even when a metal that is likely to diffuse, such as copper, is used for an upper layer of the conductive film to be the conductor 205 that is described later, the metal can be prevented from being diffused downward from the conductor 205.

Next, a conductive film that is the upper layer of the conductive film to be the conductor 205 is deposited. The conductive film can be deposited by a plating method, a sputtering method, a CVD method, an MBE method, a PLD method, an ALD method, or the like. In this embodiment, for the conductive film that is the upper layer of the conductive film to be the conductor 205, a low-resistance conductive material such as copper is deposited.

Next, CMP (chemical mechanical polishing) treatment is performed to remove part of the upper layer of the conductive film to be the conductor 205 and part of the lower layer of the conductive film to be the conductor 205 to expose the insulator 216. As a result, the conductive film to be the conductor 205 remains only in the opening portion. Thus, the conductor 205 whose top surface is flat can be formed (see FIG. 6). Note that the insulator 216 is partly removed by the CMP treatment in some cases.

Here, a method for forming the conductor 205 which is different from the above is described below.

Next, the conductive film to be the conductor 205 is deposited over the insulator 214. The conductive film to be the conductor 205 can be deposited by a sputtering method, a CVD method, an MBE method, a PLD method, an ALD method, or the like. In addition, the conductive film to be the conductor 205 can be a multilayer film. In this embodiment, tungsten is deposited for the conductive film to be the conductor 205.

Next, the conductive film to be the conductor 205 is processed by a lithography method, so that the conductor 205 is formed.

Note that in the lithography method, first, a resist is exposed to light through a mask. Next, a region exposed to light is removed or left using a developer, so that a resist mask is formed. Then, etching treatment through the resist mask is performed, so that a conductor, a semiconductor, an insulator, or the like can be processed into a desired shape. The resist mask is formed by, for example, exposure of the resist to KrF excimer laser light, ArF excimer laser light, EUV (Extreme Ultraviolet) light, or the like. Alternatively, a liquid immersion technique may be employed in which a gap between a substrate and a projection lens is filled with liquid (e.g., water) in light exposure. Alternatively, an electron beam or an ion beam may be used instead of the light. Note that a mask is unnecessary in the case of using an electron beam or an ion beam. Note that for removal of the resist mask, dry etching treatment such as ashing can be performed, wet etching treatment can be performed, wet etching treatment can be performed after dry etching treatment, or dry etching treatment can be performed after wet etching treatment.

In addition, a hard mask formed of an insulator or a conductor may be used instead of the resist mask. In the case where a hard mask is used, a hard mask with a desired shape can be formed by forming an insulating film or a conductive film to be a hard mask material over the conductive film to be the conductor 205, forming a resist mask thereover, and then etching the hard mask material. The etching of the conductive film to be the conductor 205 may be performed after removal of the resist mask or with the resist mask remaining. In the latter case, the resist mask sometimes disappears during the etching. The hard mask may be removed by etching after the etching of the conductive film to be the conductor 205. Meanwhile, the hard mask is not necessarily removed when the hard mask material does not affect a post-process or can be utilized in the post-process.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency power is applied to one of the parallel plate electrodes. Alternatively, a structure may employed in which different high-frequency powers are applied to one of the parallel plate electrodes. Alternatively, a structure may be employed in which high-frequency powers with the same frequency are applied to the parallel plate electrodes. Alternatively, a structure may be employed in which high-frequency powers with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

Next, an insulating film to be the insulator 216 is deposited over the insulator 214 and the conductor 205. The insulating film to be the insulator 216 can be deposited by a sputtering method, a CVD method, an MBE method, a PLD method, an ALD method, or the like. In this embodiment, for the insulating film to be the insulator 216, silicon oxide is deposited by a CVD method.

Here, the thickness of the insulating film to be the insulator 216 is preferably greater than or equal to the thickness of the conductor 205. For example, when the thickness of the conductor 205 is 1, the thickness of the insulating film to be the insulator 216 is greater than or equal to 1 and less than or equal to 3. In this embodiment, the thickness of the conductor 205 is 150 nm and the thickness of the insulating film to be the insulator 216 is 350 nm.

Figure 4A:
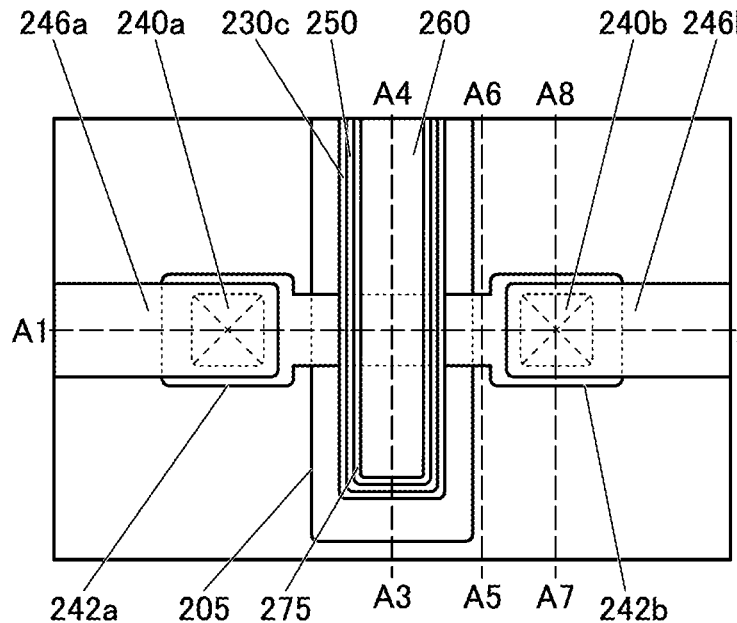
FIG. 4 (A) A top view illustrating a structure of a semiconductor device. (B) and (C) Cross-sectional views illustrating the structure of the semiconductor device.
Figure 4C:
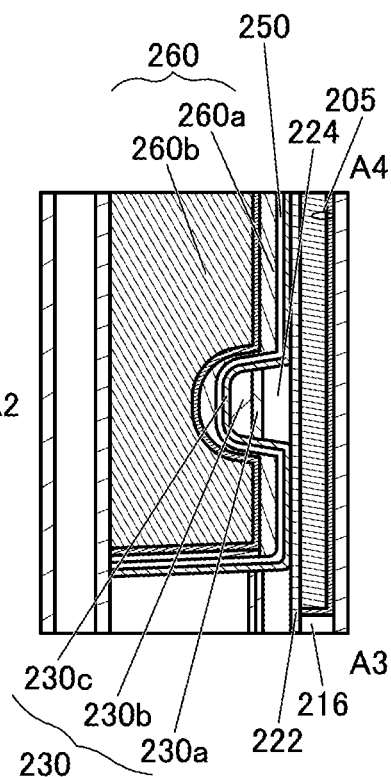
Figure 4B:
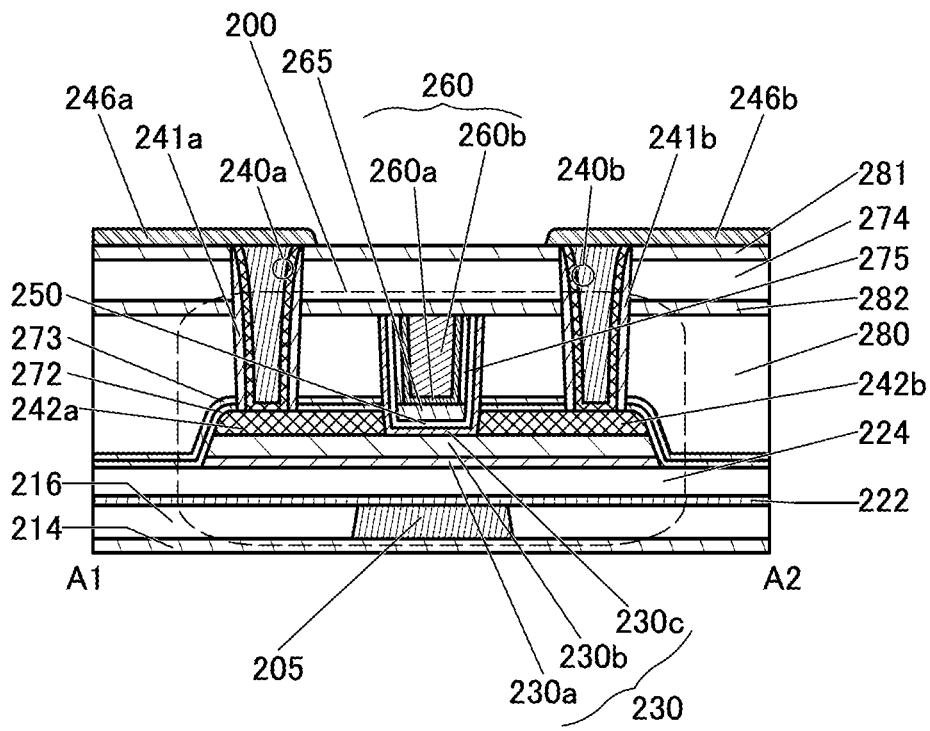

Next, CMP (Chemical Mechanical Polishing) treatment is performed on the insulating film to be the insulator 216, so that part of the insulating film to be the insulator 216 is removed and a surface of the conductor 205 is exposed. Thus, the conductor 205 and the insulator 216 whose top surfaces are flat can be formed. The above is another method of forming the conductor 205, which is different from the above. FIG. 4 illustrates an example of a semiconductor device including the transistor 200 in which the conductor 205 and the insulator 216 are formed in the above manner.

Next, the insulator 222 is deposited over the insulator 216 and the conductor 205. An insulator containing an oxide of one or both of aluminum and hafnium is preferably deposited as the insulator 222. Note that as the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 222 has a barrier property against hydrogen and water, hydrogen and water contained in components provided around the transistor 200 are inhibited from being diffused into the transistor 200 through the insulator 222, and generation of oxygen vacancies in the oxide 230 can be inhibited.

The insulator 222 can be deposited by a sputtering method, a CVD method, an MBE method, a PLD method, an ALD method, or the like.

Then, an insulating film 224A is deposited over the insulator 222. The insulating film 224A can be deposited by a sputtering method, a CVD method, an MBE method, a PLD method, an ALD method, or the like.

Next, heat treatment is preferably performed. The heat treatment can be performed at a temperature higher than or equal to 250° C. and lower than or equal to 650° C., preferably higher than or equal to 300° C. and lower than or equal to 500° C., further preferably higher than or equal to 320° C. and lower than or equal to 450° C. The heat treatment is performed in a nitrogen or inert gas atmosphere, or an atmosphere containing an oxidizing gas at 10 ppm or higher, 1% or higher, or 10% or higher. Alternatively, the heat treatment may be performed under reduced pressure. Alternatively, the heat treatment may be performed in such a manner that heat treatment is performed in a nitrogen or inert gas atmosphere, and then another heat treatment is performed in an atmosphere containing an oxidizing gas at 10 ppm or higher, 1% or higher, or 10% or higher in order to compensate for released oxygen.

In this embodiment, treatment is performed at 400° C. in a nitrogen atmosphere for one hour, and treatment is successively performed at 400° C. in an oxygen atmosphere for one hour. By the heat treatment, impurities such as water and hydrogen contained in the insulating film 224A can be removed, for example.

The above heat treatment may be performed after the insulator 222 is deposited. For the heat treatment, the conditions for the above-described heat treatment can be used.

Here, in order to form an excess-oxygen region in the insulating film 224A, plasma treatment with oxygen may be performed under reduced pressure. For the plasma treatment with oxygen, an apparatus including a power source for generating high-density plasma using microwaves is preferably used, for example. Alternatively, a power source for applying an RF (Radio Frequency) to a substrate side may be included. The use of high-density plasma enables high-density oxygen radicals to be produced, and RF application to the substrate side allows the oxygen radicals generated by the high-density plasma to be efficiently introduced into the insulating film 224A. Alternatively, after plasma treatment with an inert gas is performed using this apparatus, plasma treatment with oxygen may be performed to compensate for released oxygen. Note that impurities such as water and hydrogen contained in the insulating film 224A can be removed by selecting the conditions for the plasma treatment appropriately. In that case, the heat treatment does not need to be performed.

Here, aluminum oxide may be deposited over the insulating film 224A by a sputtering method, for example, and then CMP treatment may be performed on the aluminum oxide until the insulating film 224A is exposed. The CMP treatment can planarize the surface of the insulating film 224A and smooth the surface of the insulating film 224A. When the CMP treatment is performed on the aluminum oxide placed over the insulating film 224A, it is easy to detect the endpoint of the CMP treatment. Part of the insulating film 224A may be polished by the CMP treatment so that the thickness of the insulating film 224A may be reduced; the thickness of the insulating film 224A is adjusted at the time of the deposition. Planarizing and smoothing the surface of the insulating film 224A can sometimes prevent a decrease in the coverage with an oxide deposited later and a decrease in the yield of the semiconductor device. The deposition of aluminum oxide over the insulating film 224A by a sputtering method is preferred because oxygen can be added to the insulating film 224A.

Figure 6A:
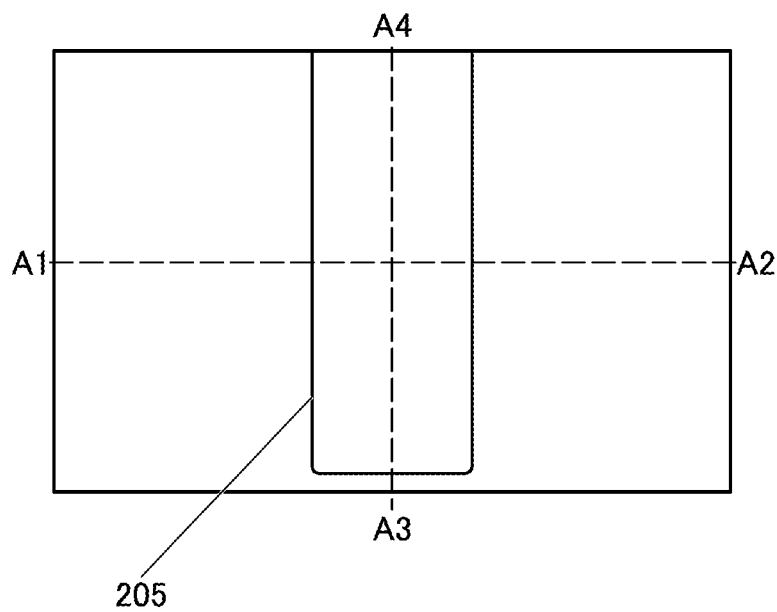
FIG. 6 (A) A top view illustrating a method for manufacturing a semiconductor device. (B) and (C) Cross-sectional views illustrating the method for manufacturing the semiconductor device.
Figure 6C:
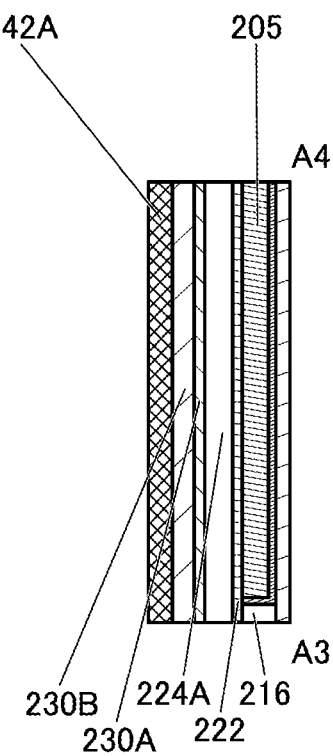
Figure 6B:
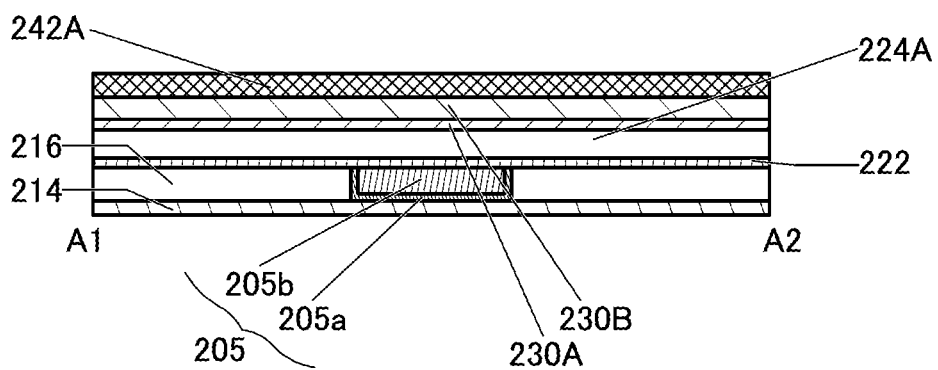

Next, an oxide film 230A to be the oxide 230a and an oxide film 230B to be the oxide 230b are deposited in this order over the insulating film 224A (see FIG. 6). Note that the oxide films are preferably deposited successively without being exposed to an atmospheric environment. By the deposition without exposure to the air, impurities or moisture from the atmospheric environment can be prevented from being attached onto the oxide film 230A and the oxide film 230B, so that the vicinity of the interface between the oxide film 230A and the oxide film 230B can be kept clean.

The oxide film 230A and the oxide film 230B can be deposited by a sputtering method, a CVD method, an MBE method, a PLD method, an ALD method, or the like.

In the case where the oxide film 230A and the oxide film 230B are deposited by a sputtering method, for example, oxygen or a mixed gas of oxygen and a rare gas is used as a sputtering gas. Increasing the proportion of oxygen contained in the sputtering gas can increase the amount of excess oxygen in the deposited oxide films. In the case where the above oxide films are deposited by a sputtering method, the above In-M-Zn oxide target can be used.

In particular, at the time of depositing the oxide film 230A, part of oxygen contained in the sputtering gas is supplied to the insulating film 224A in some cases. Therefore, the proportion of oxygen contained in the sputtering gas for the oxide film 230A is higher than or equal to 700%, preferably higher than or equal to 80%, further preferably 100%.

In the case where the oxide film 230B is formed by a sputtering method, when the proportion of oxygen contained in the sputtering gas is higher than or equal to 1% and lower than or equal to 30%, preferably higher than or equal to 5% and lower than or equal to 20% during the deposition, an oxygen-deficient oxide semiconductor is formed. In a transistor in which an oxygen-deficient oxide semiconductor is used for its channel formation region, comparatively high field-effect mobility can be obtained.

In this embodiment, the oxide film 230A is formed by a sputtering method using a target with In:Ga:Zn=1:1:0.5 [atomic ratio] (2:2:1 [atomic ratio]) or 1:3:4 [atomic ratio]. In addition, the oxide film 230B is formed by a sputtering method using a target with In:Ga:Zn=4:2:4.1 [atomic ratio]. Note that each of the oxide films is formed to have characteristics required for the oxide 230 by selecting the deposition condition and the atomic ratio as appropriate.

Next, heat treatment may be performed. For the heat treatment, the conditions for the above heat treatment can be used. Through the heat treatment, impurities such as water and hydrogen in the oxide film 230A and the oxide film 230B can be removed, for example. In this embodiment, treatment is performed at 400° C. in a nitrogen atmosphere for one hour, and treatment is successively performed at 400° C. in an oxygen atmosphere for one hour.

Next, a conductive film 242A is deposited over an oxide film 232B. The conductive film 242A can be deposited by a sputtering method, a CVD method, an MBE method, a PLD method, an ALD method, or the like (see FIG. 6).

Figure 7A:
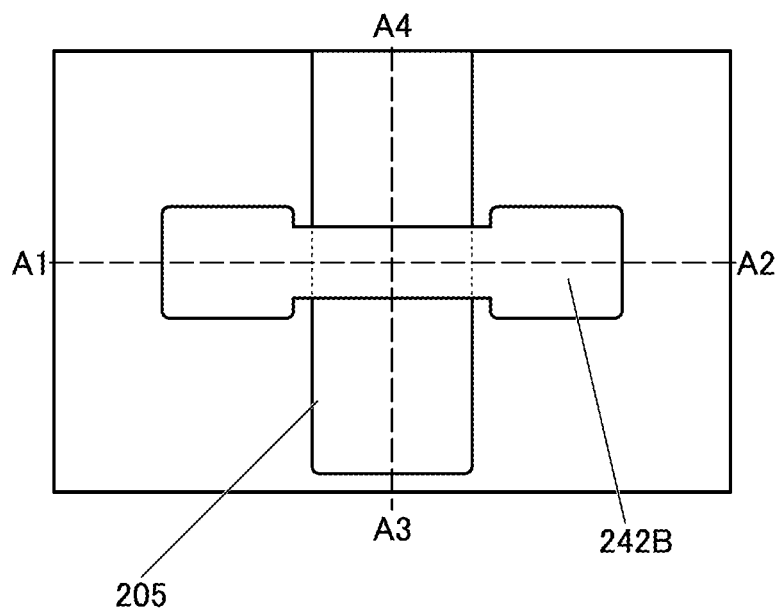
FIG. 7 (A) A top view illustrating a method for manufacturing a semiconductor device. (B) and (C) Cross-sectional views illustrating the method for manufacturing the semiconductor device.
Figure 7C:
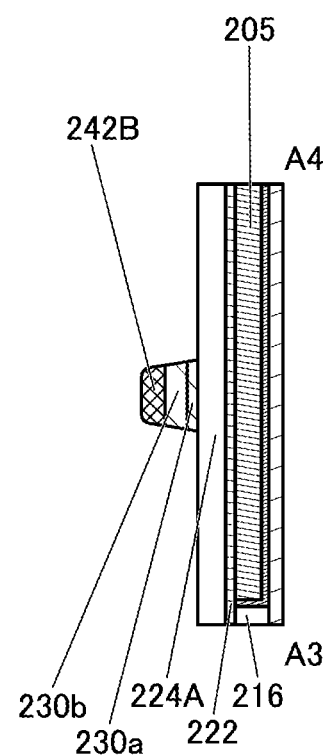
Figure 7B:
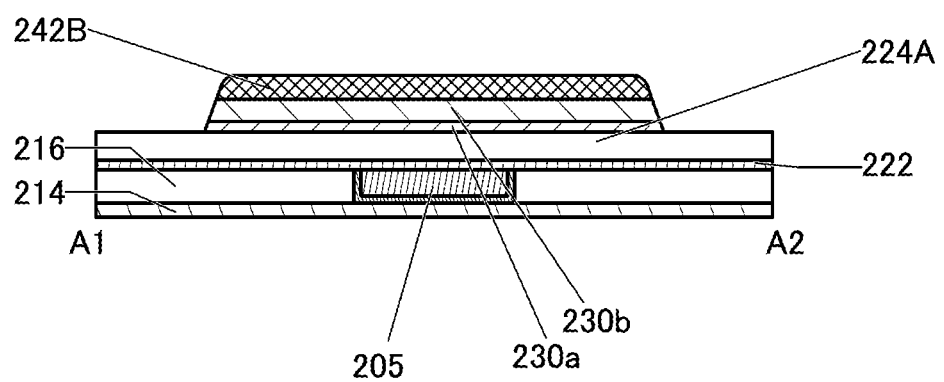
Figure 10A:
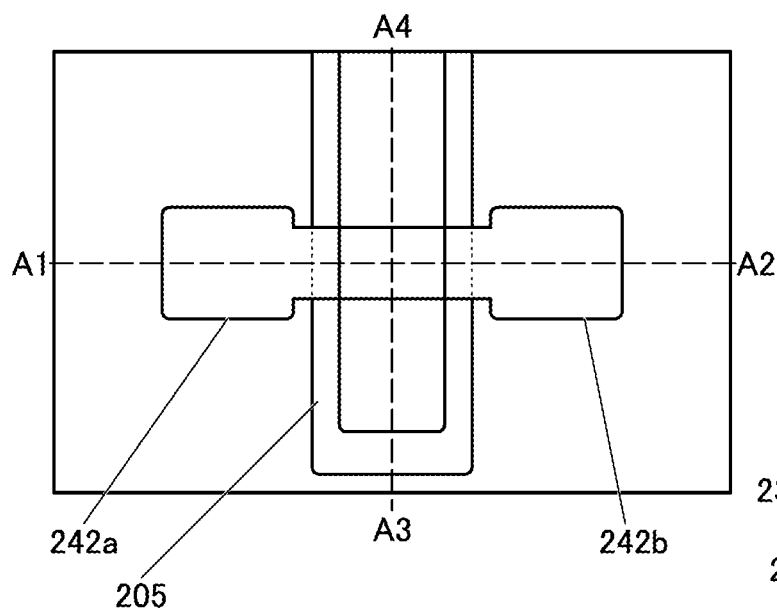
FIG. 10 (A) A top view illustrating a method for manufacturing a semiconductor device. (B) and (C) Cross-sectional views illustrating the method for manufacturing the semiconductor device.
Figure 10C:
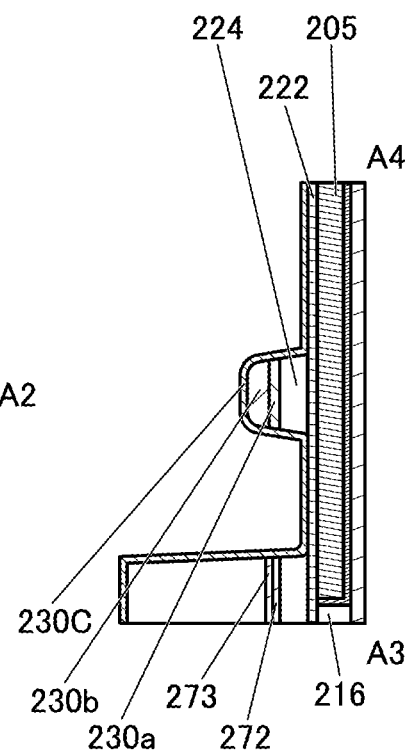
Figure 10B:
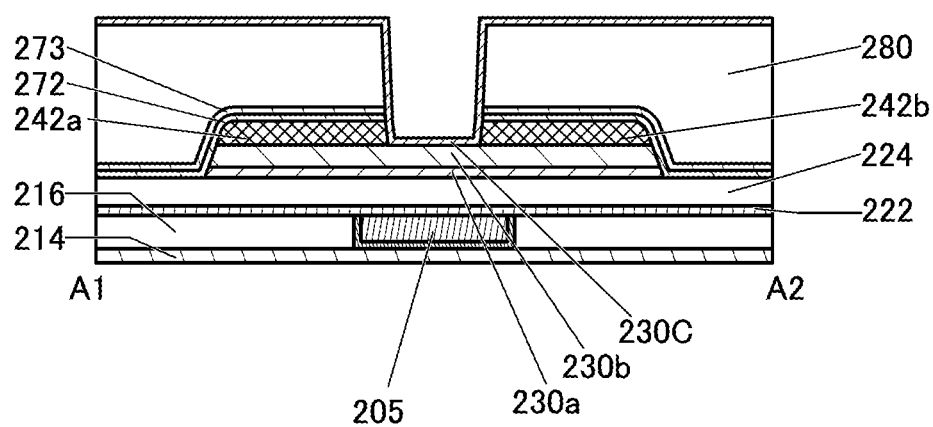
Figure 11A:
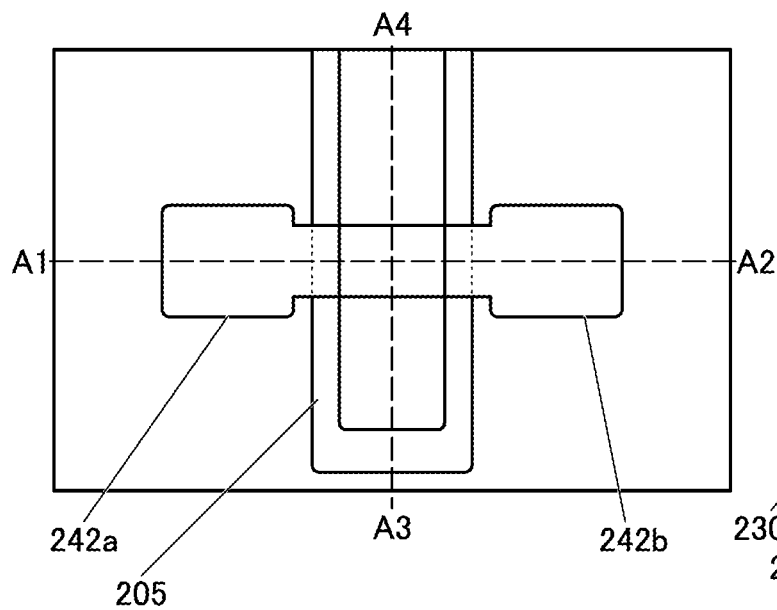
FIG. 11 (A) A top view illustrating a method for manufacturing a semiconductor device. (B) and (C) Cross-sectional views illustrating the method for manufacturing the semiconductor device.
Figure 11C:
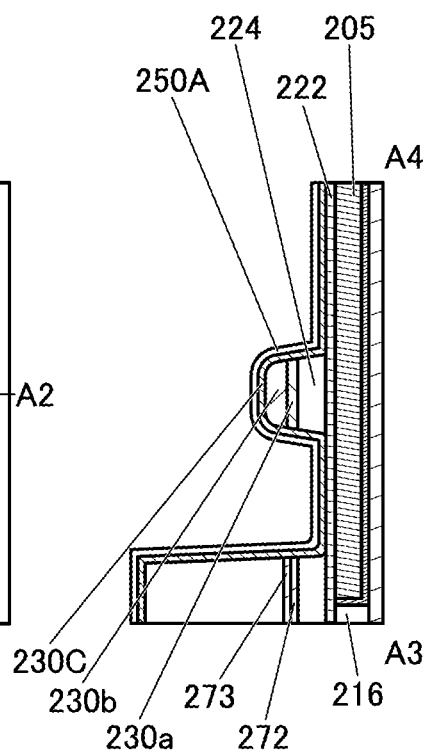
Figure 11B:
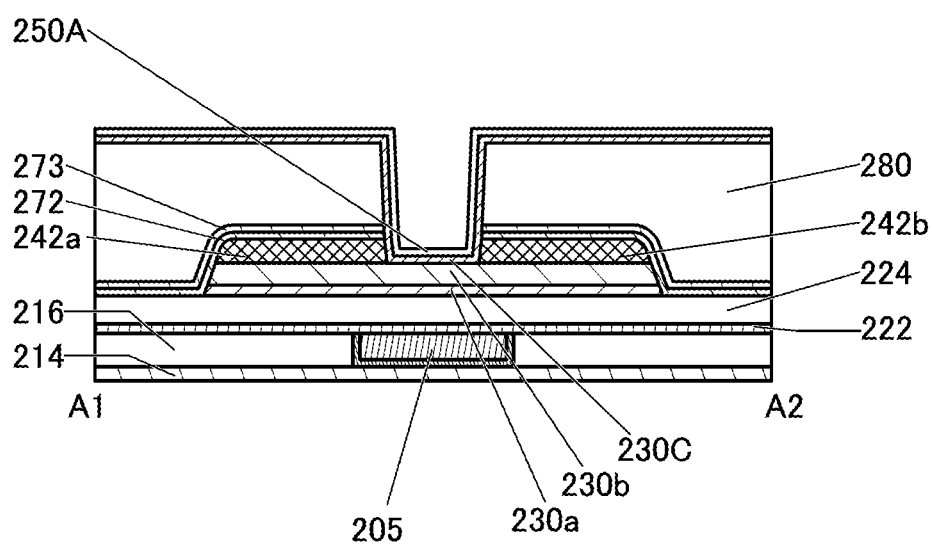
Figure 12A:
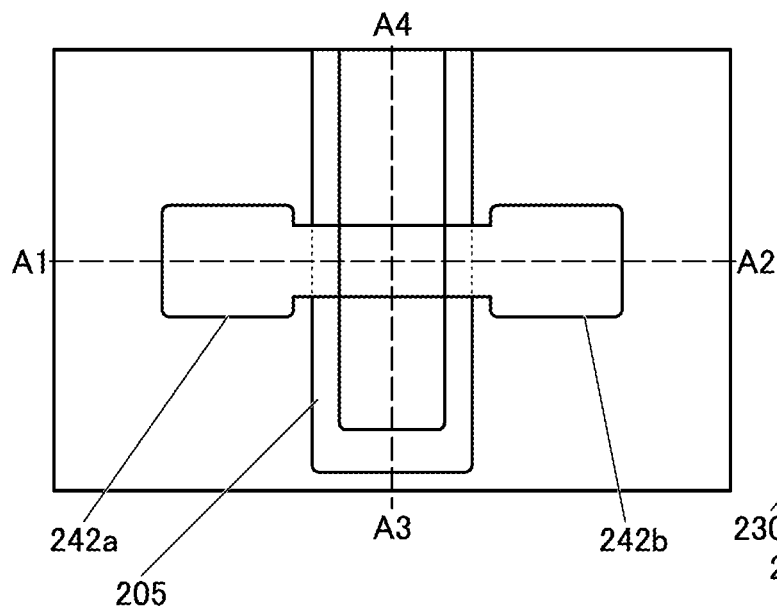
FIG. 12 (A) A top view illustrating a method for manufacturing a semiconductor device. (B) and (C) Cross-sectional views illustrating the method for manufacturing the semiconductor device.
Figure 12C:
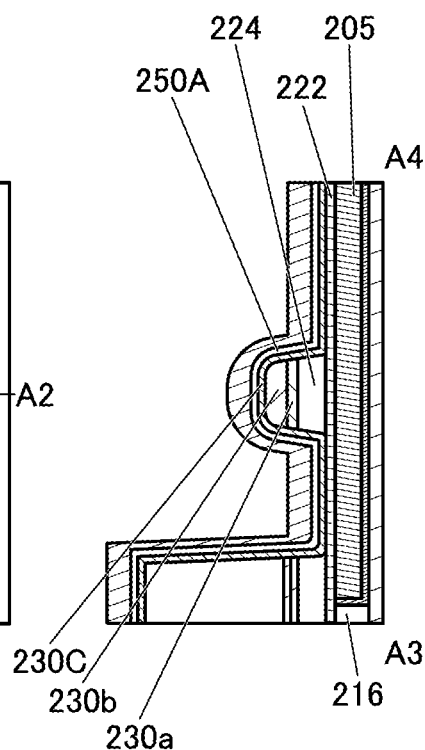
Figure 12B:
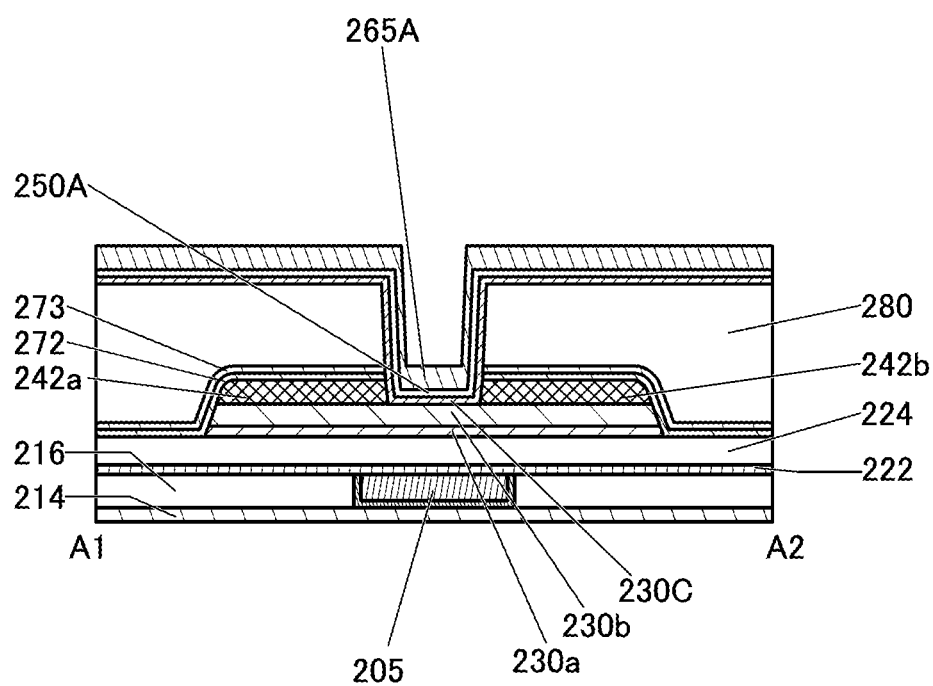

Next, the oxide film 230A, the oxide film 230B, and the conductive film 242A are processed into island shapes to form the oxide 230a, the oxide 230b, and a conductor layer 242B (see FIG. 7). Note that although not illustrated, in this step, the thickness of the region of the insulating film 224A that does not overlap with the oxide 230a is reduced in some cases.

Here, the oxide 230a, the oxide 230b, and the conductor layer 242B are formed to at least partly overlap with the conductor 205. Alternatively, side surfaces of the oxide 230a, the oxide 230b, and the conductor layer 242B may be substantially perpendicular to the top surface of the insulator 222. When the side surfaces of the oxide 230a, the oxide 230b, and the conductor layer 242B are substantially perpendicular to the top surface of the insulator 222, the plurality of transistors 200 can be provided in a smaller area and at a higher density. Alternatively, a structure may be employed in which an angle formed by the oxide 230a, the oxide 230b, and the conductor layer 242B and the top surface of the insulator 222 is a small angle. In that case, the angle formed by the side surfaces of the oxide 230a, the oxide 230b, and the conductor layer 242B and the top surface of the insulator 222 is preferably greater than or equal to 60° and less than 70°. With such a shape, in a later step, the coverage with the insulator 272 and the like can be improved, so that defects such as a void can be reduced.

There is a curved surface between the side surface of the conductor layer 242B and the top surface of the conductor layer 242B. That is, an end portion of the side surface and an end portion of the top surface are preferably curved (hereinafter, also referred to as a rounded shape). The radius of curvature of the curved surface at an end portion of the conductor layer 242B is greater than or equal to 3 nm and less than or equal to 10 nm, preferably greater than or equal to 5 nm and less than or equal to 6 nm, for example. When the end portions are not angular, coverage with films in later deposition steps is improved.

Note that for the processing of the oxide films and the conductive film, a lithography method can be employed. A dry etching method or a wet etching method can be used for the processing. Processing by a dry etching method is suitable for microfabrication.

Next, an insulating film 272A is deposited over the insulating film 224A, the oxide 230a, the oxide 230b, and the conductor layer 242B (see FIG. 8).

The insulating film 272A can be deposited by a sputtering method, a CVD method, an MBE method, a PLD method, an ALD method, or the like. As the insulating film 272A, an insulating film having a function of inhibiting the passage of oxygen is preferably used. In this embodiment, silicon nitride is deposited by a sputtering method.

Then, an insulating film 273A is deposited over the insulating film 272A. The insulating film 273A can be deposited by a sputtering method, a CVD method, an MBE method, a PLD method, an ALD method, or the like. For example, an aluminum oxide film is preferably deposited by a sputtering method. In this embodiment, an aluminum oxide film is deposited by a sputtering method (see FIG. 8).

Next, an insulating film to be the insulator 280 is deposited over the insulating film 273A. The insulating film to be the insulator 280 can be deposited by a sputtering method, a CVD method, an MBE method, a PLD method, an ALD method, or the like. Next, the insulating film to be the insulator 280 is subjected to CMP treatment, so that the insulator 280 having a flat top surface is formed (see FIG. 9).

Then, part of the insulator 280, part of the insulating film 273A, part of the insulating film 272A, part of the conductor layer 242B, and part of the insulating film 224A are processed to form an opening reaching the oxide 230b. The opening is preferably formed to overlap with the conductor 205. The insulator 224, the conductor 242a, the conductor 242b, the insulator 272, and the insulator 273 are formed by the opening (see FIG. 9).

Figure 2A:
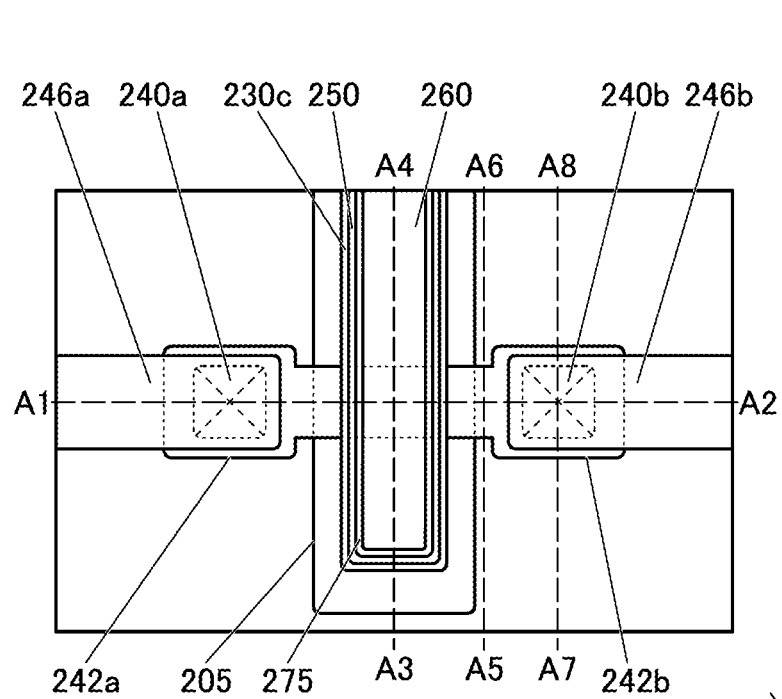
FIG. 2 (A) A top view illustrating a structure of a semiconductor device. (B) and (C) Cross-sectional views illustrating the structure of the semiconductor device.
Figure 2C:
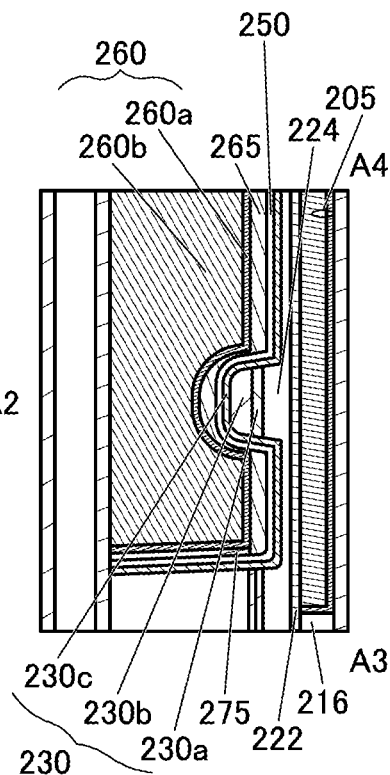
Figure 2B:
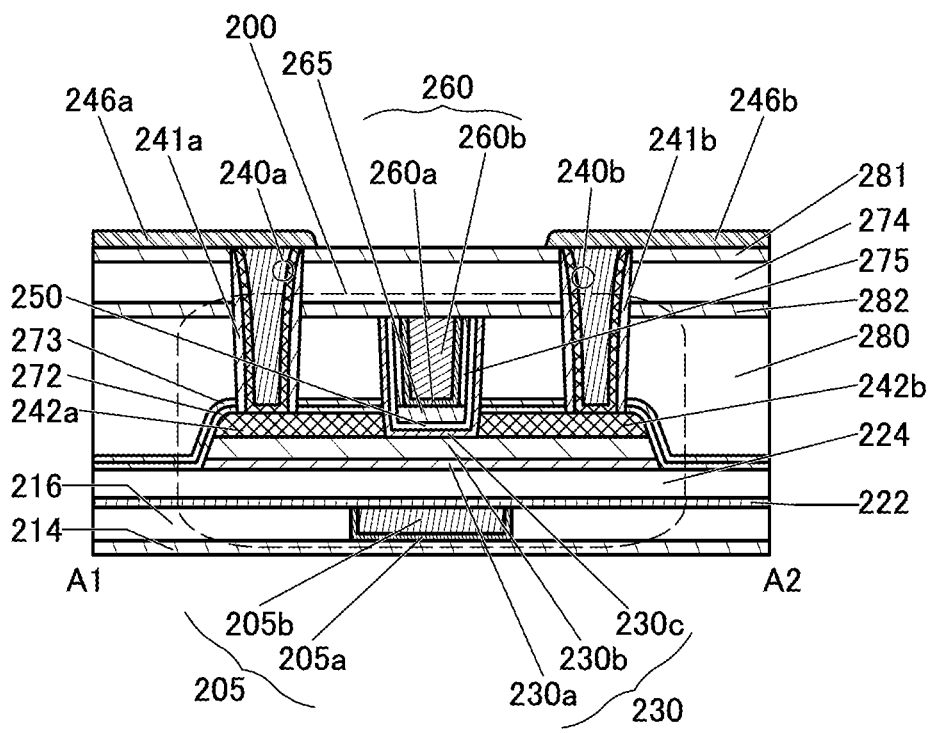

As illustrated in FIG. 9(C), in a region of the insulating film 224A that does not overlap with the oxide 230a, all of the insulating film 224A is removed by the opening, and the insulator 224 is formed so that the surface of the insulator 222 is exposed; however, the present invention is not limited to this. For example, the insulator 224 may be formed while the insulating film 224A is left also in the region of the insulating film 224A that does not overlap with the oxide 230a. At the time, the thickness of the region of the insulating film 224 that does not overlap with the oxide 230a is sometimes smaller than the thickness of the region of the insulator 224 that overlaps with the oxide 230a. FIG. 2 illustrates an example of the transistor 200 that is fabricated in such a manner.

Part of the insulator 280, part of the insulating film 273A, part of the insulating film 272A, part of the conductor layer 242B, and part of the insulating film 224A may be processed under different conditions. For example, part of the insulator 280 may be processed by a dry etching method, part of the insulating film 273A may be processed by a wet etching method, and part of the insulating film 272A, part of the conductor layer 242B, and part of the insulating film 224A may be processed by a dry etching method.

In some cases, treatment such as dry etching performed in the above process causes the attachment or diffusion of impurities due to an etching gas or the like to a surface or an inside of the oxide 230a, the oxide 230b, or the like. Examples of the impurities include fluorine and chlorine.

In order to remove the impurities and the like, cleaning is performed. Examples of a cleaning method include wet cleaning using a cleaning solution or the like, plasma treatment using plasma, and cleaning by heat treatment, and these cleanings may be performed in appropriate combination.

As the wet cleaning, cleaning treatment may be performed using an aqueous solution obtained by diluting an oxalic acid, a phosphoric acid, ammonia water, a hydrofluoric acid, or the like with carbonated water or pure water. Alternatively, ultrasonic cleaning using pure water or carbonated water may be performed.

Next, heat treatment may be performed. Heat treatment is performed under reduced pressure, and an oxide film 230C is successively deposited without exposure to the air (see FIG. 10). The treatment can remove moisture and hydrogen adsorbed onto the surface of the oxide 230b and the like, and further can reduce the moisture concentration and the hydrogen concentration of the oxide 230a and the oxide 230b. The heat treatment is preferably performed at a temperature higher than or equal to 100° C. and lower than or equal to 400° C. In this embodiment, the heat treatment is performed at 200° C.

The oxide film 230C can be formed by a sputtering method, a CVD method, an MBE method, a PLD method, an ALD method, or the like. The oxide film 230C is deposited by a deposition method similar to that for the oxide film 230A or the oxide film 230B depending on characteristics required for the oxide film 230C. In this embodiment, the oxide film 230C is deposited by a sputtering method using a target with In:Ga:Zn=1:3:4 [atomic ratio] or In:Ga:Zn=4:2:4.1 [atomic ratio].

The oxide film 230C may be a stacked-layer film. For example, the oxide film 230C may be deposited by a sputtering method using a target of In:Ga:Zn=4:2:4.1 [atomic ratio] and successively deposited using a target of In:Ga:Zn=1:3:4 [atomic ratio].

In particular, in the deposition of the oxide film 230C, part of oxygen contained in the sputtering gas is sometimes supplied to the oxide 230a and the oxide 230b. Therefore, the proportion of oxygen contained in the sputtering gas for the oxide film 230C is higher than or equal to 70%, preferably higher than or equal to 80%, further preferably 100%.

Next, heat treatment may be performed. Heat treatment is performed under reduced pressure, and an insulating film 250A is successively deposited without exposure to the air (see FIG. 11). The treatment can remove moisture and hydrogen adsorbed onto the surface of the oxide film 230C and the like, and further can reduce the moisture concentration and the hydrogen concentration of the oxide 230a, the oxide 230b, and the oxide film 230C. The heat treatment is preferably performed at a temperature higher than or equal to 100° C. and lower than or equal to 400° C.

The insulating film 250A can be deposited by a sputtering method, a CVD method, an MBE method, a PLD method, an ALD method, or the like. For the insulating film 250A, silicon oxynitride is preferably deposited by a CVD method. Note that the deposition temperature at the time of depositing the insulating film 250A is preferably higher than or equal to 350° C. and lower than 450° C., particularly preferably approximately 400° C. When the insulating film 250A is deposited at 400° C., an insulator having few impurities can be deposited.

Next, a conductive film 265A is deposited. The conductive film 265A can be deposited by a sputtering method, a CVD method, an MBE method, a PLD method, an ALD method, or the like. The conductive film 265A is preferably deposited so that a portion of the conductive film 265A that is parallel to the bottom surface of the insulator 224 has a larger thickness than a portion of the conductive film 265A that is parallel to a side surface of the opening in the insulator 280. For example, the conductive film 265A can be deposited by a low pressure long throw sputtering method, a collimator sputtering method, an ionization sputtering method (including an unbalanced magnetron sputtering method), or the like (see FIG. 12).

Figure 13A:
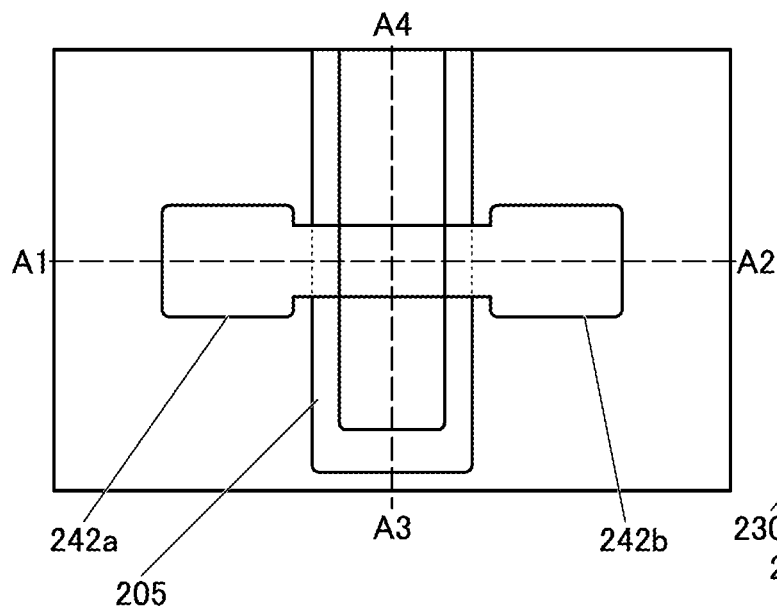
FIG. 13 (A) A top view illustrating a method for manufacturing a semiconductor device. (B) and (C) Cross-sectional views illustrating the method for manufacturing the semiconductor device.
Figure 13C:
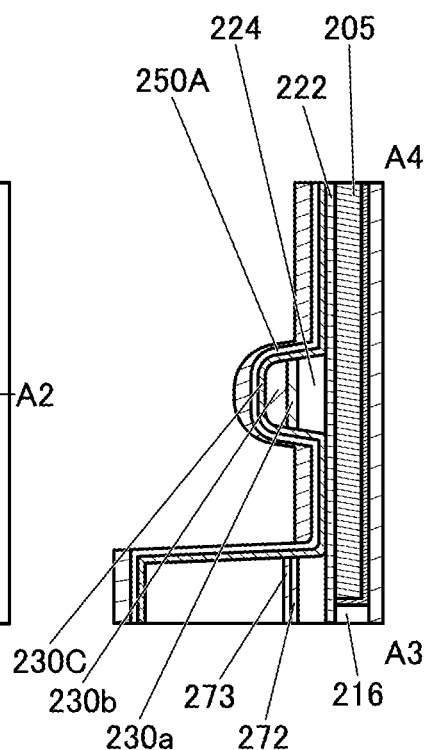
Figure 13B:
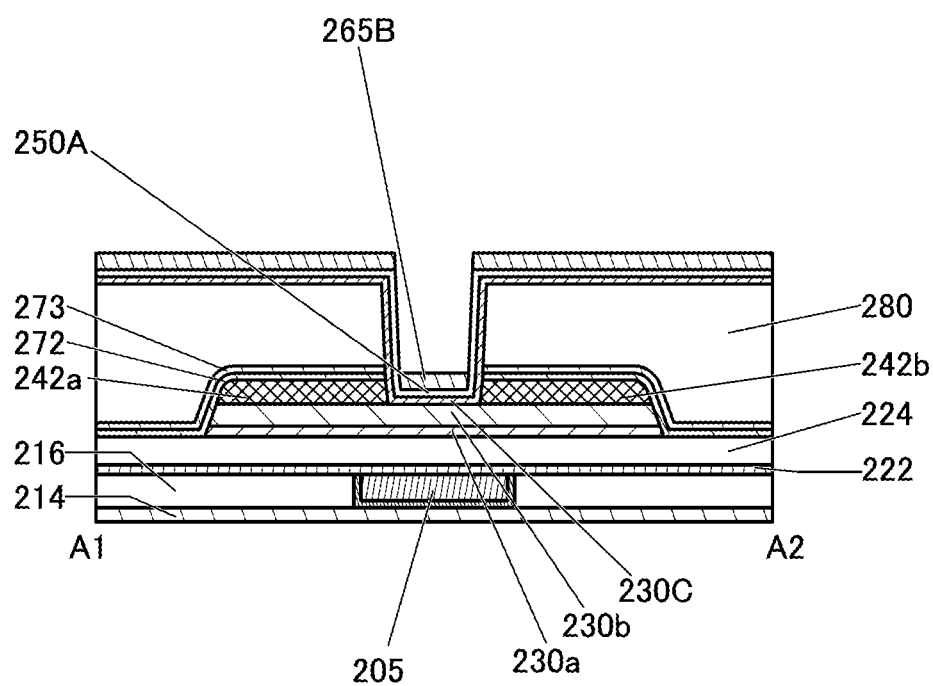
Figure 14A:
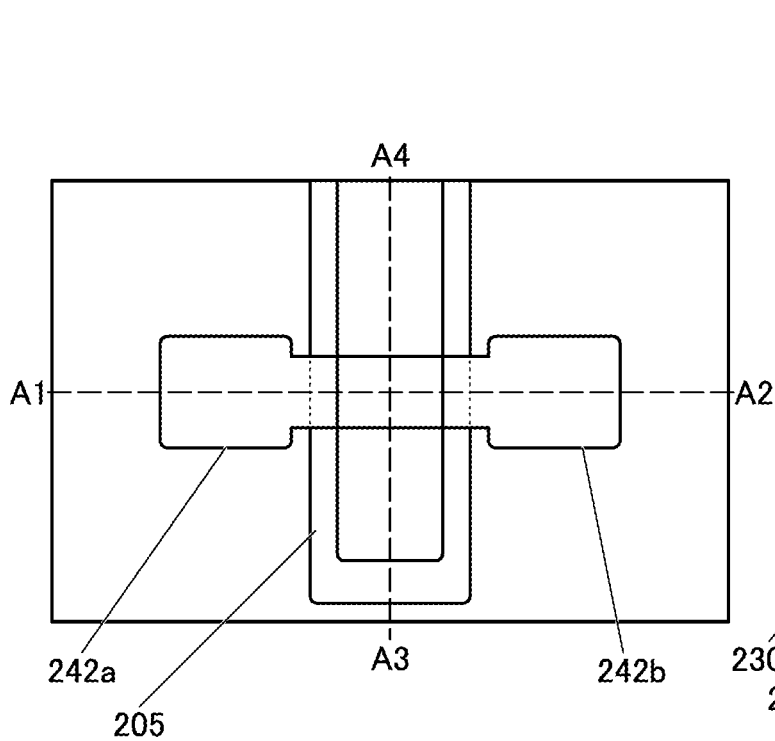
FIG. 14 (A) A top view illustrating a method for manufacturing a semiconductor device. (B) and (C) Cross-sectional views illustrating the method for manufacturing the semiconductor device.
Figure 14C:
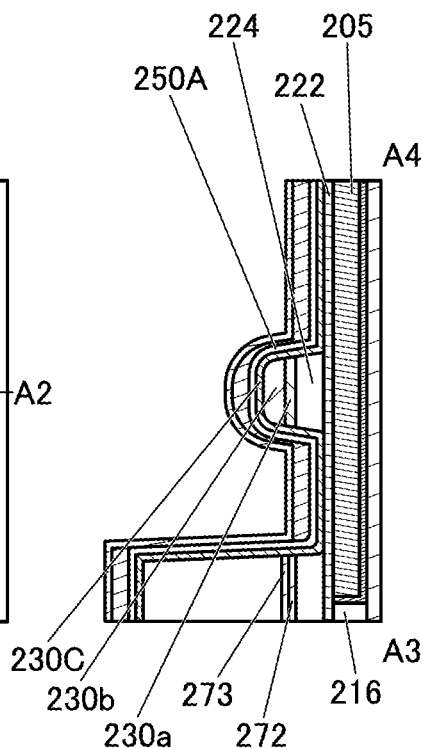
Figure 14B:
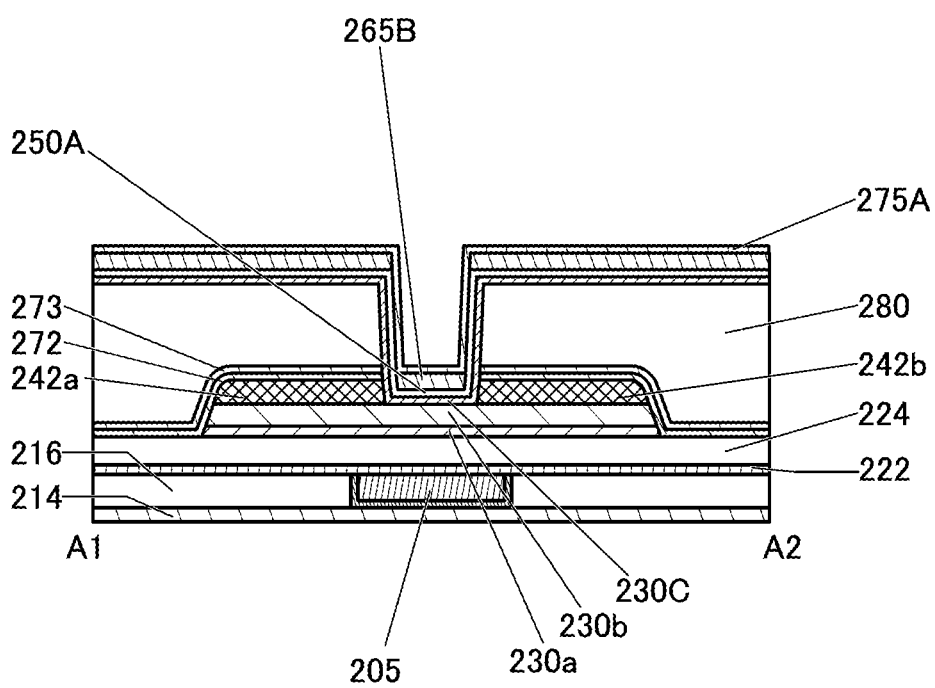

Next, the conductive film 265A is etched isotropically (isotropic etching), so that the portion of the conductive film 265A that is parallel to the side surface of the opening in the insulator 280 is removed and the portion of the conductive film 265A that is parallel to the bottom surface of the insulator 224 is left, so a conductor 265B is formed (see FIG. 13).

Next, an insulating film 275A is formed. The insulating film 275A can be deposited by a sputtering method, a CVD method, an MBE method, a PLD method, an ALD method, or the like. In this embodiment, aluminum oxide is deposited by an ALD method (see FIG. 14).

Figure 15A:
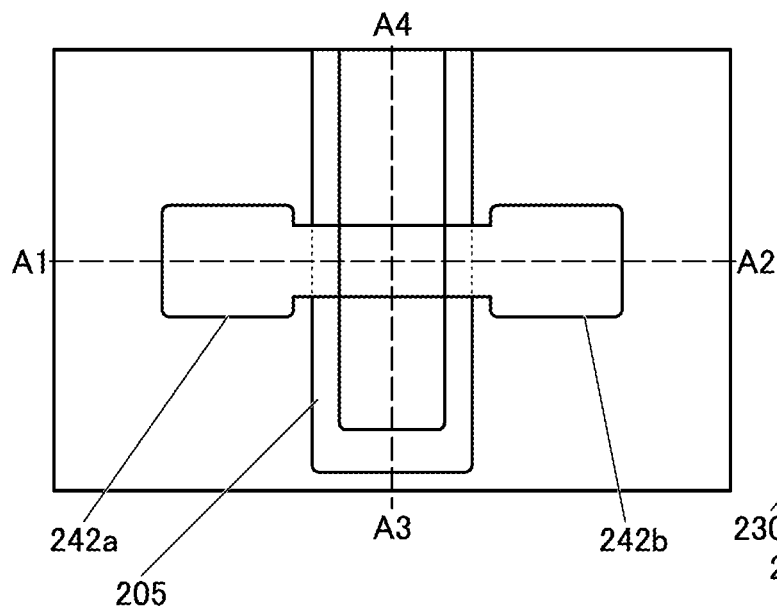
FIG. 15 (A) A top view illustrating a method for manufacturing a semiconductor device. (B) and (C) Cross-sectional views illustrating the method for manufacturing the semiconductor device.
Figure 15C:
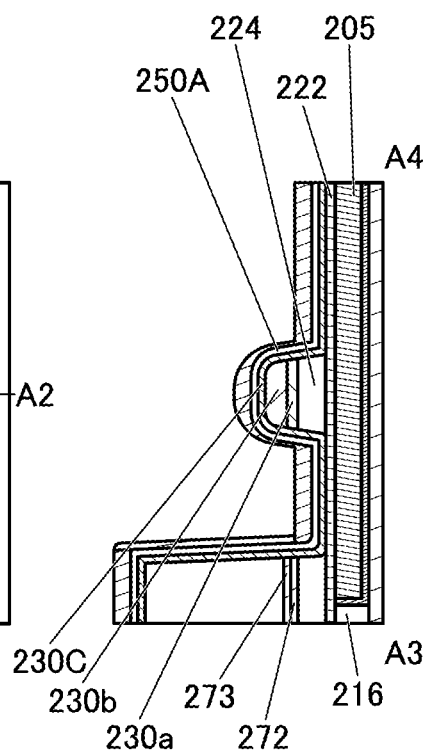
Figure 15B:
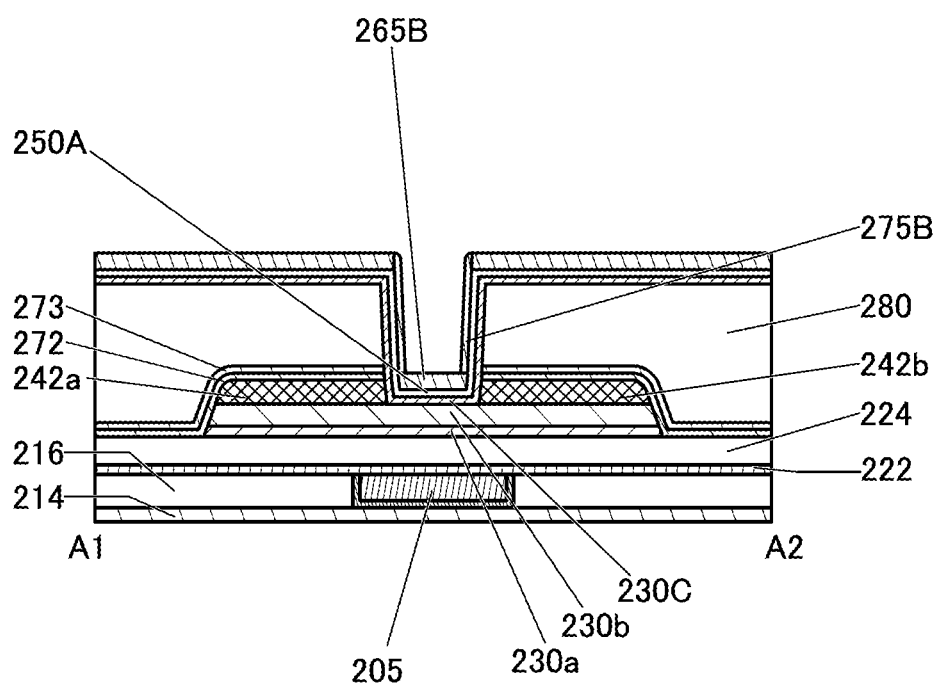
Figure 16A:
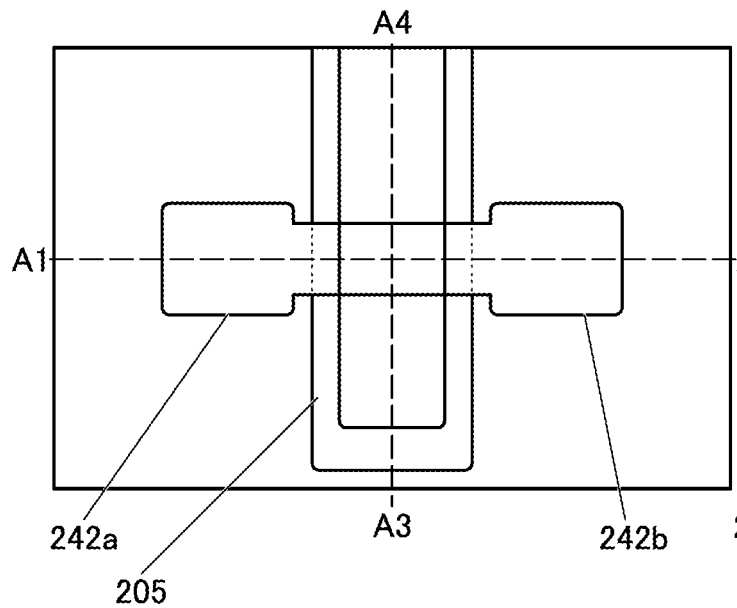
FIG. 16 (A) A top view illustrating a method for manufacturing a semiconductor device. (B) and (C) Cross-sectional views illustrating the method for manufacturing the semiconductor device.
Figure 16C:
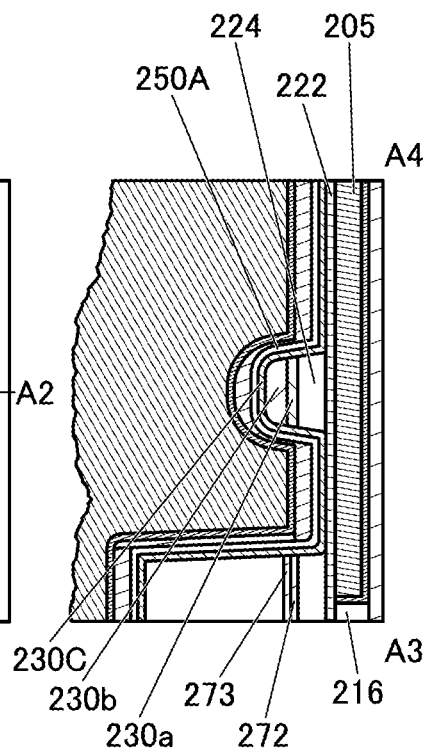
Figure 16B:
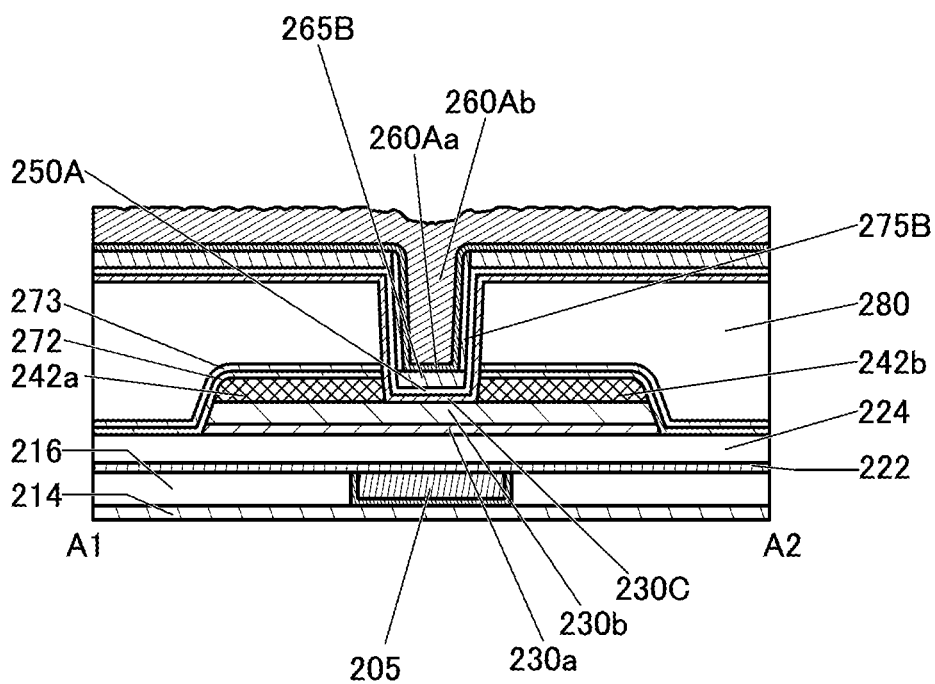

Next, the insulating film 275A is subjected to anisotropic etching, so that the portion of the insulating film 275A that is parallel to the bottom surface of the insulator 224 is removed and the portion of the insulating film 275A that is parallel to the side surface of the opening in the insulator 280 is left, and then an insulator 275B is formed (see FIG. 15).

In the anisotropic etching of the insulating film 275A, the conductor 265B preferably functions as an etching stopper. The conductor 265B functioning as an etching stopper can inhibit damage (physical damage and charging damage) due to the anisotropic etching from being caused to the insulating film 250A, which is preferable. For the anisotropic etching of the insulating film 275A, etching conditions with which the conductor 265B is hardly etched are preferable. Specifically, when the etching rate of the conductor 265B is 1, the etching rate of the insulating film 275A is preferably 5 or more. Further preferably, it is 10 or more.

Next, a conductive film 260Aa and a conductive film 260Ab are deposited. The conductive film 260Aa and the conductive film 260Ab can be deposited by a sputtering method, a CVD method, an MBE method, a PLD method, an ALD method, or the like. A CVD method is preferably used, for example. In this embodiment, the conductive film 260Aa is deposited by an ALD method, and the conductive film 260Ab is deposited by a CVD method (see FIG. 16).

Figure 17A:
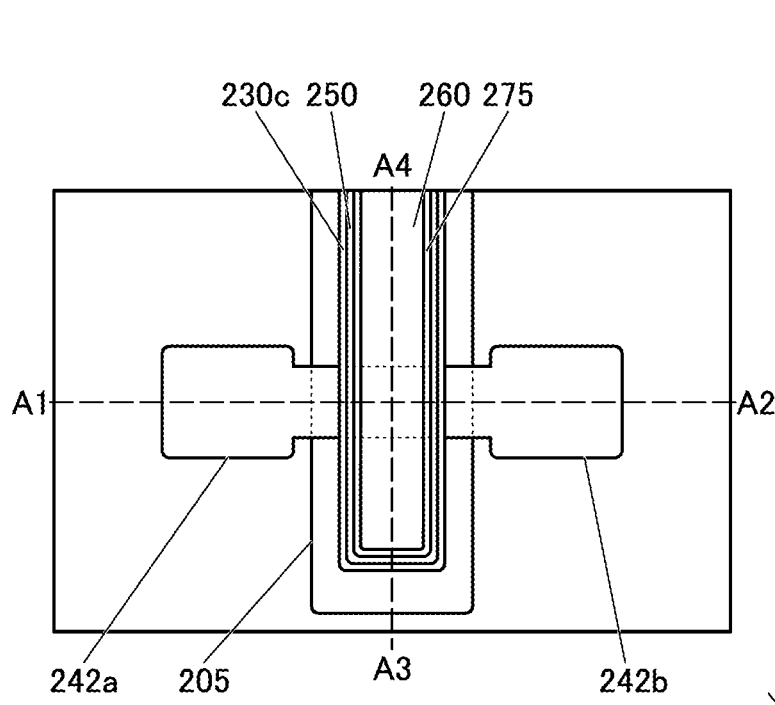
FIG. 17 (A) A top view illustrating a method for manufacturing a semiconductor device. (B) and (C) Cross-sectional views illustrating the method for manufacturing the semiconductor device.
Figure 17C:
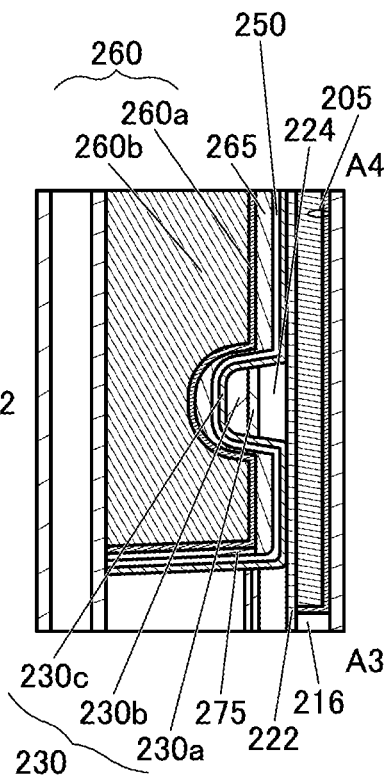
Figure 17B:
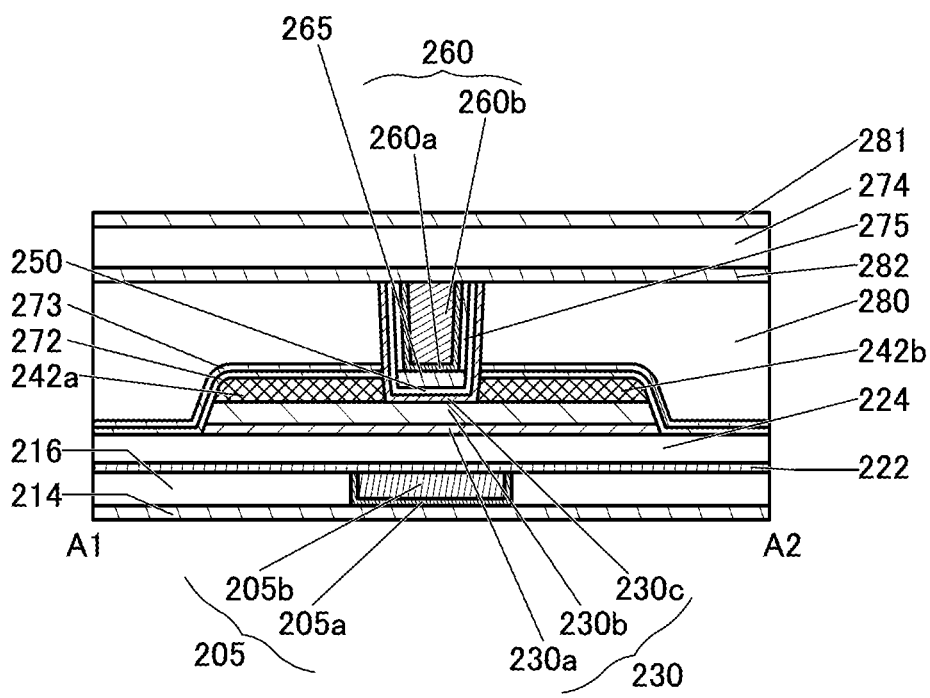

Then, the oxide film 230C, the insulating film 250A, the conductor 265B, the insulator 275B, the conductive film 260Aa, and the conductive film 260Ab are polished by CMP treatment until the insulator 280 is exposed, so that the oxide 230c, the insulator 250, the conductor 265, the insulator 275, and the conductor 260 (the conductor 260a and the conductor 260b) are formed (see FIG. 17).

Next, heat treatment may be performed. In this embodiment, the treatment is performed at 400° C. in a nitrogen atmosphere for one hour. The heat treatment can reduce the moisture concentration and the hydrogen concentration in the insulator 250 and the insulator 280.

Next, the insulator 282 may be formed over the oxide 230c, the insulator 250, the conductor 265, the insulator 275, the conductor 260, and the insulator 280. The insulator 282 can be deposited by a sputtering method, a CVD method, an MBE method, a PLD method, an ALD method, or the like.

An aluminum oxide is preferably deposited as the insulating film to be the insulator 282 by a sputtering method, for example. It is preferable to form the insulator 282 in contact with the top surface of the conductor 260 in this manner because oxygen included in the insulator 280 can be inhibited from being absorbed into the conductor 260 in a later heat treatment (see FIG. 17).

Next, heat treatment may be performed. In this embodiment, the treatment is performed at 400° C. in a nitrogen atmosphere for one hour. By the heat treatment, oxygen added to the insulator 280 by the deposition of the insulator 282 can be injected into the oxide 230a and the oxide 230b through the oxide 230c.

Next, the insulator 274 may be deposited over the insulator 282. The insulator 274 can be deposited by a sputtering method, a CVD method, an MBE method, a PLD method, an ALD method, or the like (see FIG. 17).

Next, the insulator 281 may be deposited over the insulator 274 (see FIG. 17). The insulator 281 can be formed by a sputtering method, a CVD method, an MBE method, a PLD method, an ALD method, or the like. Silicon nitride is preferably deposited as the insulator 281 by a sputtering method, for example.

Next, openings reaching the conductor 242a and the conductor 242b are formed in the insulator 272, the insulator 273, the insulator 280, the insulator 282, the insulator 274, and the insulator 281. The openings are formed by a lithography method.

Next, an insulating film to be the insulator 241 is deposited and the insulating film is subjected to anisotropic etching, so that the insulator 241 is formed. The insulating film can be formed by a sputtering method, a CVD method, an MBE method, a PLD method, an ALD method, or the like. As the insulating film to be the insulator 241, an insulating film having a function of inhibiting the passage of oxygen is preferably used. For example, aluminum oxide is preferably deposited by an ALD method. For the anisotropic etching, a dry etching method or the like may be employed, for example. When the side portions of the openings have such a structure, passage of oxygen from the outside can be inhibited and oxidation of the conductor 240a and the conductor 240b to be formed next can be prevented. Furthermore, impurities such as water and hydrogen can be prevented from being diffused from the conductor 240a and the conductor 240b to the outside.

Next, a conductive film to be the conductor 240a and the conductor 240b is deposited. The conductive film to be the conductor 240a and the conductor 240b desirably has a stacked-layer structure which includes a conductor having a function of inhibiting passage of impurities such as water and hydrogen. For example, a stack of tantalum nitride, titanium nitride, or the like and tungsten, molybdenum, copper, or the like can be employed. The conductive film to be the conductor 240 can be formed by a sputtering method, a CVD method, an MBE method, a PLD method, an ALD method, or the like.

Next, CMP treatment is performed to remove part of the conductive film to be the conductor 240a and the conductor 240b, so that the insulator 281 is exposed. As a result, the conductive film remains only in the openings, so that the conductor 240a and the conductor 240b having planar top surfaces can be formed (see FIG. 1). Note that the insulator 281 is partly removed by the CMP treatment in some cases.

A method for manufacturing the semiconductor device illustrated in FIG. 3 is described below. Next, openings reaching the conductor 242a and the conductor 242b are formed in the insulator 272, the insulator 273, the insulator 280, the insulator 282, the insulator 274, and the insulator 281.

Next, the conductive film to be the conductor 244 (the conductor 244a and the conductor 244b) is deposited. The conductive film to be the conductor 244 can be formed by a sputtering method, a CVD method, an MBE method, a PLD method, an ALD method, or the like. The conductive film to be the conductor 244 is preferably deposited so that a portion of the conductive film to be the conductor 244 that is parallel to the bottom surface of the insulator 224 has a larger thickness than a portion of the conductive film to be the conductor 244 that is parallel to a side surface of the opening. For example, the conductive film to be the conductor 244 can be deposited by a low pressure long throw sputtering method, a collimator sputtering method, an ionization sputtering method (including an unbalanced magnetron sputtering method), or the like.

Next, the conductive film to be the conductor 244 is etched isotropically (isotropic etching), so that the portion of the conductive film to be the conductor 244 that is parallel to the side surface of the opening is removed and the portion of the conductive film to be the conductor 244 that is parallel to the bottom surface of the insulator 224 is left, so the conductor 244 is formed.

Next, an insulating film to be the insulator 241 (the insulator 241a and the insulator 241b) is deposited. The insulating film to be the insulator 241 can be deposited by a sputtering method, a CVD method, an MBE method, a PLD method, an ALD method, or the like. In this embodiment, aluminum oxide is deposited by an ALD method.

Next, the insulating film to be the insulator 241 is subjected to anisotropic etching, so that the portion of the insulating film to be the insulator 241 that is parallel to the bottom surface of the insulator 224 is removed and the portion of the insulating film to be the insulator 241 that is parallel to the side surface of the opening is left, and then the insulator 241 is formed.

In the anisotropic etching of the insulating film to be the insulator 241, the conductor 244 preferably functions as an etching stopper. The conductor 244 functioning as an etching stopper can inhibit damage (physical damage and charging damage) due to the anisotropic etching from being caused to the conductor 242, which is preferable. For the anisotropic etching of the insulating film to be the insulator 241, etching conditions with which the conductor 244 is hardly etched are preferable. Specifically, when the etching rate of the conductor 244 is 1, the etching rate of the insulating film to be the insulator 241 is preferably 5 or more. Further preferably, it is 10 or more.

Next, a conductive film to be the conductor 240a and the conductor 240b is deposited. The conductive film to be the conductor 240a and the conductor 240b desirably has a stacked-layer structure which includes a conductor having a function of inhibiting passage of impurities such as water and hydrogen. For example, a stack of tantalum nitride, titanium nitride, or the like and tungsten, molybdenum, copper, or the like can be employed. The conductive film to be the conductor 240 can be formed by a sputtering method, a CVD method, an MBE method, a PLD method, an ALD method, or the like.

Next, CMP treatment is performed to remove part of the conductive film to be the conductor 240a and the conductor 240b, so that the insulator 281 is exposed. As a result, the conductive film remains only in the openings, so that the conductor 240a and the conductor 240b having flat top surfaces can be formed (see FIG. 3). Note that the insulator 281 is partly removed by the CMP treatment in some cases. The above is the method of manufacturing the openings of the semiconductor device illustrated in FIG. 3.

Next, a conductive film to be the conductor 246 is formed over the insulator 281 and the conductor 240. The conductive film to be the conductor 246 can be deposited by a sputtering method, a CVD method, an MBE method, a PLD method, an ALD method, or the like.

Next, the conductive film to be the conductor 246 is processed by a lithography method to form the conductor 246a in contact with the top surface of the conductor 240a and the conductor 246b in contact with the top surface of the conductor 240b (see FIG. 1).

Through the above process, the semiconductor device including the transistor 200 illustrated in FIG. 1 can be manufactured. As illustrated in FIG. 6 to FIG. 17, with the use of the method for manufacturing the semiconductor device described in this embodiment, the transistor 200 can be fabricated.

With one embodiment of the present invention, a semiconductor device with a high on-state current can be provided. Alternatively, according to one embodiment of the present invention, a semiconductor device with excellent frequency characteristics can be provided. Alternatively, according to one embodiment of the present invention, a highly reliable semiconductor device can be provided. Alternatively, according to one embodiment of the present invention, a semiconductor device that can be miniaturized or highly integrated can be provided. Alternatively, according to one embodiment of the present invention, a semiconductor device with excellent electrical characteristics can be provided. Alternatively, according to one embodiment of the present invention, a semiconductor device with low off-state current can be provided. Alternatively, according to one embodiment of the present invention, a semiconductor device with reduced power consumption can be provided. Alternatively, according to one embodiment of the present invention, a semiconductor device with high productivity can be provided.

<Modification Example of Semiconductor Device>

Examples of a semiconductor device including the transistor 200 of one embodiment of the present invention which are different from the semiconductor device described in <Structure example of semiconductor device> above are described below with reference to FIG. 19 to FIG. 20.

Figure 19A:
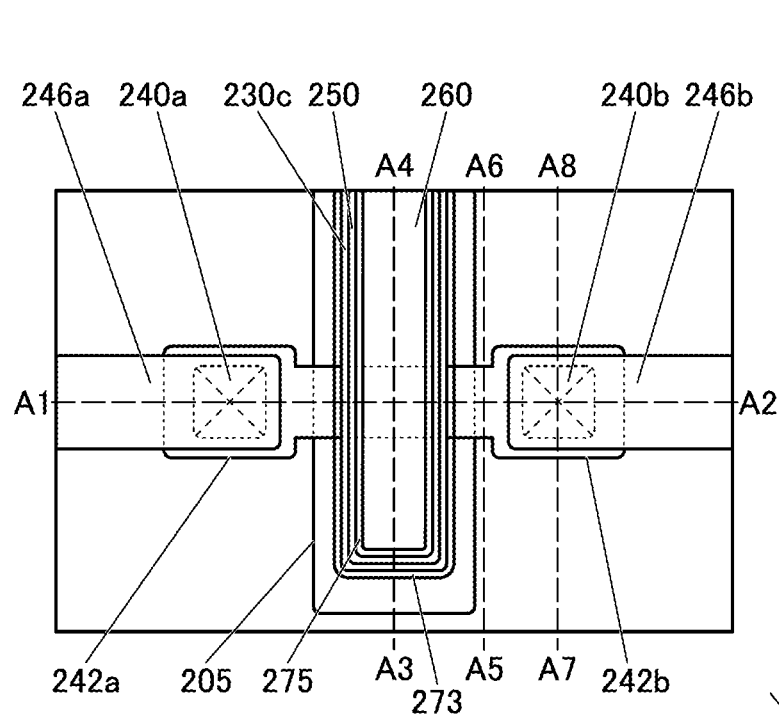
FIG. 19 (A) A top view illustrating a structure of a semiconductor device. (B) and (C) Cross-sectional views illustrating the structure of the semiconductor device.
Figure 19C:
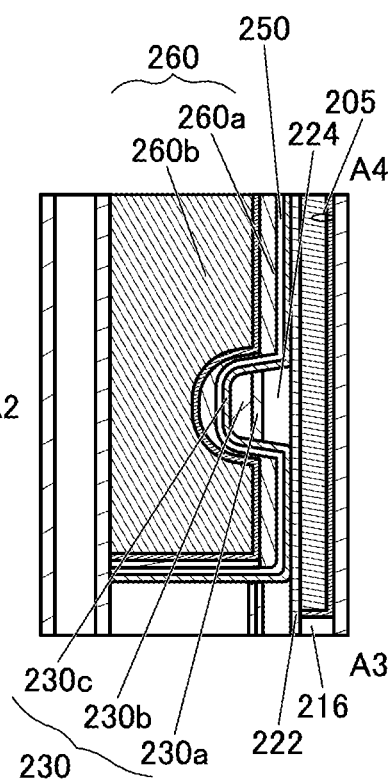
Figure 19B:
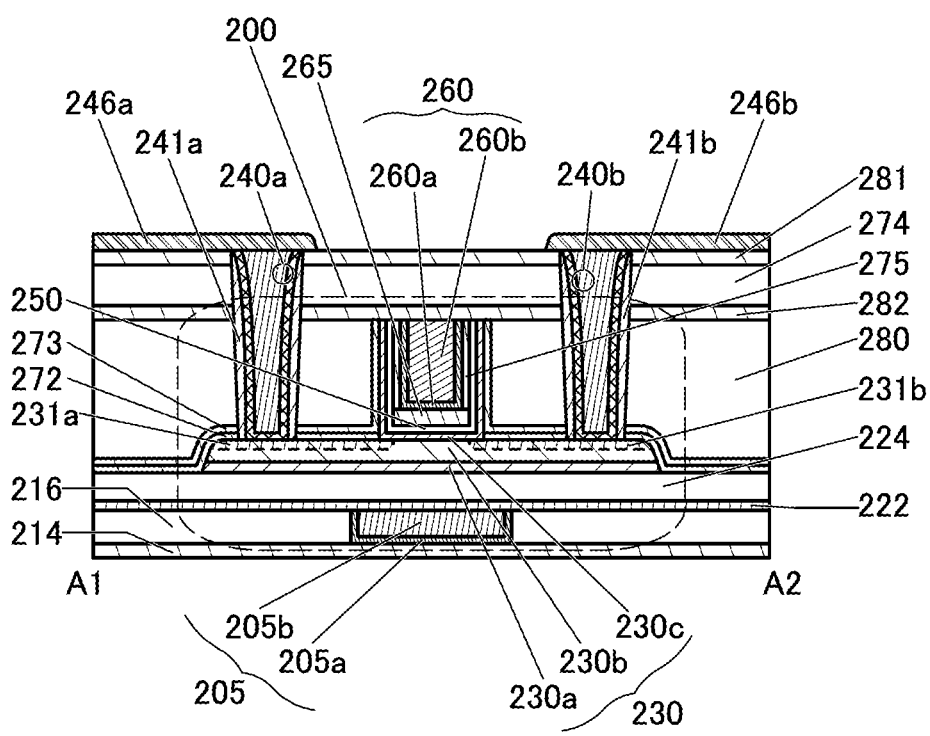

FIG. 19(A) is a top view of a semiconductor device including the transistor 200. Here, FIG. 19(B) is a cross-sectional view of a portion indicated by a dashed-dotted line A1-A2 in FIG. 19(A), and is a cross-sectional view in the channel length direction of the transistor 200. FIG. 19(C) is a cross-sectional view of a portion indicated by a dashed-dotted line A3-A4 in FIG. 19(A), and is also a cross-sectional view in the channel width direction of the transistor 200. For clarity of the drawing, some components are not illustrated in the top view of FIG. 19(A).

Note that in the semiconductor devices shown in FIG. 19 and FIG. 20, structures having the same functions as the structures in the semiconductor device described in <Structure example 1 of semiconductor device> (see FIG. 1) are denoted by the same reference numerals.

A structure of the transistor 200 is described with reference to FIG. 19 below. Note that in this section, the materials described in detail in <Structure example 1 of semiconductor device> can be used as the constituent materials for the transistor 200.

The transistor 200 illustrated in FIG. 19 is different from the transistor 200 illustrated in FIG. 1 in that the conductor 242 is not provided. In the transistor 200 illustrated in FIG. 19, a region 231 (a region 231a and a region 231b) may be formed by adding as a dopant an element that can increase the carrier density of the oxide 230 and reduce the resistance thereof.

The region 231 (the region 231a and the region 231b) is a region whose resistance is reduced by addition of the above element to the oxide 230b. The region 231 can be formed using a dummy gate, for example.

Specifically, an insulating film to be the insulator 272 is deposited over the insulator 224 and the oxide 230b, a dummy gate is provided over the insulating film to be the insulator 272, the dummy gate is used as a mask, and an element with which the resistance of the above oxide 230b is lowered is added. That is, the element is added to a region of the oxide 230b that does not overlap with the dummy gate, so that the region 231 is formed. For the addition of the element, an ion implantation method by which an ionized source gas is subjected to mass separation and then added, an ion doping method by which an ionized source gas is added without mass separation, a plasma immersion ion implantation method, or the like can be used.

As the element that reduces the resistance of the oxide 230b, boron or phosphorus is typically used. Moreover, hydrogen, carbon, nitrogen, fluorine, sulfur, chlorine, titanium, a rare gas element, or the like may be used. Typical examples of the rare gas element are helium, neon, argon, krypton, and xenon. The concentration of the element is measured by secondary ion mass spectrometry (SIMS) or the like.

Boron and phosphorus are particularly preferable because an apparatus in a manufacturing line for amorphous silicon or low-temperature polysilicon can be used. Since the existing facility can be used, capital investment can be reduced.

Then, an insulating film to be the insulator 273 may be deposited over the oxide 230b, the insulating film to be the insulator 272, and the dummy gate.

Next, after an insulating film to be the insulator 280 is provided over the insulating film to be the insulator 273, the insulating film to be the insulator 280 is subjected to CMP (Chemical Mechanical Polishing) treatment, whereby part of the insulating film to be the insulator 280 is removed, so that the insulator 280 is formed and the dummy gate is exposed. Then, when the dummy gate is removed, part of the insulating film to be the insulator 272 in contact with the dummy gate is also removed, so that the insulator 272 is formed. Thus, insulator 273 is exposed at the side surface of the opening provided in the insulator 280, and the region 231 provided in the oxide 230b is partly exposed at the bottom surface of the opening.

For the following steps, the above-described method of manufacturing a semiconductor device can be referred to. Through the above process, the transistor illustrated in FIG. 19 can be formed. The semiconductor device illustrated in FIG. 1 can be referred to for the other structures and the effects of the semiconductor devices.

Figure 20A:
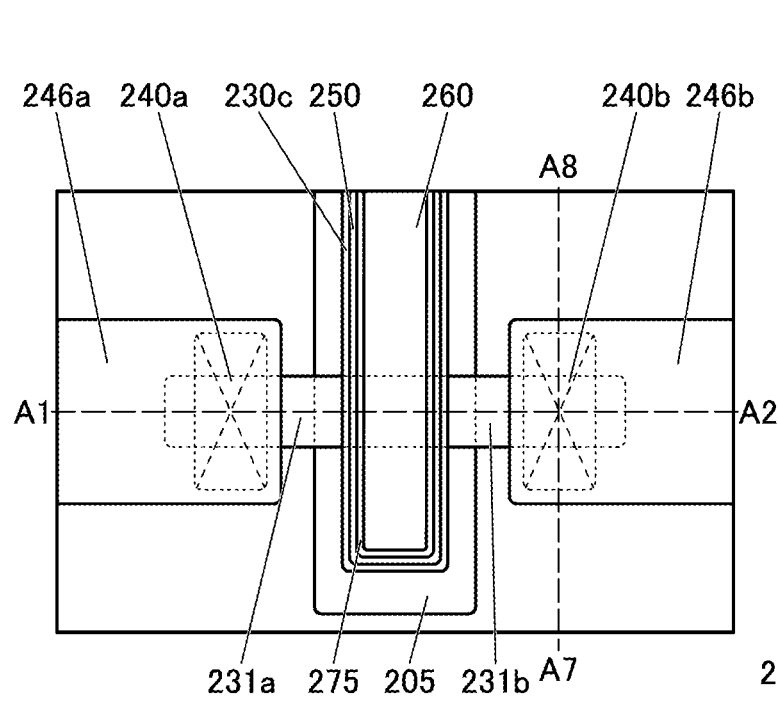
FIG. 20 (A) A top view illustrating a structure of a semiconductor device. (B) and (C) Cross-sectional views illustrating the structure of the semiconductor device.
Figure 20C:
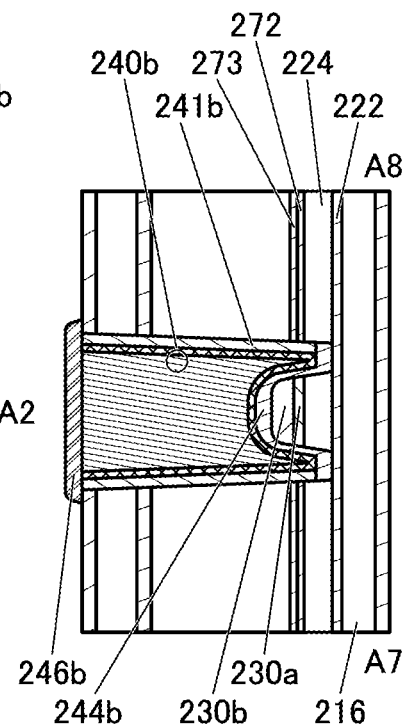
Figure 20B:
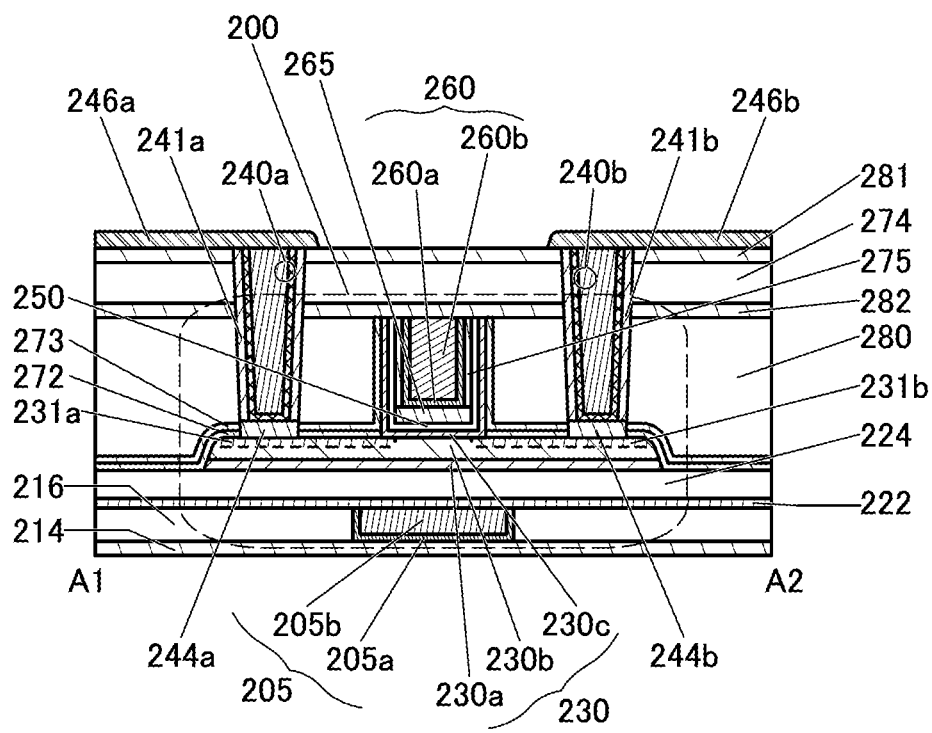

FIG. 20(A) is the top view of the semiconductor device including the transistor 200. Moreover, FIG. 20(B) is a cross-sectional view of a portion indicated by a dashed-dotted line A1-A2 in FIG. 20(A), and is also a cross-sectional view of the transistor 200 in a channel length direction. FIG. 20(C) is a cross-sectional view of a portion indicated by a dashed-dotted line A7-A8 in FIG. 20(A), which corresponds to a cross-sectional view in the channel width direction of the conductor 240b electrically connected to the transistor 200 and functioning as a plug. For clarity of the drawing, some components are not illustrated in the top view of FIG. 20(A).

The semiconductor device illustrated in FIG. 20 differs from the semiconductor device illustrated in FIG. 19 in including the conductor 244 (the conductor 244a and the conductor 244b) that is electrically connected to the transistor 200 and is in contact with the bottom portion of the conductor 240 (the conductor 240a and the conductor 240b) that functions as a plug.

As illustrated in FIG. 20(B) and FIG. 20(C), the conductor 244 is placed on the bottom portions of the openings provided in the insulator 224, the insulator 272, the insulator 273, the insulator 280, the insulator 282, the insulator 274, and the insulator 281.

The insulator 241 (the insulator 241a and the insulator 241b) is provided over the conductor 244 to be in contact with side portions of the openings, the first conductor of the conductor 240 is provided in contact with the side surfaces, and the second conductor of the conductor 240 is provided on the inner side.

As illustrated in FIG. 20(C), the size of the opening provided in the insulator 224, the insulator 272, the insulator 273, the insulator 280, the insulator 282, the insulator 274, and the insulator 281 is preferably larger than the width of each of the oxide 230a and the oxide 230b in the channel width direction. That is, the top surface of the oxide 230b, the side surface of the oxide 230b, and the side surface of the oxide 230a are exposed in the bottom portion of the opening. Thus, the conductor 244 is in contact with the top surface of the oxide 230b, the side surface of the oxide 230b, and the side surface of the oxide 230a, and thus contact resistance can be reduced. The semiconductor device illustrated in FIG. 19 can be referred to for the other structures and the effects.

As described above, the components, structures, methods, and the like described in this embodiment can be combined with any of the components, structures, methods, and the like described in the other embodiments as appropriate.

Embodiment 2

Figure 21:
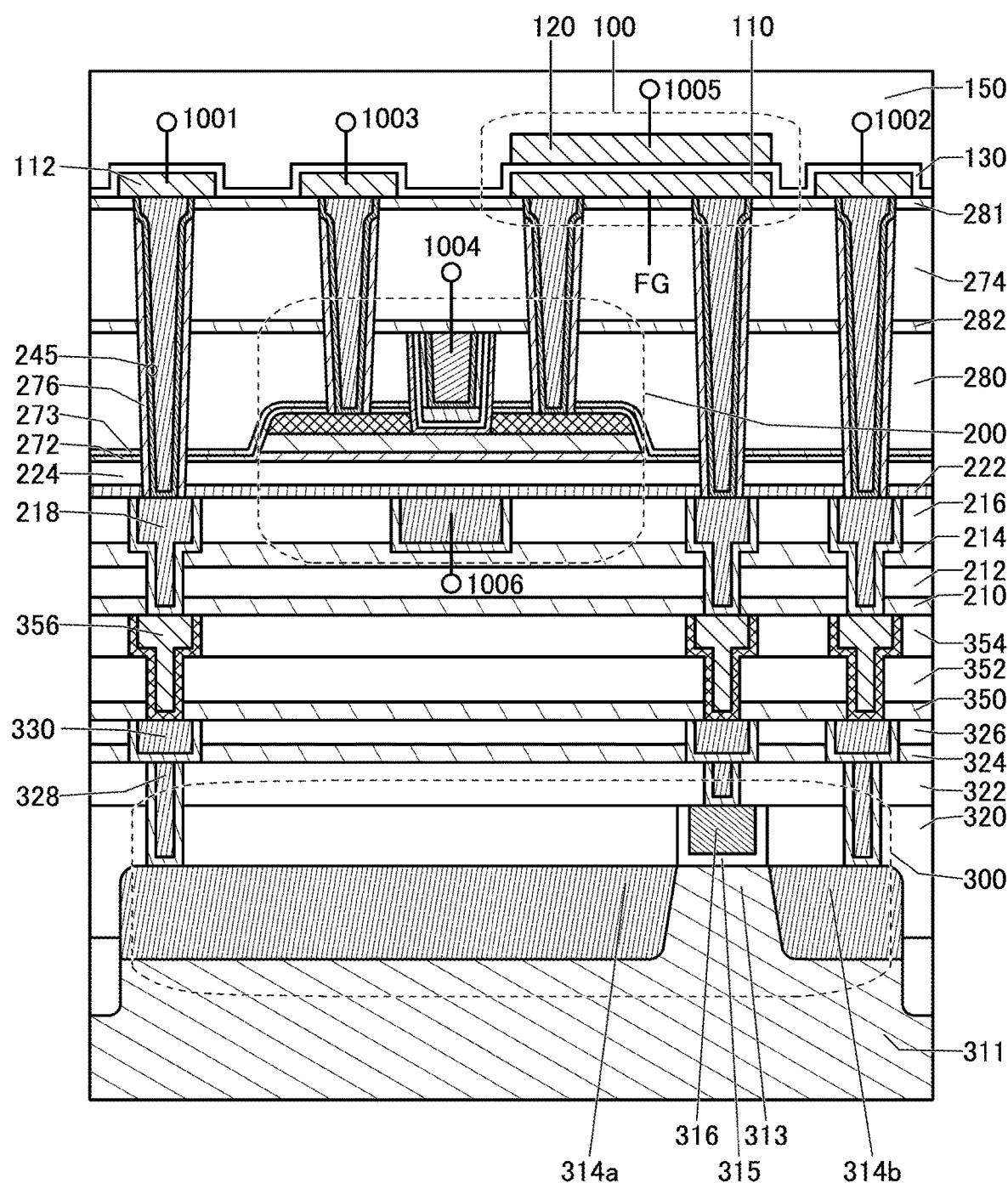
FIG. 21 A cross-sectional view illustrating a structure of a memory device.

In this embodiment, one embodiment of a semiconductor device is described with reference to FIG. 21 and FIG. 22.
[Memory Device 1]
FIG. 21 illustrates an example of a memory device in which the semiconductor device of one embodiment of the present invention is used. The memory device illustrated in FIG. 21 includes the transistor 200, a transistor 300, and a capacitor 100. The transistor 200 is provided above the transistor 300, and the capacitor 100 is provided above the transistor 300 and the transistor 200. Note that the transistor 200 described in the above embodiment can be used as the transistor 200, for example.

The transistor 200 is a transistor whose channel is formed in a semiconductor layer containing an oxide semiconductor. Since the transistor 200 has a low off-state current, a memory device including the transistor 200 can retain stored data fora long time. In other words, such a memory device does not require refresh operation or has an extremely low frequency of the refresh operation, which leads to a sufficient reduction in power consumption of the memory device.

In the semiconductor device illustrated in FIG. 21, a wiring 1001 is electrically connected to a source of the transistor 300, and a wiring 1002 is electrically connected to a drain of the transistor 300. A wiring 1003 is electrically connected to one of the source and the drain of the transistor 200. A wiring 1004 is electrically connected to a first gate of the transistor 200. A wiring 1006 is electrically connected to a second gate of the transistor 200. A gate of the transistor 300 and the other of the source and the drain of the transistor 200 are electrically connected to one electrode of the capacitor 100. A wiring 1005 is electrically connected to the other electrode of the capacitor 100.

By arranging the memory devices illustrated in FIG. 21 in a matrix, a memory cell array can be formed.

<Transistor 300>

The transistor 300 is provided over a substrate 311 and includes a conductor 316 functioning as a gate electrode, an insulator 315 functioning as a gate insulator, a semiconductor region 313 that is apart of the substrate 311, and a low-resistance region 314a and a low-resistance region 314b functioning as the source region and the drain region. The transistor 300 is of either a p-channel type or an n-channel type.

In the transistor 300 illustrated in FIG. 21, the semiconductor region 313 (part of the substrate 311) in which a channel is formed has a convex shape. Furthermore, the conductor 316 is provided so as to cover a side surface and top surface of the semiconductor region 313 with the insulator 315 therebetween. Note that a material for adjusting the work function may be used for the conductor 316. Such a transistor 300 is also referred to as a FIN-type transistor because it utilizes a convex portion of the semiconductor substrate. Note that an insulator functioning as a mask for forming the convex portion may be placed in contact with an upper portion of the convex portion. Furthermore, although the case where the convex portion is formed by processing part of the semiconductor substrate is described here, a semiconductor film having a convex shape may be formed by processing an SOI substrate.

Note that the transistor 300 illustrated in FIG. 21 is an example and the structure is not limited thereto; an appropriate transistor is used in accordance with a circuit configuration or a driving method.

<Capacitor 100>

The capacitor 100 is provided above the transistor 200. The capacitor 100 includes a conductor 110 functioning as a first electrode, a conductor 120 functioning as a second electrode, and an insulator 130 functioning as a dielectric.

For example, a conductor 112 and the conductor 110 over the conductor 245 can be formed at the same time. Note that the conductor 112 has a function of a plug or a wiring that is electrically connected to the capacitor 100, the transistor 200, or the transistor 300.

Although the conductor 112 and the conductor 110 having a single-layer structure are illustrated in FIG. 21, the structure is not limited thereto; a stacked-layer structure of two or more layers may be employed. For example, between a conductor having a barrier property and a conductor having high conductivity, a conductor which is highly adhesive to the conductor having a barrier property and the conductor having high conductivity may be formed.

The insulator 130 can be provided to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, or hafnium nitride.

For example, the insulator 130 preferably has a stacked-layer structure using a material with high dielectric strength such as silicon oxynitride and a high permittivity (high-k) material. In the capacitor 100 having such a structure, a sufficient capacitance can be provided owing to the high permittivity (high-k) insulator, and the dielectric strength can be increased owing to the insulator with high dielectric strength, so that the electrostatic breakdown of the capacitor 100 can be prevented.

Examples of the insulator with a high permittivity (high-k) material (a material having a high relative permittivity) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

As the material having a high dielectric strength (a material having a low relative permittivity), silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like can be given.

<Wiring layers>

Wiring layers provided with an interlayer film, a wiring, a plug, and the like may be provided between the structure bodies. A plurality of wiring layers can be provided in accordance with the design. Note that a plurality of conductors functioning as plugs or wirings are collectively denoted by the same reference numeral in some cases. Furthermore, in this specification and the like, a wiring and a plug electrically connected to the wiring may be a single component. That is, there are a case where part of a conductor functions as a wiring and a case where part of a conductor functions as a plug.

For example, an insulator 320, an insulator 322, an insulator 324, and an insulator 326 are stacked over the transistor 300 in this order as interlayer films. A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 function as plugs or wirings.

The insulator functioning as an interlayer film may function as a planarization film that covers an uneven shape thereunder. For example, a top surface of the insulator 322 may be planarized by planarization treatment using a chemical mechanical polishing (CMP) method or the like to improve planarity.

A wiring layer may be provided over the insulator 326 and the conductor 330. For example, in FIG. 21, an insulator 350, an insulator 352, and an insulator 354 are stacked sequentially. Furthermore, a conductor 356 is formed in the insulator 350, the insulator 352, and the insulator 354. The conductor 356 functions as a plug or a wiring.

Similarly, a conductor 218 and a conductor included in the transistor 200 are embedded in the insulator 210, the insulator 212, the insulator 214, and the insulator 216. Note that the conductor 218 has a function of a plug or a wiring that is electrically connected to the capacitor 100 or the transistor 300. In addition, the insulator 150 is provided over the conductor 120 and the insulator 130.

Examples of an insulator that can be used as an interlayer film include an insulating oxide, an insulating nitride, an insulating oxynitride, an insulating nitride oxide, an insulating metal oxide, an insulating metal oxynitride, and an insulating metal nitride oxide.

For example, when a material having a low relative permittivity is used for the insulator functioning as an interlayer film, the parasitic capacitance generated between wirings can be reduced. Thus, a material is preferably selected depending on the function of an insulator.

For example, as the insulator 150, the insulator 212, the insulator 352, the insulator 354, and the like, an insulator having a low relative permittivity is preferably used. For example, the insulators each preferably include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulators each preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low relative permittivity. Examples of the resin include polyester, polyolefin, polyamide (e.g., nylon and aramid), polyimide, polycarbonate, and acrylic When the transistor using an oxide semiconductor is surrounded by an insulator that has a function of inhibiting the passage of oxygen and impurities such as hydrogen, the electrical characteristics of the transistor can be stable. Thus, an insulator having a function of inhibiting the passage of oxygen and impurities such as hydrogen is preferably used for the insulator 210, the insulator 350, and the like.

As an insulator having a function of inhibiting the passage of oxygen and impurities such as hydrogen, a single layer or a stacked layer of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, for the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

For the conductors that can be used as a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Furthermore, a semiconductor having high electrical conductivity, typified by polycrystalline silicon containing an impurity element such as phosphorus, or silicide such as nickel silicide may be used.

For example, for the conductor 328, the conductor 330, the conductor 356, the conductor 218, the conductor 112, and the like, a single layer or a stacked layer of a conductive material such as a metal material, an alloy material, a metal nitride material, or a metal oxide material which is formed using the above materials can be used. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

<<Wirings or Plugs in a Layer Provided with an Oxide Semiconductor>>

In the case where an oxide semiconductor is used in the transistor 200, an insulator including an excess oxygen region is provided in the vicinity of the oxide semiconductor in some cases. In that case, an insulator having a barrier property is preferably provided between the insulator including the excess oxygen region and the conductor provided in the insulator including the excess oxygen region.

For example, an insulator 276 is preferably provided between the insulator 224 containing excess oxygen and the conductor 245 in FIG. 21. Since the insulator 276 is provided in contact with the insulator 222, the insulator 272, and the insulator 273, the insulator 224 and the transistor 200 can be sealed by the insulators having a barrier property. It is also preferable that the insulator 276 be in contact with part of the insulator 280. With such a structure, diffusion of oxygen and impurities can be further inhibited.

That is, when the insulator 276 is provided, absorption of excess oxygen contained in the insulator 224 by the conductor 245 can be inhibited. In addition, when the insulator 276 is included, diffusion of hydrogen, which is an impurity, into the transistor 200 through the conductor 245 can be inhibited.

For the insulator 276, an insulating material having a function of inhibiting diffusion of oxygen and impurities such as water and hydrogen is preferably used. For example, aluminum oxide or hafnium oxide is preferably used. Alternatively, for example, a metal oxide such as magnesium oxide, gallium oxide, germanium oxide, yttrium oxide, zirconium oxide, lanthanum oxide, neodymium oxide, or tantalum oxide; silicon nitride oxide; or silicon nitride can be used.

The above is the description of the structure example. With the use of the structure, a change in electrical characteristics can be reduced and reliability can be improved in a semiconductor device using a transistor including an oxide semiconductor. Alternatively, a transistor including an oxide semiconductor with a high on-state current can be provided. Alternatively, a transistor including an oxide semiconductor with low off-state current can be provided. Alternatively, a semiconductor device with low power consumption can be provided.

[Memory Device 2]

Figure 22:
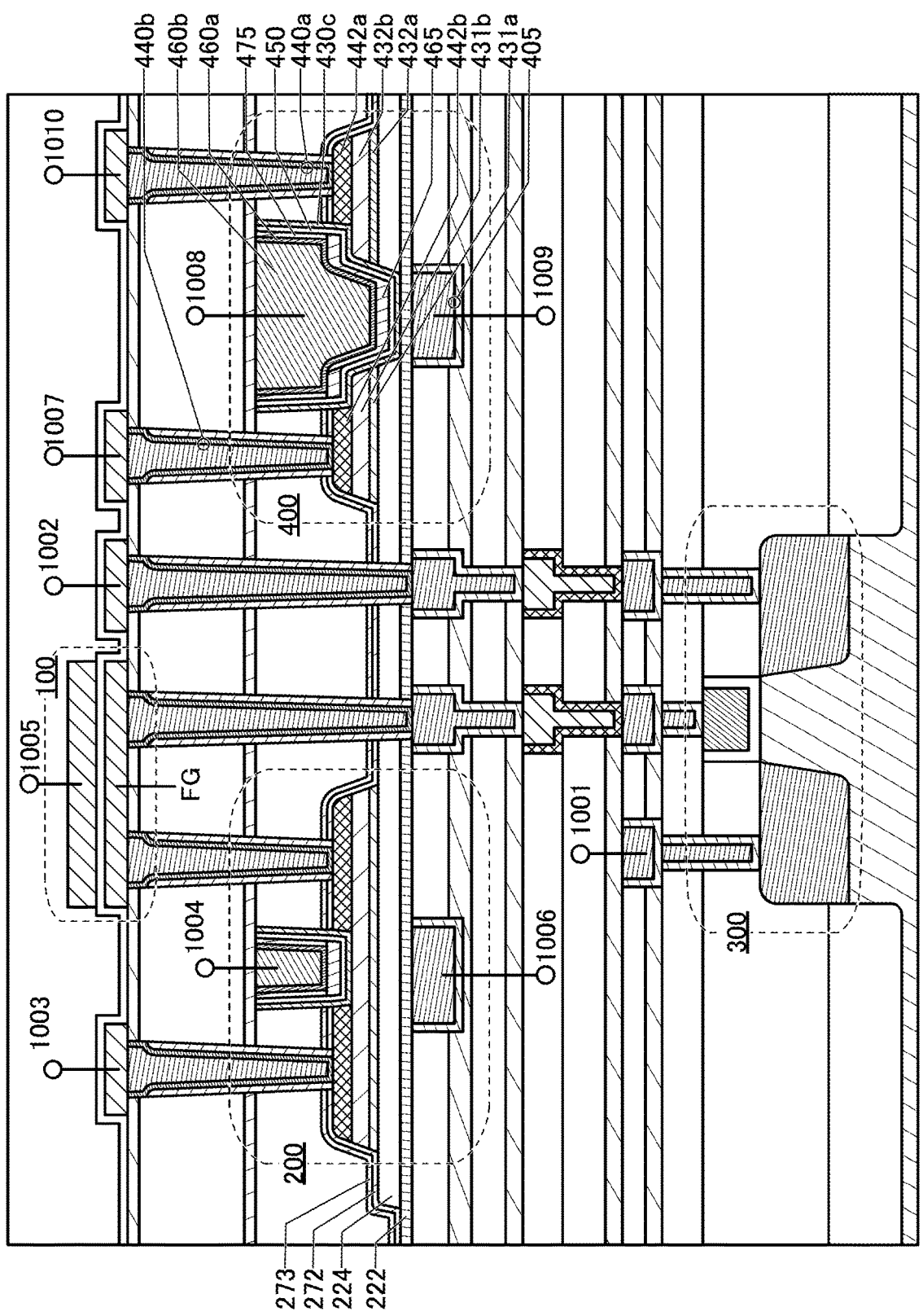
FIG. 22 A cross-sectional view illustrating a structure of a memory device.

FIG. 22 illustrates an example of a memory device using the semiconductor device of one embodiment of the present invention. The memory device illustrated in FIG. 22 includes a transistor 400 in addition to the semiconductor device including the transistor 200, the transistor 300, and the capacitor 100 illustrated in FIG. 21.

The transistor 400 can control a second gate voltage of the transistor 200. For example, a first gate and a second gate of the transistor 400 are diode-connected to a source of the transistor 400, and the source thereof is connected to the second gate of the transistor 200. When a negative potential of the second gate of the transistor 200 is retained in this structure, a first gate-source voltage and a second gate-source voltage of the transistor 400 are 0 V. In the transistor 400, a drain current when the second gate voltage and the first gate voltage are 0 V is extremely low; thus, the negative potential of the second gate of the transistor 200 can be held for a long time even without power supply to the transistor 200 and the transistor 400. Accordingly, the memory device including the transistor 200 and the transistor 400 can retain stored data for a long time.

In FIG. 22, the wiring 1001 is electrically connected to the source of the transistor 300. The wiring 1002 is electrically connected to the drain of the transistor 300. The wiring 1003 is electrically connected to one of the source and the drain of the transistor 200. The wiring 1004 is electrically connected to the gate of the transistor 200. The wiring 1006 is electrically connected to a back gate of the transistor 200. The gate of the transistor 300 and the other of the source and the drain of the transistor 200 are electrically connected to one electrode of the capacitor 100. The wiring 1005 is electrically connected to the other electrode of the capacitor 100. A wiring 1007 is electrically connected to the source of the transistor 400. A wiring 1008 is electrically connected to a gate of the transistor 400. A wiring 1009 is electrically connected to a back gate of the transistor 400. A wiring 1010 is electrically connected to the drain of the transistor 400. The wiring 1006, the wiring 1007, the wiring 1008, and the wiring 1009 are electrically connected to each other.

When the memory devices illustrated in FIG. 22 are arranged in a matrix like the memory devices illustrated in FIG. 21, a memory cell array can be formed. Note that one transistor 400 can control second gate voltages of the transistors 200. For this reason, the number of provided transistors 400 is preferably smaller than the number of transistors 200.

<Transistor 400>

The transistor 400 and the transistors 200 are formed in the same layer and thus can be fabricated in parallel. The transistor 400 includes a conductor 465 and a conductor 460 (a conductor 460*a* and a conductor 460*b*) functioning as a first gate electrode; a conductor 405 functioning as a second gate electrode; the insulator 222, the insulator 224, and an insulator 450 each functioning as a gate insulating layer; an oxide 430*c* including a region where a channel is formed; a conductor 442*a* functioning as one of a source and a drain; an oxide 432*a* and an oxide 432*b*; a conductor 442*b* functioning as the other of the source and the drain; an oxide 431*a* and an oxide 431*b*; and a conductor 440 (a conductor 440*a* and a conductor 440*b*).

In the transistor 400, the conductor 405 is in the same layer as the conductor 205. The oxide 431*a* and the oxide 432*a* are in the same layer as the oxide 230*a*, and the oxide 431*b* and the oxide 432*b* are in the same layer as the oxide 230*b*. The conductor 442*a* and the conductor 442*b* are in the same layer as the conductor 242. The oxide 430*c* is in the same layer as the oxide 230*c*. The insulator 450 is in the same layer as the insulator 250. The conductor 465 is in the same layer as the conductor 265. The conductor 460 is in the same layer as the conductor 260.

Note that the structure bodies formed in the same layer can be formed at the same time. For example, the oxide 430*c* can be formed by processing the oxide film 230C.

In the oxide 430*c* functioning as an active layer of the transistor 400, oxygen vacancies and impurities such as hydrogen and water are reduced, as in the oxide 230 or the like. Accordingly, the threshold voltage of the transistor 400 can be higher than 0 V, an off-state current can be reduced, and the drain current when the second gate voltage and the first gate voltage are 0 V can be extremely low.

<Dicing Line>

A dicing line (also referred to as a scribe line, a dividing line, or a cutting line in some cases) that is provided when a large-sized substrate is divided into semiconductor elements so that a plurality of semiconductor devices are each formed in a chip form is described below. Examples of a dividing method include the case where a groove (a dicing line) for dividing the semiconductor elements is formed on the substrate, and then the substrate is cut along the dicing line to divide (split) it into a plurality of semiconductor devices.

Here, for example, as illustrated in FIG. 22, it is preferable to perform design so that a region in which the insulator 272 and the insulator 222 are in contact with each other is the dicing line. That is, an opening is provided in the insulator 224 in the vicinity of the region to be the dicing line that is provided in an outer edge of the transistor 400 and the memory cell including a plurality of transistors 200. The insulator 272 is provided to cover the side surface of the insulator 224.

That is, in the opening provided in the insulator 224, the insulator 222 is in contact with the insulator 272. For example, the insulator 222 and the insulator 272 may be formed using the same material and the same method. When the insulator 222 and the insulator 272 are formed using the same material and the same method, the adhesion therebetween can be increased. For example, aluminum oxide is preferably used.

With such a structure, the insulator 224, the transistor 200 and the transistor 400 can be enclosed with the insulator 222 and the insulator 272. Since the insulator 222 and the insulator 272 have a function of inhibiting diffusion of oxygen, hydrogen, and water even when the substrate is divided into circuit regions each of which is provided with the semiconductor elements in this embodiment to form a plurality of chips, the entry and diffusion of impurities such as hydrogen and water from the direction of a side surface of the divided substrate to the transistor 200 and the transistor 400 can be inhibited.

Furthermore, in the structure, excess oxygen in the insulator 224 can be inhibited from being diffused into the outside of the insulator 272 and the insulator 222. Accordingly, excess oxygen in the insulator 224 is efficiently supplied to the oxide where the channel is formed in the transistor 200 or the transistor 400. The oxygen can reduce oxygen vacancies in the oxide where the channel is formed in the transistor 200 or the transistor 400. Thus, the oxide where the channel is formed in the transistor 200 or the transistor 400 can be an oxide semiconductor with a low density of defect states and stable characteristics. That is, a change in electrical characteristics of the transistors 200 or the transistor 400 can be inhibited and reliability can be improved.

This embodiment can be implemented in an appropriate combination with the structures described in the other embodiments and the like.

Embodiment 3

In this embodiment, a memory device of one embodiment of the present invention including a transistor in which an oxide is used for a semiconductor (hereinafter referred to as an OS transistor in some cases) and a capacitor (hereinafter, such a memory device is also referred to as an OS memory device in some cases), is described with reference to FIG. 23 and FIG. 24. The OS memory device includes at least a capacitor and an OS transistor that controls the charging and discharging of the capacitor. Since the OS transistor has an extremely low off-state current, the OS memory device has excellent retention characteristics and thus can function as a nonvolatile memory.

<Structure Example of Memory Device>

Figure 23A:
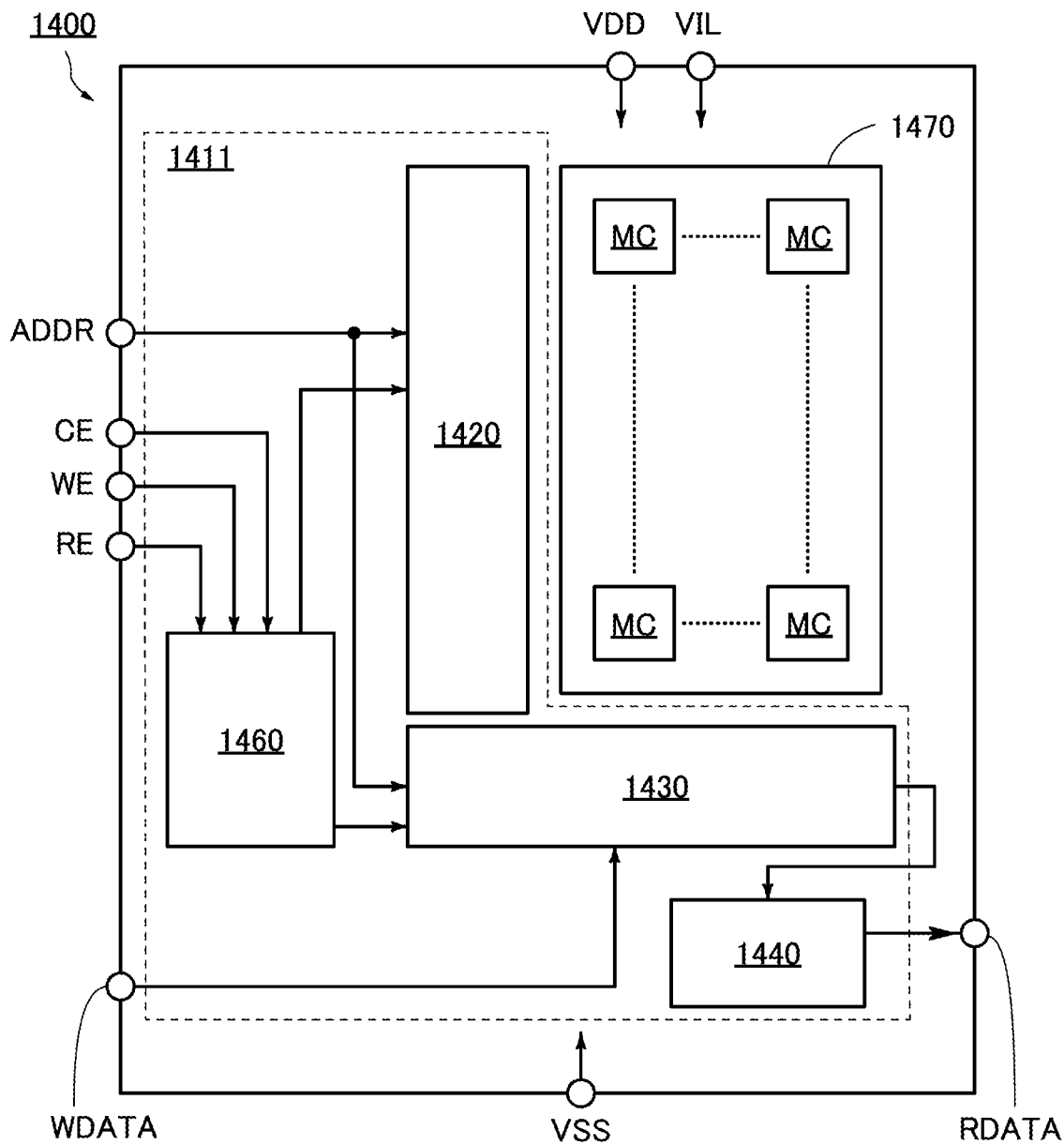
FIG. 23 (A) A block diagram illustrating a configuration example of a memory device. (B) A schematic diagram illustrating a structure example of the memory device.

FIG. 23(A) illustrates a structure example of the OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to the memory cell included in the memory cell array 1470, and are described later in detail. The amplified data signal is output as a data signal RDATA to the outside of the memory device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and the WDATA is input to the write circuit.

The control logic circuit 1460 processes the signals (CE, WE, and RE) input from the outside, and generates control signals for the row decoder or the column decoder. The CE is a chip enable signal, the WE is a write enable signal, and the RE is a read enable signal. Signals processed by the control logic circuit 1460 are not limited thereto, and other input signals are processed to generate control signals for the row decoder or the column decoder as necessary.

The memory cell array 1470 includes a plurality of memory cells MC and a plurality of wirings arranged in a matrix. Note that the number of the wirings that connect the memory cell array 1470 to the row circuit 1420 depends on the structure of the memory cell MC, the number of the memory cells MC in a column, and the like. The number of the wirings that connect the memory cell array 1470 to the column circuit 1430 depends on the structure of the memory cell MC, the number of the memory cells MC in a row, and the like.

Figure 23B:
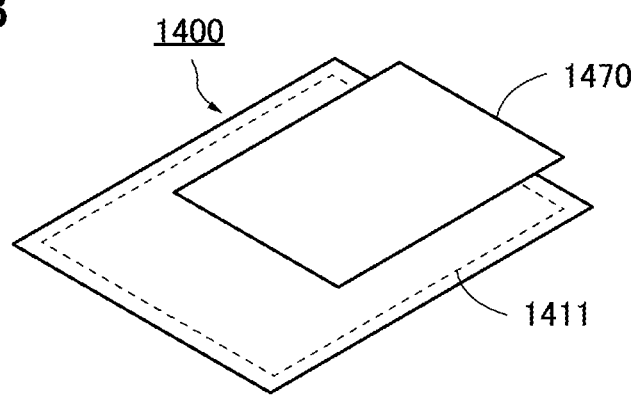

Note that FIG. 23(A) illustrates an example in which the peripheral circuit 1411 and the memory cell array 1470 are formed on the same plane; however, this embodiment is not limited thereto. For example, as illustrated in FIG. 23(B), the memory cell array 1470 may be provided over the peripheral circuit 1411 to partly overlap with the peripheral circuit 1411. For example, the sense amplifier may be provided below the memory cell array 1470 so that they overlap with each other.

FIG. 24 illustrate structure examples of a memory cell applicable to the memory cell MC.
[DOSRAM]

Figure 24A:
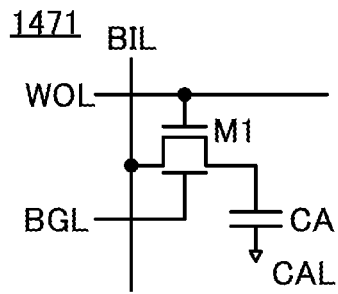
FIG. 24 (A) to (H) Circuit diagrams illustrating structure examples of a memory device.
Figure 24B:
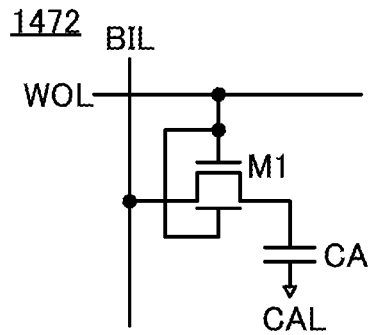
Figure 24C:
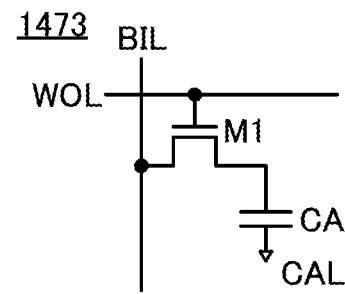
Figure 24D:
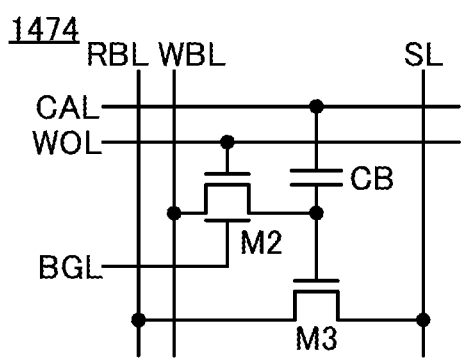
Figure 24E:
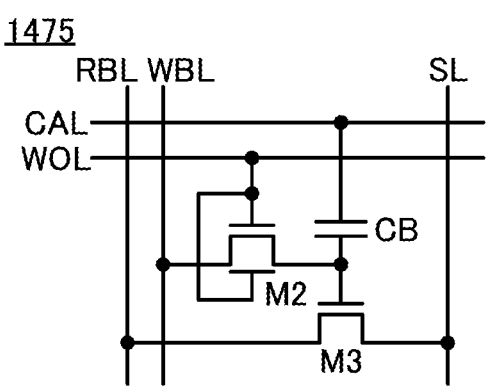
Figure 24F:
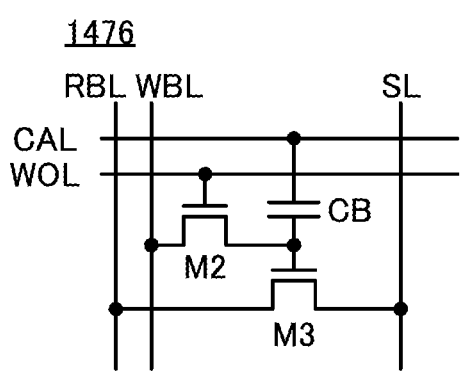
Figure 24G:
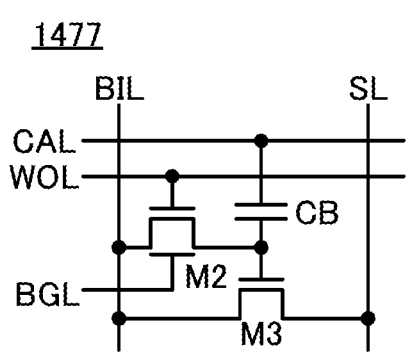

FIGS. 24(A) to 24(C) each illustrate a circuit structure example of a memory cell of a DRAM. In this specification and the like, a DRAM using a memory cell including one OS transistor and one capacitor is referred to as DOSRAM (Dynamic Oxide Semiconductor Random Access Memory) in some cases. A memory cell 1471 illustrated in FIG. 24(A) includes a transistor M1 and a capacitor CA. Note that the transistor M1 includes a gate (also referred to as a front gate in some cases) and a back gate.

A first terminal of the transistor M1 is connected to a first terminal of the capacitor CA. A second terminal of the transistor M1 is connected to a wiring BIL. The gate of the transistor M1 is connected to a wiring WOL. The back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In the time of data writing and data reading, a low-level potential is preferably applied to the wiring CAL. The wiring BGL functions as a wiring for applying a potential to the back gate of the transistor M1. By applying a given potential to the wiring BGL, the threshold voltage of the transistor M1 can be increased or decreased.

The memory cell MC is not limited to the memory cell 1471, and the circuit structure can be changed. For example, as in a memory cell 1472 illustrated in FIG. 24(B), the back gate of the transistor M1 may be connected not to the wiring BGL but to the wiring WOL in the memory cell MC. Alternatively, for example, the memory cell MC may be a memory cell including a single-gate transistor M1, that is, the transistor M1 not including a back gate, as in a memory cell 1473 illustrated in FIG. 24(C).

In the case where the semiconductor device described in any of the above embodiments is used in the memory cell 1471 and the like, the transistor 200 can be used as the transistor M1, and the capacitor 100 can be used as the capacitor CA. When an OS transistor is used as the transistor M1, the leakage current of the transistor M1 can be extremely low. That is, with the use of the transistor M1, written data can be retained for a long time, and thus the frequency of the refresh operation for the memory cell can be decreased. In addition, refresh operation of the memory cell can be unnecessary. In addition, since the transistor M1 has an extremely low leakage current, multi-level data or analog data can be retained in the memory cell 1471, the memory cell 1472, and the memory cell 1473.

In the DOSRAM, when the sense amplifier is provided below the memory cell array 1470 so that they overlap with each other as described above, the bit line can be shortened. Thus, the bit line capacitance can be small, and the storage capacitance of the memory cell can be reduced.
[NOSRAM]

FIGS. 24(D) to 24(H) each illustrate a circuit structure example of a gain-cell memory cell including two transistors and one capacitor. A memory cell 1474 illustrated in FIG. 24(D) includes a transistor M2, a transistor M3, and a capacitor CB. Note that the transistor M2 includes a front gate (simply referred to as a gate in some cases) and a back gate. In this specification and the like, a memory device including a gain-cell memory cell using an OS transistor as the transistor M2 is referred to as NOSRAM (Nonvolatile Oxide Semiconductor RAM) in some cases.

A first terminal of the transistor M2 is connected to a first terminal of the capacitor CB. A second terminal of the transistor M2 is connected to a wiring WBL. A gate of the transistor M2 is connected to the wiring WOL. A back gate of the transistor M2 is connected to the wiring BGL. A second terminal of the capacitor CB is connected to the wiring CAL. A first terminal of the transistor M3 is connected to a wiring RBL. A second terminal of the transistor M3 is connected to a wiring SL. A gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. In the time of data writing, data retaining, and data reading, a low-level potential is preferably applied to the wiring CAL. The wiring BGL functions as a wiring for applying a potential to the back gate of the transistor M2. By applying a given potential to the wiring BGL, the threshold voltage of the transistor M2 can be increased or decreased.

The memory cell MC is not limited to the memory cell 1474, and the circuit structure can be changed as appropriate. For example, as in a memory cell 1475 illustrated in FIG. 24(E), the back gate of the transistor M2 may be connected not to the wiring BGL but to the wiring WOL in the memory cell MC. Alternatively, for example, the memory cell MC may be a memory cell including as single-gate transistor M2, that is, the transistor M2 not including a back gate, as in a memory cell 1476 illustrated in FIG. 24(F). Alternatively, for example, in the memory cell MC, the wiring WBL and the wiring RBL may be combined into one wiring BIL, as in a memory cell 1477 illustrated in FIG. 24(G).

In the case where the semiconductor device described in any of the above embodiments is used in the memory cell 1474 and the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. That is, with the use of the transistor M2, written data can be retained for a long time, and thus the frequency of the refresh operation for the memory cell can be decreased. In addition, refresh operation of the memory cell can be unnecessary. In addition, since the transistor M2 has an extremely low leakage current, multi-level data or analog data can be retained in the memory cell 1474. The same applies to the memory cells 1475 to 1477.

Note that the transistor M3 may be a transistor containing silicon in a channel formation region (hereinafter, also referred to as a Si transistor in some cases). The conductivity type of the Si transistor may be of either an n-channel type or a p-channel type. The Si transistor has higher field-effect mobility than the OS transistor in some cases. Therefore, a Si transistor may be used as the transistor M3 functioning as a reading transistor. Furthermore, the transistor M2 can be provided to be stacked over the transistor M3 when a Si transistor is used as the transistor M3; therefore, the area occupied by the memory cell can be reduced, leading to high integration of the memory device.

Alternatively, the transistor M3 may be an OS transistor. When an OS transistor is used as each of the transistors M2 and M3, the circuit of the memory cell array 1470 can be formed using only n-channel transistors.

Figure 24H:
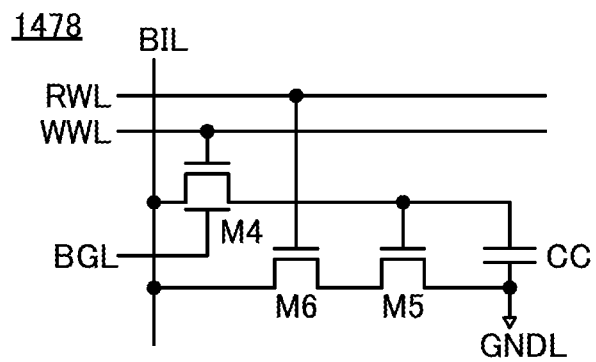

FIG. 24(H) illustrates an example of a gain-cell memory cell including three transistors and one capacitor. A memory cell 1478 illustrated in FIG. 24(H) includes transistors M4 to M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wirings RBL and WBL instead of the wiring BIL.

The transistor M4 is an OS transistor including a back gate that is electrically connected to the wiring BGL. Note that the back gate and the gate of the transistor M4 may be electrically connected to each other. Alternatively, the transistor M4 may not include the back gate.

Note that each of the transistors M5 and M6 may be an n-channel Si transistor or a p-channel Si transistor. Alternatively, the transistors M4 to M6 may be OS transistors, in which case the circuit of the memory cell array 1470 can be formed using only n-channel transistors.

In the case where the semiconductor device described in any of the above embodiments is used in the memory cell 1478, the transistor 200 can be used as the transistor M4, the transistor 300 can be used as the transistors M5 and M6, and the capacitor 100 can be used as the capacitor CC. When an OS transistor is used as the transistor M4, the leakage current of the transistor M4 can be extremely low.

Note that the structures of the peripheral circuit 1411, the memory cell array 1470, and the like described in this embodiment are not limited to the above. Positions and functions of these circuits, wirings connected to the circuits, circuit elements, and the like can be changed, deleted, or added as needed.

The structure described in this embodiment can be used in an appropriate combination with the structures described in the other embodiments and the like.

Embodiment 4

In this embodiment, an example of a chip 1200 on which the semiconductor device of the present invention is mounted is described with reference to FIG. 25. A plurality of circuits (systems) are mounted on the chip 1200. The technique for integrating a plurality of circuits (systems) on one chip as described above is referred to as system on chip (SoC) in some cases.

Figure 25A:
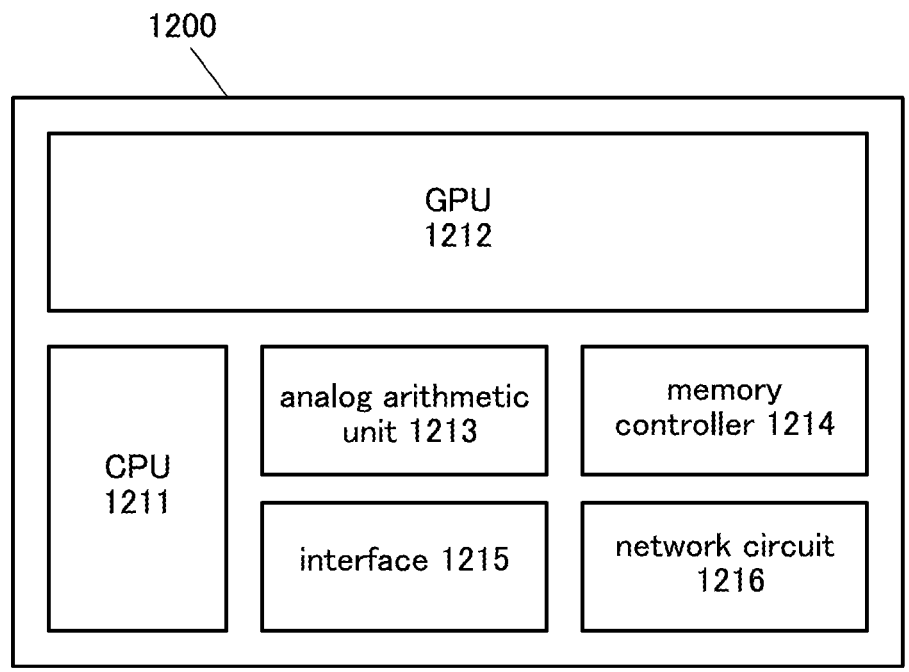
FIG. 25 (A) A block diagram illustrating a configuration example of a memory device. (B) A schematic diagram illustrating a structure example of the memory device.

As illustrated in FIG. 25(A), the chip 1200 includes a CPU (Central Processing Unit) 1211, a GPU (Graphics Processing Unit) 1212, one or more of analog arithmetic units 1213, one or more of memory controllers 1214, one or more of interfaces 1215, one or more of network circuits 1216, and the like.

Figure 25B:
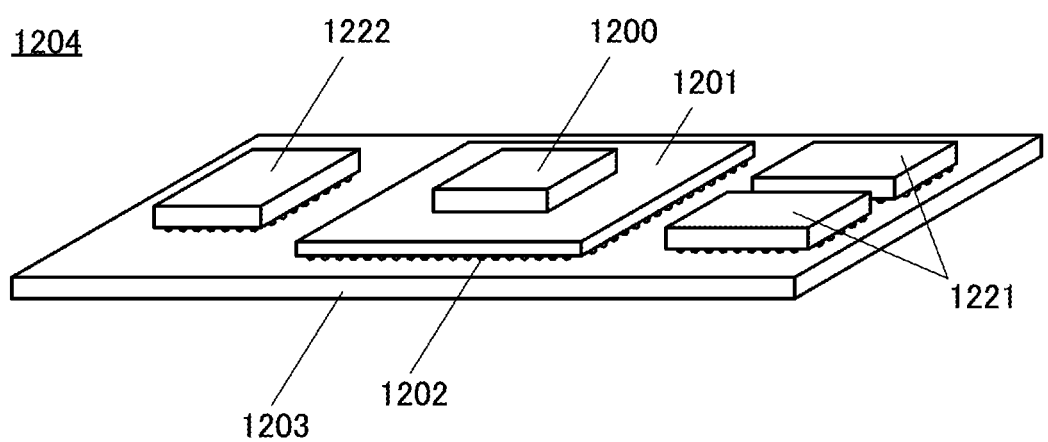

A bump (not illustrated) is provided on the chip 1200, and as illustrated in FIG. 25(B), the chip 1200 is connected to a first surface of a printed circuit board (PCB) 1201. A plurality of bumps 1202 are provided on the rear side of the first surface of the PCB 1201, and the PCB 1201 is connected to a motherboard 1203.

A memory device such as a DRAM 1221 or a flash memory 1222 may be provided over the motherboard 1203. For example, the DOSRAM described in the above embodiment can be used as the DRAM 1221. For example, the NOSRAM described in the above embodiment can be used as the flash memory 1222.

The CPU 1211 preferably includes a plurality of CPU cores. Furthermore, the GPU 1212 preferably includes a plurality of GPU cores. The CPU 1211 and the GPU 1212 may each include a memory for storing data temporarily. Alternatively, a common memory for the CPU 1211 and the GPU 1212 may be provided in the chip 1200. The NOSRAM or the DOSRAM described above can be used as the memory. The GPU 1212 is suitable for parallel computation of a number of data and thus can be used for image processing or product-sum operation. When an image processing circuit or a product-sum operation circuit including an oxide semiconductor of the present invention is provided in the GPU 1212, image processing and product-sum operation can be performed with low power consumption.

In addition, since the CPU 1211 and the GPU 1212 are provided in the same chip, a wiring between the CPU 1211 and the GPU 1212 can be shortened; accordingly, the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/ analog) converter circuit. Furthermore, the analog arithmetic unit 1213 may include the above-described product-sum operation circuit.

The memory controller 1214 includes a circuit functioning as a controller of the DRAM 1221 and a circuit functioning as the interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, USB (Universal Serial Bus), HDMI (registered trademark) (High-Definition Multimedia Interface), or the like can be used.

The network circuit 1216 includes a network circuit such as a LAN (Local Area Network). Furthermore, the network circuit 1216 may include a circuit for network security.

The circuits (systems) can be formed in the chip 1200 in the same manufacturing process. Therefore, even when the number of circuits needed for the chip 1200 is increased, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 formed using the SoC technology, and thus can have a small size. Furthermore, the GPU module 1204 is excellent in image processing, and thus is suitably used in a portable electronic device such as a smartphone, a tablet terminal, a laptop PC, or a portable (mobile) game console. Furthermore, the product-sum operation circuit using the GPU 1212 can implement the arithmetic operation in a deep neural network (DNN), a convolutional neural network (CNN), a recurrent neural network (RNN), an autoencoder, a deep Boltzmann machine (DBM), a deep belief network (DBN), or the like; thus, the chip 1200 can be used as an AI chip or the GPU module 1204 can be used as an AI system module.

The structure described in this embodiment can be used in an appropriate combination with the structures described in the other embodiments.

Embodiment 5

In this embodiment, application examples of the memory device using the semiconductor device described in the above embodiment are described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to removable memory devices such as memory cards (e.g., SD cards), USB memories, and SSDs (solid state drives). FIG. 26 schematically illustrates some structure examples of removable memory devices. The semiconductor device described in the above embodiment is processed into a packaged memory chip and used in a variety of storage devices and removable memories, for example.

FIG. 26(A) is a schematic view of a USB memory. A USB memory 1100 includes a housing 1101, a cap 1102, a USB connector 1103, and a substrate 1104. The substrate 1104 is held in the housing 1101. For example, a memory chip 1105 and a controller chip 1106 are attached to the substrate 1104. The semiconductor device described in the above embodiment can be incorporated in the memory chip 1105 or the like on the substrate 1104.

FIG. 26(B) is a schematic external view of an SD card, and FIG. 26(C) is a schematic view of the internal structure of the SD card. An SD card 1110 includes a housing 1111, a connector 1112, and a substrate 1113. The substrate 1113 is held in the housing 1111. For example, a memory chip 1114 and a controller chip 1115 are attached to the substrate 1113. When the memory chip 1114 is also provided on the rear surface side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like on the substrate 1113.

FIG. 26(D) is a schematic external view of an SSD, and FIG. 26(E) is a schematic view of the internal structure of the SSD. An SSD 1150 includes a housing 1151, a connector 1152, and a substrate 1153. The substrate 1153 is held in the housing 1151. For example, a memory chip 1154, a memory chip 1155, and a controller chip 1156 are attached to the substrate 1153. The memory chip 1155 is a work memory for the controller chip 1156, and a DOSRAM chip may be used, for example. When the memory chip 1154 is also provided on the rear surface side of the substrate 1153, the capacity of the SSD 1150 can be increased. The semiconductor device described in the above embodiment can be incorporated in the memory chip 1154 or the like on the substrate 1153.

This embodiment can be implemented in an appropriate combination with the structures described in the other embodiments and the like.

Embodiment 6

<Electronic Device>

The semiconductor device of one embodiment of the present invention can be used for processors such as CPUs and GPUs or chips. FIG. 27 illustrates specific examples of electronic devices including a processor such as a CPU or a GPU or a chip of one embodiment of the present invention.

<Electronic Device and System>

The GPU or the chip of one embodiment of the present invention can be incorporated into a variety of electronic devices. Examples of electronic devices include a digital camera, a digital video camera, a digital photo frame, a mobile phone, a portable game machine, a portable information terminal, and an audio reproducing device in addition to electronic devices provided with a relatively large screen, such as a television device, a desktop or laptop personal computer, a monitor for a computer and the like, digital signage, and a large game machine like a pachinko machine. When the integrated circuit or the chip of one embodiment of the present invention is provided in an electronic device, the electronic device can include artificial intelligence.

The electronic device of one embodiment of the present invention may include an antenna. When a signal is received by the antenna, the electronic device can display a video, data, or the like on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radioactive rays, flow rate, humidity, gradient, oscillation, a smell, or infrared rays).

The electronic device of one embodiment of the present invention can have a variety of functions. For example, the electronic device can have a function of displaying a variety of data (a still image, a moving image, a text image, and the like) on a display portion, a touch panel function, a function of displaying a calendar, date, time, and the like, a function of executing a variety of software (programs), a wireless communication function, and a function of reading out a program or data stored in a recording medium. FIG. 27 illustrates examples of electronic devices.

[Mobile Phone]

Figure 27A:
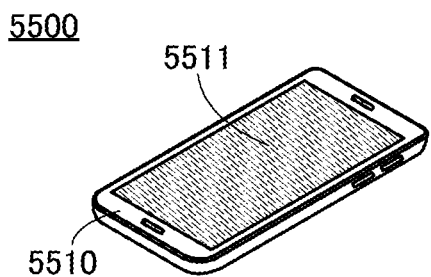
FIG. 27 (A) to (F) Diagrams illustrating electronic devices.

FIG. 27(A) illustrates a mobile phone (smartphone), which is a type of information terminal. An information terminal 5500 includes a housing 5510 and a display portion 5511. As input interfaces, a touch panel is provided in the display portion 5511 and a button is provided in the housing 5510.

The information terminal 5500 can execute an application utilizing artificial intelligence, with the use of the chip of one embodiment of the present invention. Examples of the application utilizing artificial intelligence include an application for interpreting a conversation and displaying its content on the display portion 5511; an application for recognizing letters, figures, and the like input to the touch panel of the display portion 5511 by a user and displaying them on the display portion 5511; and an application for biometric authentication using fingerprints, voice prints, or the like.

[Information Terminal 1]

Figure 27B:
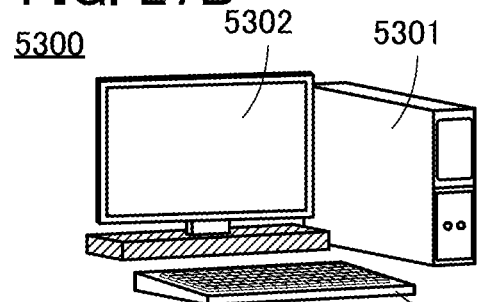

FIG. 27(B) illustrates a desktop information terminal 5300. The desktop information terminal 5300 includes a main body 5301 of the information terminal, a display 5302, and a keyboard 5303.

Like the information terminal 5500 described above, the desktop information terminal 5300 can execute an application utilizing artificial intelligence, with the use of the chip of one embodiment of the present invention. Examples of the application utilizing artificial intelligence include design-support software, text correction software, and software for automatic menu generation. Furthermore, with the use of the desktop information terminal 5300, novel artificial intelligence can be developed.

Note that in the above description, although a smartphone and a desktop information terminal are shown as examples of the electronic devices in FIGS. 27(A) and 27(B), one embodiment of the present invention can also be applied to an information terminal other than a smartphone and a desktop information terminal. Examples of information terminals other than a smartphone and a desktop information terminal include a PDA (Personal Digital Assistant), a laptop information terminal, and a workstation.

[Household Appliance]

Figure 27C:
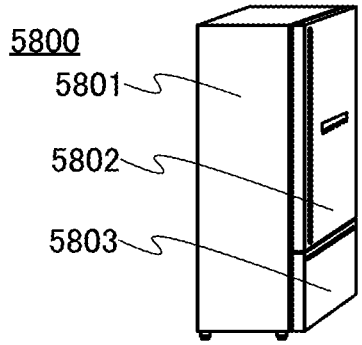

FIG. 27(C) illustrates an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is used in the electric refrigerator-freezer 5800, the electric refrigerator-freezer 5800 including artificial intelligence can be obtained. Utilizing the artificial intelligence enables the electric refrigerator-freezer 5800 to have a function of automatically making a menu based on foods stored in the electric refrigerator-freezer 5800 and food expiration dates, for example, a function of automatically adjusting the temperature to be appropriate for the foods stored in the electric refrigerator-freezer 5800, and the like.

Although the electric refrigerator-freezer is described here as an example of a household appliance, other examples of a household appliance include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

[Game Machine]

Figure 27D:
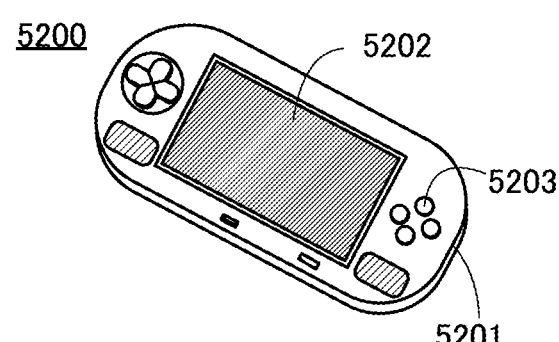
Figure 27D:
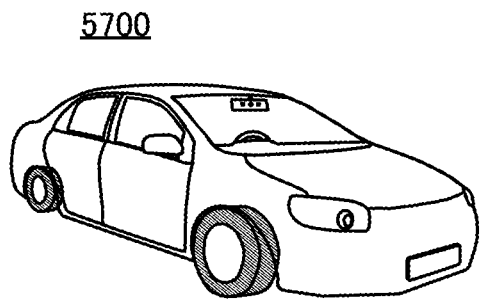
Figure 27D:
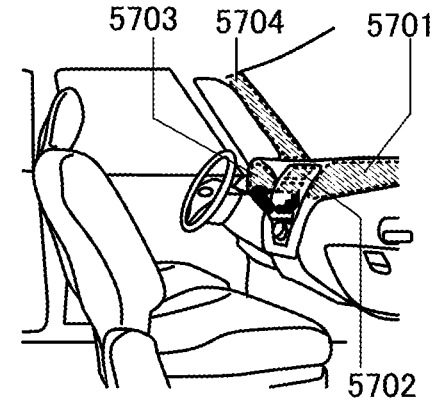

FIG. 27(D) illustrates a portable game machine 5200 as an example of a game machine. The portable game machine 5200 includes a housing 5201, a display portion 5202, a button 5203, and the like.

When the GPU or the chip of one embodiment of the present invention is used in the portable game machine 5200, the portable game machine 5200 with low power consumption can be obtained. Moreover, heat generation from a circuit can be reduced owing to low power consumption; thus, the influence of heat generation on the circuit, the peripheral circuit, and the module can be reduced.

Furthermore, when the GPU or the chip of one embodiment of the present invention is used in the portable game machine 5200, the portable game machine 5200 including artificial intelligence can be obtained.

In general, the progress of a game, the actions and words of game characters, and expressions of a phenomenon and the like in the game are programed in the game; however, the use of artificial intelligence in the portable game machine 5200 enables expressions not limited by the game program. For example, questions posed by the player, the progress of the game, time, and actions and words of game characters can be changed for various expressions.

When a game requiring a plurality of players is played on the portable game machine 5200, the artificial intelligence can create a virtual game player; thus, the game can be played alone with the game player created by the artificial intelligence as an opponent.

Although the portable game machine is illustrated as an example of a game machine in FIG. 27(D), the game machine using the GPU or the chip of one embodiment of the present invention is not limited thereto. Examples of the game machine using the GPU or the chip of one embodiment of the present invention include a home stationary game machine, an arcade game machine installed in entertainment facilities (a game center, an amusement park, and the like), and a throwing machine for batting practice installed in sports facilities.

[Moving Vehicle]

The GPU or the chip of one embodiment of the present invention can be used in an automobile, which is a moving vehicle, and around a driver's seat in the automobile.

FIG. 27(E1) illustrates an automobile 5700 as an example of a moving vehicle, and FIG. 27(E2) is a diagram illustrating the periphery of a windshield inside the automobile. FIG. 27(E2) illustrates a display panel 5701, a display panel 5702, and a display panel 5703 that are attached to a dashboard and a display panel 5704 that is attached to a pillar.

The display panel 5701 to the display panel 5703 can provide a variety of kinds of information by displaying a speedometer, a tachometer, mileage, a fuel gauge, a gear state, air-condition setting, and the like. The content, layout, or the like of the display on the display panels can be changed as appropriate to suit the user's preference, so that the design can be improved. The display panel 5701 to the display panel 5703 can also be used as lighting devices.

The display panel 5704 can compensate for the view obstructed by the pillar (a blind spot) by showing an image taken by an imaging device (not illustrated) provided for the automobile 5700. That is, displaying an image taken by the imaging device provided on the outside of the automobile 5700 leads to compensation for the blind spot and enhancement of safety. In addition, showing an image for compensating for the area which a driver cannot see makes it possible for the driver to confirm safety more easily and comfortably. The display panel 5704 can also be used as a lighting device.

Since the GPU or the chip of one embodiment of the present invention can be used as a component of artificial intelligence, the chip can be used in an automatic driving system of the automobile 5700, for example. The chip can also be used for a system for navigation, risk prediction, or the like. The display panel 5701 to the display panel 5704 may display information regarding navigation information, risk prediction, and the like.

Although an automobile is described above as an example of a moving vehicle, moving vehicles are not limited to an automobile. Examples of moving vehicles include a train, a monorail train, a ship, and a flying object (a helicopter, an unmanned aircraft (a drone), an airplane, and a rocket), and these moving vehicles can include a system utilizing artificial intelligence when equipped with the chip of one embodiment of the present invention.

[Broadcasting System]

The GPU or the chip of one embodiment of the present invention can be used in a broadcasting system.

Figure 27F:
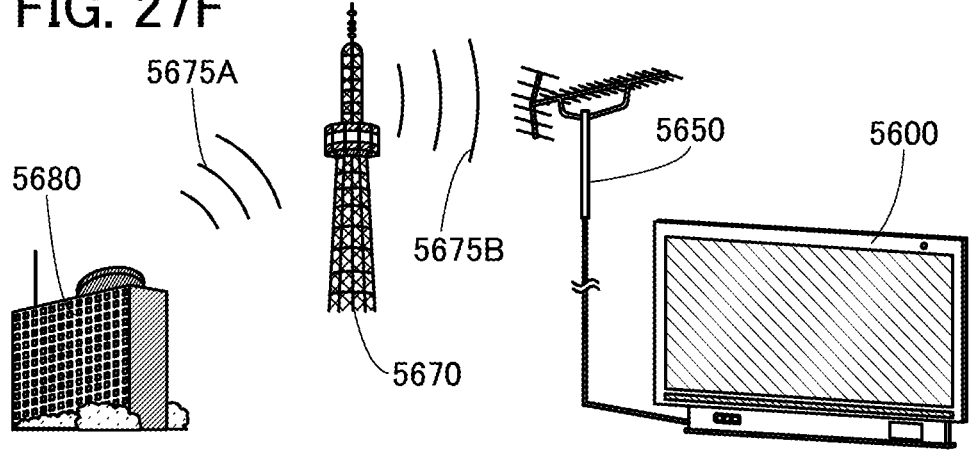

FIG. 27(F) schematically shows data transmission in a broadcasting system. Specifically, FIG. 27(F) shows a path in which a radio wave (a broadcasting signal) transmitted from a broadcast station 5680 is delivered to a television receiver (TV) 5600 of each household. The TV 5600 includes a receiving device (not illustrated), and the broadcast signal received by an antenna 5650 is transmitted to the TV 5600 through the receiving device.

Although a UHF (Ultra High Frequency) antenna is illustrated as the antenna 5650 in FIG. 27(F), a BS/110° CS antenna, a CS antenna, or the like can also be used as the antenna 5650.

A radio wave 5675A and a radio wave 5675B are broadcast signals for terrestrial broadcasting; a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting shown in FIG. 27(F) and may be satellite broadcasting using an artificial satellite, data broadcasting using an optical line, or the like.

The above-described broadcasting system may utilize artificial intelligence by using the chip of one embodiment of the present invention. When the broadcast data is transmitted from the broadcast station 5680 to the TV 5600 at home, the broadcast data is compressed by an encoder. When the antenna 5650 receives the compressed broadcast data, the compressed broadcast data is decompressed by a decoder of the receiving device in the TV 5600. With the use of artificial intelligence, for example, a display pattern included in an image to be displayed can be recognized in motion compensation prediction, which is one of the compressing methods for the encoder. In-frame prediction utilizing artificial intelligence, for instance, can also be performed. For another example, when the broadcast data with low resolution is received and displayed on the TV 5600 with high resolution, image interpolation such as upconversion can be performed in the broadcast data decompression by the decoder.

The above-described broadcasting system utilizing artificial intelligence is suitable for ultra-high definition television (UHDTV: 4K, 8K) broadcasting, which needs a large amount of broadcast data.

As an application of artificial intelligence in the TV 5600, a recording device including artificial intelligence may be provided in the TV 5600, for example. With such a structure, the artificial intelligence in the recording device can learn the user's preference, so that TV programs that suit the user's preference can be recorded automatically.

The electronic devices, the functions of the electronic devices, application examples of artificial intelligence, its effects, and the like described in this embodiment can be combined as appropriate with the description of another electronic device.

This embodiment can be implemented in combination with any of the structures described in the other embodiments and the like, as appropriate.

REFERENCE NUMERALS

100: capacitor, 110: conductor, 112: conductor, 120: conductor, 130: insulator, 150: insulator, 200: transistor, 205: conductor, 205a: conductor, 205b: conductor, 210: insulator, 212: insulator, 214: insulator, 216: insulator, 218: conductor, 222: insulator, 224: insulator, 224A: insulating film, 230: oxide, 230a: oxide, 230A: oxide film, 230b: oxide, 230B: oxide film, 230c: oxide, 230C: oxide film, 231: region, 231a: region, 231b: region, 232B: oxide film, 240: conductor, 240a: conductor, 240b: conductor, 241: insulator, 241a: insulator, 241b: insulator, 242: conductor, 242a: conductor, 242A: conductive film, 242b: conductor, 242B: conductor layer, 244: conductor, 244a: conductor, 244b: conductor, 246: conductor, 246a: conductor, 246b: conductor, 250: insulator, 250A: insulating film, 260: conductor, 260a: conductor, 260Aa: conductive film, 260Ab: conductive film, 260b: conductor, 265: conductor, 265A: conductive film, 265B: conductor, 272: insulator, 272A: insulating film, 273: insulator, 273A: insulating film, 274: insulator, 275: insulator, 275A: insulating film, 275B: insulator, 276: insulator, 280: insulator, 281: insulator, 282: insulator, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 400: transistor, 405: conductor, 430c: oxide, 431a: oxide, 431b: oxide, 432a: oxide, 432b: oxide, 440: conductor, 440a: conductor, 440b: conductor, 442a: conductor, 442b: conductor, 450: insulator, 460: conductor, 460a: conductor, 460b: conductor, 1001: wiring, 1002: wiring, 1003: wiring, 1004: wiring, 1005: wiring, 1006: wiring, 1007: wiring, 1008: wiring, 1009: wiring, 1010: wiring This application is based on Japanese Patent Application Serial No. 2018-086200 filed with Japan Patent Office on Apr. 27, 2018, the entire contents of which are hereby incorporated herein by reference.

The invention claimed is:

1. A semiconductor device comprising:
a first insulator;
a first oxide over the first insulator;
a second oxide over the first oxide;
a first conductor and a second conductor over the second oxide;
a second insulator over the second oxide;
a third conductor over the second insulator;
a fourth conductor and a third insulator over the third conductor;
a fourth insulator over the first insulator, the first conductor, and the second conductor; and
a fifth insulator over the fourth insulator,
wherein the fifth insulator includes an opening in which the second oxide is exposed,
wherein the second insulator, the third conductor, the fourth conductor, and the third insulator are in the opening,
wherein a length of a top surface of the third conductor is longer than a length of a bottom surface of the fourth conductor,
wherein the third conductor is in contact with the second insulator,
wherein the third insulator is in contact with the top surface of the third conductor and the second insulator,
wherein the fourth conductor is in contact with the third insulator and the top surface of the third conductor,
wherein the fourth conductor faces the second insulator with the third conductor therebetween and faces the second insulator with the third insulator therebetween,
wherein the fourth insulator is in contact with a top surface of the first insulator, a side surface of the first oxide, a side surface of the second oxide, a side surface of the first conductor, a top surface of the first conductor, a side surface of the second conductor, and a top surface of the second conductor, and
wherein the third insulator is less likely to pass oxygen or hydrogen than the second insulator.

2. The semiconductor device according to claim 1, wherein the third insulator contains aluminum and oxygen.

3. The semiconductor device according to claim 1, wherein the third insulator contains silicon and nitrogen.

4. The semiconductor device according to claim 1, further comprising a third oxide over the second oxide,
wherein the third oxide is in contact with the second insulator,
wherein the first to third oxides each contain In, an element M, and
wherein the element M is Al, Ga, Y, or Sn.

5. The semiconductor device according to claim 1, wherein an outer side surface of the third insulator is in contact with an inner side surface of the second insulator.

6. A semiconductor device comprising:
a first insulator;
a first oxide over the first insulator;
a second oxide over the first oxide;
a first conductor and a second conductor over the second oxide;
a second insulator over the second oxide;
a third conductor over the second insulator;
a fourth conductor and a third insulator over the third conductor;
a fourth insulator over the first insulator, the first conductor, and the second conductor; and
a fifth insulator over the fourth insulator,
wherein a length of a top surface of the third conductor is longer than a length of a bottom surface of the fourth conductor,
wherein the fifth insulator includes an opening in which the second oxide is exposed, and
wherein the second insulator, the third conductor, the fourth conductor, and the third insulator are in the opening.

7. The semiconductor device according to claim 6, wherein the third insulator contains aluminum and oxygen.

8. The semiconductor device according to claim 6, wherein the third insulator contains silicon and nitrogen.

9. The semiconductor device according to claim 6, further comprising a third oxide over the second oxide,
wherein the third oxide is in contact with the second insulator,
wherein the first to third oxides each contain In, an element M, and
wherein the element M is Al, Ga, Y, or Sn.

10. The semiconductor device according to claim 6, wherein the third insulator is less likely to pass oxygen or hydrogen than the second insulator.

11. The semiconductor device according to claim 6, wherein an outer side surface of the third insulator is in contact with an inner side surface of the second insulator.

* * * * *